(12) United States Patent
Wenham et al.

(10) Patent No.: US 11,031,520 B2
(45) Date of Patent: Jun. 8, 2021

(54) ADVANCED HYDROGEN PASSIVATION THAT MITIGATES HYDROGEN-INDUCED RECOMBINATION (HIR) AND SURFACE PASSIVATION DETERIORATION IN PV DEVICES

(71) Applicant: NEWSOUTH INNOVATIONS PTY LIMITED, Sydney (AU)

(72) Inventors: Stuart Ross Wenham, Cronulla (AU); Alison Ciesla, Cronulla (AU); Darren Bagnall, Coogee (AU); Ran Chen, Botany (AU); Malcolm David Abbott, Naremburn (AU); Brett Jason Hallam, Bexley (AU); Catherine Emily Chan, Kensington (AU); Chee Mun Chong, Bellevue Hill (AU); Daniel Chen, Bankstown (AU); David Neil Payne, Redfern (AU); Ly Mai, East Hills (AU); Moonyong Kim, Kensington (AU); Tsun Hang Fung, Kensington (AU); Zhengrong Shi, Kirribilli (AU)

(73) Assignee: NEWSOUTH INNOVATIONS PTY LIMITED, Sydney (AU)

( * ) Notice: Subject to any disclaimer, the term of this patent is extended or adjusted under 35 U.S.C. 154(b) by 0 days.

(21) Appl. No.: 16/461,852

(22) PCT Filed: Nov. 22, 2017

(86) PCT No.: PCT/AU2017/051290
§ 371 (c)(1),
(2) Date: May 17, 2019

(87) PCT Pub. No.: WO2018/094462
PCT Pub. Date: May 31, 2018

(65) Prior Publication Data
US 2019/0371959 A1 Dec. 5, 2019

(30) Foreign Application Priority Data

Nov. 22, 2016 (AU) ................................ 2016904784
Nov. 22, 2016 (AU) ................................ 2016904785
(Continued)

(51) Int. Cl.
*H01L 31/18* (2006.01)
*H01L 31/0288* (2006.01)

(52) U.S. Cl.
CPC ...... *H01L 31/1868* (2013.01); *H01L 31/0288* (2013.01); *H01L 31/1804* (2013.01); *H01L 31/1864* (2013.01)

(58) Field of Classification Search
CPC ............ H01L 31/1864; H01L 31/1868; H01L 21/3003
See application file for complete search history.

(56) References Cited

U.S. PATENT DOCUMENTS

2008/0121280 A1* 5/2008 Camel ................. H01L 31/1868
136/258
2015/0132881 A1 5/2015 Wenham et al.
(Continued)

FOREIGN PATENT DOCUMENTS

WO 2013/173867 A1 11/2013
WO 2015/010167 A1 1/2015
(Continued)

OTHER PUBLICATIONS

International Search Report and Written Opinion received in PCT Application No. PCT/AU2017/051290 dated Mar. 1, 2018.
(Continued)

*Primary Examiner* — John A Bodnar
(74) *Attorney, Agent, or Firm* — Ajay A. Jagtiani; Miles & Stockbridge P.C.

(57) ABSTRACT

The present disclosure provides methodologies for manufacturing photovoltaic devices. In particular, the disclosure
(Continued)

relates to the use of hydrogen during manufacturing of photovoltaic devices for passivating defects in the silicon and addressing light-induced degradation. The methodologies in the present disclosures take advantage of generation and manipulation of hydrogen in the neutral or charged state to optimise defect passivation. Some of the methodologies disclose use thermal treatments, illumination with sub-bandgap photons, electric fields or defects in the silicon to control the state of charge or hydrogen, move hydrogen to different locations in the device or retain hydrogen at specific locations.

9 Claims, 30 Drawing Sheets

(30) Foreign Application Priority Data

| Nov. 22, 2016 | (AU) | 2016904786 |
|---|---|---|
| Nov. 22, 2016 | (AU) | 2016904787 |
| Nov. 22, 2016 | (AU) | 2016904788 |
| Nov. 22, 2016 | (AU) | 2016904789 |
| Dec. 23, 2016 | (AU) | 2016905364 |
| Jun. 23, 2017 | (AU) | 2017902441 |

(56) References Cited

U.S. PATENT DOCUMENTS

2016/0141445 A1* 5/2016 Herguth .......... F27B 9/066
    438/98
2016/0172213 A1 6/2016 Hallman et al.

FOREIGN PATENT DOCUMENTS

| WO | 2015010167 A1 | 1/2015 |
|---|---|---|
| WO | 2016/145482 A1 | 9/2016 |

OTHER PUBLICATIONS

Dubois et al., "Effect of intentional bulk contamination with iron on multicrystalline silicon solar cell properties", Journal of Applied Physics, 102, pp. 083525 (1-7) (2007).
Duerinckx et al, "Defect passivation of industrial multicrystalline solar cells based on PECVD silicon nitride", Solar Energy Materials & Solar Cells, 72, pp. 231-246 (2002).
Herring et al, "Energy levels of isolated interstitial hydrogen in silicon", Physical Review B, vol. 64, 125209 (2001).
Pritchard et al., "Hydrogen molecules in boron-doped crystalline silicon", Semicond. Sci. Technol., 14, pp. 77-80 (1999).

* cited by examiner

500 

502 – Thermally treating at least a portion of the device in a manner such that, hydrogen atoms migrate towards at least one of the doped regions so that the concentration of hydrogen atoms within the at least one of the doped regions becomes at least 10% higher than a doping concentration of that region

504 – Thermally treating at least a portion of the device in a manner such that the concentration of hydrogen atoms within the at least one of the doped regions drops below the doping concentration of that region

FIGURE 5

600 

602 – Exposing at least a portion of the device to hydrogen atoms in a manner such that, hydrogen atoms migrate towards at least one of the doped regions and the concentration of hydrogen atoms within the at least one of the doped regions becomes at least the same as the doping concentration of that region

604 – At least a portion of the device is annealed while exposed to hydrogen atoms in a manner such that at least a portion of charged atomic hydrogen within the at least one of the doped regions become neutral hydrogen atoms

702 – Exposing at least a portion of the device to photons with an energy lower than the bandgap of silicon at the at least one of the doped silicon regions in a manner such that at least a portion of charged hydrogen atoms become neutral hydrogen atoms and the concentration of hydrogen atoms within the at least one of the doped regions drops below the doping concentration of that region

704 – The temperature of the at least one of the doped silicon regions is maintained above 80°C and hydrogen migrates out of the at least one of the doped silicon regions

802 – Thermally treating at least a portion of the device in a manner such that, hydrogen atoms migrate towards at least one of the doped regions so that the concentration of hydrogen atoms within the at least one of the doped regions becomes at least 10% higher than a doping concentration of that region

804 – Applying an electric field across at least a portion of the device in a manner such that, charged hydrogen atoms are driven away, by the electric field, from the at least one of the doped silicon regions

FIGURE 8

850 

852 – Forming at least a hydrogen sink region arranged to attract atomic hydrogen from other regions of the device

854 – Exposing at least a portion of the device to hydrogen atoms in a manner such that, hydrogen atoms migrate towards at least one of the doped regions so that the concentration of hydrogen atoms within the at least one of the doped regions temporarily increases to be at least the same as a doping concentration of that region and, subsequently, hydrogen migrates out of the at least one of the doped silicon regions towards the hydrogen sink region to allow for the concentration of hydrogen atoms within the at least one of the doped regions to drop below the doping concentration of that region

FIGURE 9

860 

862 – Forming a region in the silicon comprising a concentration of crystallographic defects higher than an average concentration of crystallographic defects of a silicon wafer used to manufacture the photovoltaic device; the region being arranged to attract atomic hydrogen from other regions of the device

864 – Exposing at least a portion of the device to hydrogen atoms in a manner such that, hydrogen atoms migrate towards at least one of the doped regions so that the concentration of hydrogen atoms within the at least one of the doped regions temporarily increases to be at least the same as a doping concentration of that region and, subsequently, hydrogen migrates out of the at least one of the doped silicon regions towards the region comprising a concentration of crystallographic defects higher than an average concentration of crystallographic defects to allow for the concentration of hydrogen atoms within the at least one of the doped regions to drop below the doping concentration of that region

FIGURE 10

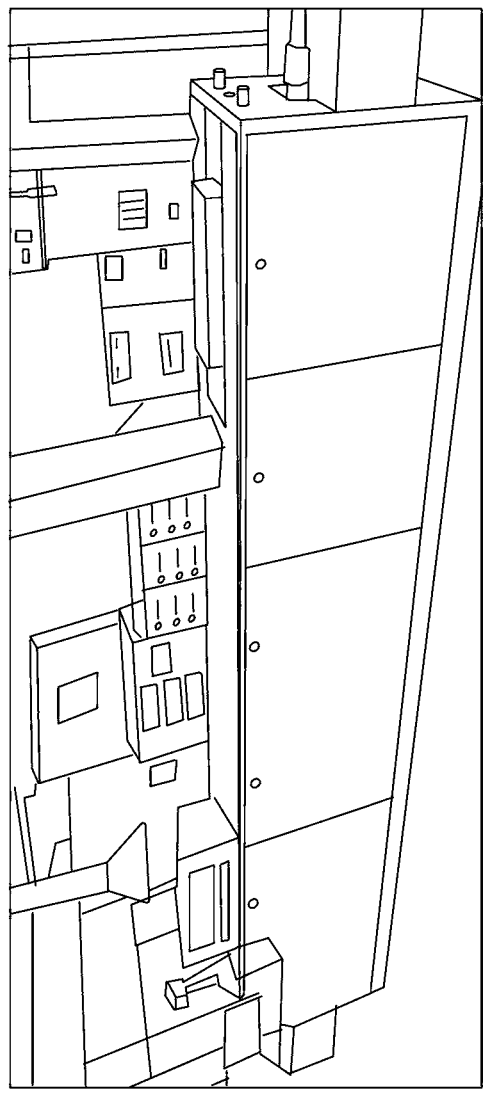
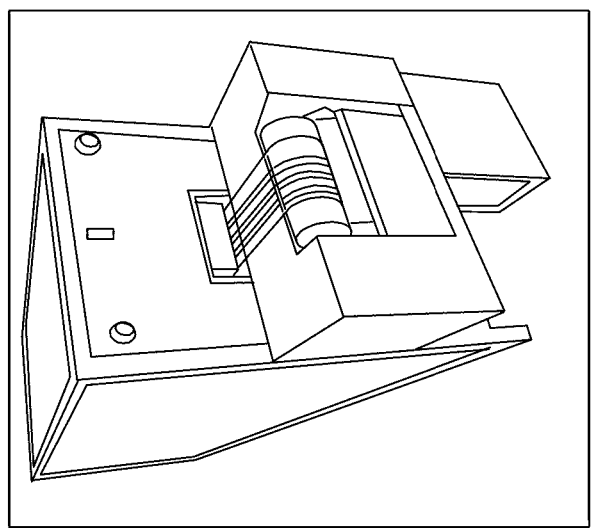
FIGURE 14

ADVANCED HYDROGEN PASSIVATION THAT MITIGATES HYDROGEN-INDUCED RECOMBINATION (HIR) AND SURFACE PASSIVATION DETERIORATION IN PV DEVICES

FIELD OF THE INVENTION

The present invention generally relates to methods for manufacturing photovoltaic devices. In particular, the invention relates to the use of hydrogen during manufacturing methods for passivating defects in the silicon and addressing light-induced degradation caused by the hydrogen.

BACKGROUND OF THE INVENTION

Silicon is the main semiconductor material used to fabricate today's commercial photovoltaic (PV) cells. The majority of commercial PV cells are fabricated from a monocrystalline or multi-crystalline silicon wafer. A p-n junction is formed in the silicon wafer by, for example, diffusing n-type atoms in a p-type silicon wafer.

Electrically active defects throughout PV cell affect the lifetime of charge carriers causing reduced performance. These defects may be related to the quality of the materials used, for example the silicon wafer, or can be created during fabrication.

In order to improve the performance, electrically active defects are passivated using hydrogen. It is well documented in many publications such as Herring, C, Johnson, N M & Van de Walle, C G 2001, Energy levels of isolation interstitial hydrogen in silicon, Physical Review B, vol. 64, that hydrogen can take numerous forms within the silicon wafer. The term "hydrogen" in silicon is often used in the literature to be all-encompassing, including all such forms, including molecular hydrogen and atomic hydrogen. Hydrogen passivation has been used for decades to address reduced performance of PV devices caused by a range of different electrically active defects. It is well known that hydrogen needs to be in the form of "atomic hydrogen" to be the active species that under the right conditions can bond to the electrically active defects to minimise or even eliminate their impact. On the other hand, hydrogen when in molecular form is not active or in other words is non-reactive. However it is also well known in the literature that such molecular hydrogen within the silicon is in an equilibrium state with atomic hydrogen which means it can dissociate into atomic hydrogen and vice versa whenever departing from the equilibrium value. As a result, the molecular hydrogen can transform into its atomic active state when it dissociates into atomic hydrogen within the silicon (Pritchard, R E, Tucker, J H, Newman, R C & Lightowlers, E C 1999, Hydrogen molecules in boron-doped crystalline silicon Semicond. Sci. Technol. vol. 14.).

Atomic hydrogen, due to its reactivity can relatively easily bond to defects where in general it remains in a stable form, therefore resulting in such atoms of hydrogen no longer remaining in an active state and therefore no longer classed as being "atomic hydrogen". The exception to this is when the hydrogen atoms only form very week bonds such to dopant atoms already substitutionally bonded within the silicon lattice such as Phosphorus (P) and Boron (B). In this case the hydrogen atoms are so weakly bonded that the hydrogen atoms can be easily released from such dopant atoms to regain their active state. They are therefore still considered to be active and included as "atomic hydrogen". In fact previous inventions capitalize on these weak bonds with dopant atoms to effectively "store" hydrogen within the silicon that can then be released when required into its active form such as for defect passivation etc [Hallam et alia, 2013, "High concentration doping in silicon", Australian Patent Application 20142951.6, National Phase of PCT/AU2014/050146}. In other words, this involves deliberately forming B—H bonds within the silicon to effectively store the hydrogen so that it can then be used as a source of atomic hydrogen within the silicon at a subsequent time by simply breaking the B—H bonds, which can happen at temperatures as low as 100° C., and even lower temperatures with illumination that is able to change the majority charge state of the hydrogen to one of the minority charge states There is a common belief that high efficiency silicon solar cells can only be realised on wafers that already have high initial bulk lifetimes predominantly free of performance limiting impurities or defects.

There is a need in the art for fabrication methods that can more effectively capitalise on the use of atomic hydrogen to passivate many types of defects and contaminants within the silicon without requiring high quality silicon material.

SUMMARY OF THE INVENTION

Hydrogen passivation process inevitably retains residual molecular and atomic hydrogen within the device. The Applicants found that "atomic hydrogen" within the device can potentially cause detrimental effects, such as hydrogen-induced recombination (HIR) where there are no other elements or species involved other than the hydrogen, increased contact resistance, hydrogen-activated recombination (HAR) where the hydrogen interacts with other elements or species to cause recombination, and light-induced degradation (LID). For the purposes of this disclosure, the term "atomic hydrogen" will therefore be used to include all the forms of hydrogen that are active within the silicon and therefore able to react with other species so as to cause recombination or react with other species so as to eliminate recombination. Although only atomic hydrogen can directly cause the described detrimental effects such as contributing to HIR, all forms of hydrogen that can be easily converted into atomic hydrogen are included under "atomic hydrogen" in this disclosure. Some well documented forms of hydrogen in silicon that can readily be converted to atomic hydrogen include weakly bonded hydrogen released at very low temperatures such as that bonded to dopant atoms (Herring, C, Johnson, N M & Van de Walle, C G 2001, Energy levels of isolation interstitial hydrogen in silicon, Physical Review B, vol. 64.), or molecular hydrogen that can easily dissociate into atomic hydrogen whenever the concentration of the atomic hydrogen falls below its equilibrium value with molecular hydrogen (Pritchard, R E, Tucker, J H, Newman, R C & Lightowlers, E C 1999, Hydrogen molecules in boron-doped crystalline silicon Semicond. Sci. Technol. vol. 14.).

It is therefore necessary to consider the concentrations of molecular hydrogen whenever considering the role or actions of "atomic hydrogen" within the device. For example, at a given temperature and injection level, molecular hydrogen will dissociate into atomic hydrogen whenever the localised atomic hydrogen is reduced to below its equilibrium value. The amount of molecular hydrogen dissociating under such conditions will be the amount needed to restore the equilibrium concentrations between molecular and atomic hydrogen in that particular location within the device. However, whenever the localised atomic hydrogen concentration is increased to above its equilibrium value with molecular hydrogen for a given temperature, some atomic hydrogen will form molecular hydrogen to restore the equilibrium values.

As another example relating to this definition of "atomic hydrogen" is where weakly bonded hydrogen releases the atoms of hydrogen so as they can contribute to passivation or alternatively the detrimental effects that atomic hydrogen can cause. For example hydrogen bonded to phosphorus dopants (P—H bonds) and atomic hydrogen bonded to boron dopants (B—H bonds) are only weakly bonded where it is well documented in the literature that the latter two types of bonds are relatively easily broken to release atoms of hydrogen. In fact previous inventions [Hallam et alia, 2013, "High concentration doping in silicon", Australian Patent Application 2014295316, National Phase of PCT/AU2014/050146}, deliberately form B—H bonds within the silicon to effectively store the hydrogen so that it can then be used as a source of atomic hydrogen within the silicon at a subsequent time by simply breaking the B—H bonds, which can happen at temperatures as low as 100° C., and even lower temperatures with illumination that is able to change the majority charge state of the hydrogen to one of the minority charge states. For example, it is often published in the literature that the $H^+$ in p-type silicon needs to be converted to $H^0$ under illumination to be able to escape the electrostatic forces of the $B^-$ atom.

Alternatively, other papers in the literature conclude that the majority charge state $H^+$ actually has to be converted to $H^-$ to escape the $B^-$ atom due to the electrostatic repulsion and the much longer life expectancy of $H^-$ compared to $H^0$ (Herring, C, Johnson, N M & Van de Walle, C G 2001, Energy levels of isolation interstitial hydrogen in silicon, Physical Review B, vol. 64). However, as shall be discussed in the disclosure, any such "atomic hydrogen" not only has the potential to improve the device quality through passivation of defects, but also has the potential to cause negative effects that will degrade the electrical performance of the device.

There is a common belief that high efficiency silicon solar cells can only be realised on wafers with high initial bulk lifetimes predominantly free of performance limiting impurities or defects.

In accordance with the first aspect, the present invention provides a method for processing a silicon-based photovoltaic device having doped regions, the method comprising the steps of:

(a) providing a photovoltaic device including hydrogen;

(b) thermally treating at least a portion of the device in a manner such that, hydrogen migrates towards at least one of the doped regions so that the concentration of hydrogen within the at least one of the doped regions increases to above the minimum concentration of hydrogen at which hydrogen causes light induced degradation;

(c) treating at least a portion of the device in a manner such that the concentration of atomic hydrogen within the at least one of the doped regions drops below a predetermined concentration; the predetermined concentration being the minimum concentration of atomic hydrogen at which the hydrogen causes light induced degradation in that region;

wherein step (b) is conducted such that hydrogen atoms distribute within the at least one of the doped silicon regions and step (c) is conducted such that hydrogen migrates out of the at least one of the doped silicon regions.

In an embodiment, step (c) is performed in a manner such that the concentration of hydrogen within the at least one of the doped regions drops below a predetermined concentration; the predetermined concentration being the minimum concentration of hydrogen at which hydrogen causes light induced degradation.

In an embodiment, step (b) is performed in a manner such that, the concentration of hydrogen within the at least one of the doped regions becomes at least 10% higher than a doping concentration of that region.

In an embodiment, step (b) is performed in a manner such that, the concentration of hydrogen within the at least one of the doped regions becomes such that, carrier recombination occurs by Hydrogen Induced Recombination.

In an embodiment, processes (a) and (b) may be combined into a single process.

In an embodiment, processes (b) and (c) may be combined into a single process.

In an embodiment, processes (a) and (b) and (c) may be combined into a single process.

In an embodiment, step (b) comprises exposing at least a portion of the device to photons with an energy lower than the bandgap of silicon at the at least one of the doped silicon regions in a manner such that, at least a portion of charged hydrogen atoms become neutral hydrogen atoms.

In an embodiment, step (c) comprises the step of treating at least a portion of the device in a manner such that the concentration of hydrogen atoms within the at least one of the doped regions drops to decrease the level of light induced degradation caused by the hydrogen in that region. During step (b), the temperature of the at least one of the doped silicon regions is maintained above 80° C.

In an embodiment, the at least a portion of charged hydrogen atoms consists of negatively charged hydrogen atoms and the energy of the photons is such that the photons can be absorbed by the negatively charged hydrogen atoms.

In an embodiment, the photon energy is comprised between 0.4 eV and 1.12 eV. In another embodiment, the photon energy is comprised between 0.85 eV and 1.1 eV.

In an embodiment, the method further comprises the step of, prior to step (b), exposing the at least a portion of the device to photons to modulate carrier injection in the device in a manner such that the generation rate of negatively charged atomic hydrogen is increased.

In an embodiment, the increased fraction of hydrogen in the neutral charge state acts to improve the passivation of defects within the silicon or at the silicon surfaces.

In an embodiment, the method further comprises the step of modulating the intensity of photons during step (b) in order to limit the generation of charge carriers in the device and limit the transition rate of neutral and negatively charged atomic hydrogen to the positively charged state.

In an embodiment, he intensity of photons may be less than 1 mW/cm². The intensity of photons is less than 1 mW/cm2 when the concentration of hydrogen atoms within the at least one of the doped regions is between 10% and 50% higher than the doping concentration of that region.

In an embodiment, the method for processing a silicon-based photovoltaic device further comprises the steps of:

(e) forming at least a hydrogen sink region arranged to attract atomic hydrogen from other regions of the device; and wherein step (c) is performed in a manner such that hydrogen migrates out of the at least one of the doped silicon regions towards the hydrogen sink region to allow for the concentration of hydrogen atoms within the at least one of the doped regions to drop below the predetermined doping concentration.

In an embodiment, the hydrogen sink region extends across the rear surface of the device. The hydrogen sink region may comprise a plurality of hydrogen sinks arranged through the bulk region of the device.

In an embodiment, step (e) comprises forming a molten eutectic with silicon to form a hydrogen sink. The step of forming a molten eutectic with silicon comprises the step of depositing a metal on a p-type region of silicon and heating the region to a temperature higher than the metal eutectic temperature to allow for formation of molten sink regions in proximity of the rear surface of the device. The metal may comprise aluminium and the region may be heated to a temperature of at least 577° C.

In an embodiment, the method for processing a silicon-based photovoltaic device further comprises the step of, prior to depositing metal, depositing a dielectric layer on the p-type region of silicon, patterning the dielectric layer using a laser and, subsequently, depositing the metal onto the dielectric layer in a manner such that an electrical contact is formed between the metal and the silicon in correspondence of the patterned portions of the dielectric layer.

In an embodiment, the region is heated for a time period comprised between 3 and 10 seconds.

In an embodiment, step (e) comprises applying localised heat using a laser to melt portions of silicon and form hydrogen sinks. The step of applying localised heat using a laser comprises pulsing the laser in a manner such that the silicon melts and solidifies at the laser frequency to form a continuous sink for hydrogen atoms.

In an embodiment, the method for processing a silicon-based photovoltaic device further comprising the steps of:

(g) forming a region in the silicon comprising a concentration of crystallographic defects higher than an average concentration of crystallographic defects of a silicon wafer used to manufacture the photovoltaic device; the region being arranged to attract atomic hydrogen from other regions of the device; and wherein step (c) is performed in a manner such that hydrogen migrates out of the at least one of the doped silicon regions towards the region comprising a concentration of crystallographic defects higher than an average concentration of crystallographic defects to allow for the concentration of hydrogen atoms within the at least one of the doped regions to drop below the predetermined doping concentration.

In an embodiment, the region comprising a concentration of crystallographic defects higher than an average concentration of crystallographic defects extends across the rear surface of the device. The region further comprises a plurality of defective regions formed throughout the bulk region of the device.

In an embodiment, step (g) comprises roughening or damaging the silicon material to increase the densities of crystallographic defects to also enhance this effect. In an embodiment, the step of roughening or damaging the silicon material comprises chemical texturing. In another embodiment, the step of roughening or damaging the silicon material comprises thermally treating the silicon to create thermal gradients or thermal expansion mismatch. In another embodiment, the step of roughening or damaging the silicon material comprises using a laser to optically damage the silicon. In another embodiment, the step of roughening or damaging the silicon material comprises mechanically abrading or bending the wafer.

In an embodiment, step (g) comprises creating stress on a surface of the silicon and cause dislocations or stacking faults in the silicon.

In an embodiment, the silicon-based photovoltaic device is a multi-crystalline device and the method further comprises the step of selecting a multi-crystalline silicon wafer comprising a concentration of crystallographic defects higher than an average concentration of crystallographic defects of a multi-crystalline silicon wafer used to manufacture photovoltaic devices.

In an embodiment, step (c) is such that at least a portion of charged hydrogen atoms at the at least one of the doped silicon regions become neutral hydrogen atoms.

In an embodiment, the at least one of the doped silicon regions are p-type regions and step (c) is such that at least a portion of negatively charged hydrogen atoms move away from the at least one of the doped silicon regions.

In an embodiment, the at least one of the doped silicon regions include a surface region of the silicon or a silicon/dielectric interface.

In an embodiment, during step (c) hydrogen atoms migrate from the surface region of the silicon or silicon/dielectric interface towards bulk regions of the silicon.

In an embodiment, step (c) comprises the step of annealing the photovoltaic device at a temperature of at least 140° C., or preferably 180° C., or more preferably 220° C.

In an embodiment, during step (c) electrically active defects at the at least a portion of the device are passivated by hydrogen atoms that have migrated to the portion.

In an embodiment, step (b) comprises the step of annealing the photovoltaic device at a temperature of at least 50° C. ELECTRICF In accordance with the second aspect, the present invention provides a method for processing a silicon-based photovoltaic device having doped regions, the method comprising the steps of:

(a) providing a photovoltaic device including hydrogen;

(b) thermally treating at least a portion of the device in a manner such that, hydrogen migrates towards at least one of the doped regions so that the concentration of hydrogen within the at least one of the doped regions increases to above the minimum concentration of hydrogen at which hydrogen causes degradation to the electrical characteristics of that region;

(c) applying an electric field across at least a portion of the device in a manner such that, charged hydrogen atoms are driven away, by the electric field, from the at least one of the doped silicon regions;

wherein step (b) is conducted such that hydrogen atoms distribute within the at least one of the doped silicon regions and step (c) is conducted such that hydrogen migrates out of the at least one of the doped silicon regions.

In an embodiment, during step (b) the concentration of hydrogen atoms within the at least one of the doped regions becomes such that Hydrogen Induced Recombination at the regions affects the performance of the device.

In an embodiment, step (c) further comprises applying a forward biasing electric field across the device to promote drifting of charged atomic hydrogen away from regions with high atomic hydrogen concentration.

In an embodiment, step (c) is performed in a manner such that negatively charged hydrogen atoms are drifted away from p-type regions of the device and positively charged hydrogen atoms are drifted away from n-type regions of the device.

In an embodiment, step (c) is performed in a manner such that negatively charged hydrogen atoms are drifted from a first region of the silicon to a second region of the silicon; the first region having a concentration of interstitial atomic hydrogen that is sufficient to generate further negatively charged hydrogen atoms and the second region having a concentration of interstitial atomic hydrogen that is insufficient to generate further negatively charged hydrogen atoms. In this step, the amount of negatively charged hydrogen atoms that change their charge state to become positively charged hydrogen atoms is minimised. In an embodiment, step (c) is performed for a limited period of time; the limited period of time being insufficient for negatively charged hydrogen atoms that have changed their charge state to become positively charged hydrogen atoms to reach the first region of the silicon.

In an embodiment, during step (c) the intensity of the electric field is gradually decreased.

In an embodiment, a first intensity of the electric field is applied for a first period of time and a second intensity of the electric field is applied for second period of time.

In an embodiment, during step (c) the electric field is a pulsed field and is applied so that, when the field is on, the electric field applies a force to the negatively charged atomic hydrogen and, when the field is off the injection levels are reduced to allow positively charged atomic hydrogen to transition back to a negatively charged state.

In accordance with the third aspect, the present invention provides a method for processing a silicon-based photovoltaic device having doped regions, the method comprising the steps of:

(a) exposing at least a portion of the device to hydrogen atoms in a manner such that, hydrogen atoms migrate towards at least one of the doped regions and the concentration of hydrogen within the at least one of the doped regions becomes at least the same as the doping concentration of that region;
wherein the at least a portion of the device is annealed while exposed to hydrogen in a manner such that at least a portion of charged atomic hydrogen within the at least one of the doped regions become neutral hydrogen atoms.

In an embodiment, the concentration of hydrogen within the at least one of the doped regions becomes at least 10% higher than the doping concentration of that region. The concentration of hydrogen within the at least one of the doped regions becomes such to determine the position of the Fermi level within that region and the position of the Fermi level is such that the generation rate of neutral atomic hydrogen in the portion is faster than the generation of charged atomic hydrogen in the portion.

In an embodiment, during step (a) the at least a portion of the device is annealed at a temperature of at least 50° C., or preferably 100° C.

In an embodiment, during step (a) the at least a portion of the device is annealed at a temperature comprised between 300° C. and 400° C. so that the Fermi energy level in the portion is such that the generation of neutral atomic hydrogen is maximised and the neutral atomic hydrogen drifts away from the portion.

In an embodiment, the temperature of the portion is gradually dropped over a period of time between 2 and 5 minutes.

In an embodiment, the annealing process is performed for a predetermined period of time to allow for the at least a portion of the device generating neutral atomic hydrogen to expand across the device while the device is exposed to hydrogen atoms; the method further comprising the step of selecting the predetermined period of time based on a final size of the portion generating neutral atomic hydrogen and the annealing temperature.

In an embodiment, the silicon-based photovoltaic device is a multi-crystalline device and the at least one of the doped regions comprises regions with a high density of grain boundaries or crystallographic defects.

In an embodiment, the method for processing a silicon-based photovoltaic device having doped regions further comprises step (b): annealing at least a portion of the device at a temperature of at least 50° C. in a manner such that neutral atomic hydrogen migrates out of the at least one of the doped silicon regions and the concentration of hydrogen atoms within the at least one of the doped regions drops below the doping concentration of that region.

In an embodiment, during step (b) the temperature of at least 50° C. is maintained for at least 1 second.

In an embodiment, the overall energy of photons capable of generating electron-hole pairs in the device reaching the device during step (b) is:
at most 0.01 mW/cm2 when the concentration of hydrogen atoms within the at least one of the doped regions is at least the same as the doping concentration of that region;
at most 0.1 mW/cm2 when the concentration of hydrogen atoms within the at least one of the doped regions is at least one order of magnitude higher than the doping concentration of that region; and
at most 1 mW/cm2 when the concentration of hydrogen atoms within the at least one of the doped regions is at least two orders of magnitude higher than the doping concentration of that region.

In an embodiment, the at least one of the doped silicon regions are p-type regions and step (b) is such that at least a portion of negatively charged hydrogen atoms diffuse away from the at least one of the doped silicon regions.

In an embodiment, the at least one of the doped silicon regions include a surface region of the silicon or a silicon/dielectric interface.

In an embodiment, during step (b) hydrogen atoms migrate from the surface region of the silicon or silicon/dielectric interface towards bulk regions of the silicon.

In an embodiment, step (b) comprises the step of annealing the photovoltaic device at a temperature of at least 140° C., or preferably 180° C., or more preferably 220° C.

In an embodiment, during step (a) electrically active defects at the at least a portion of the device are passivated by hydrogen atoms that have migrated to the portion.

In accordance with the fourth aspect, the present invention provides a method for processing a silicon-based photovoltaic device, the photovoltaic device comprising:
a first silicon doped region with a doping concentration below a doping threshold;
a second silicon doped region with a doping concentration above the doping threshold; and
a dielectric region;
wherein the first doped region, the second doped region and the at dielectric region contain atomic hydrogen that has been introduced during an hydrogenation step; the hydrogen concentration being at least 1e16 atoms/cm3;
wherein the method comprising the steps of treating the device in a manner such that atomic hydrogen redistributes throughout the device and the concentration of atomic hydrogen at the first doped portion and the second doped region drops below 1e16 atoms/cm3.

In an embodiment, the step of treating the device is such that light-induced degradation during light-soaking or subsequent operation in the field is reduced or eliminated.

In an embodiment, the step of treating the device is such that the concentration of atomic hydrogen drops below 1e16 atoms/cm3 through the entire device.

In an embodiment, the step of treating the device is such that the concentration of hydrogen atoms within the first and second silicon doped regions becomes such that Hydrogen Induced Recombination at the regions no longer affects the performance of the device.

In an embodiment, the step of treating the device is such that the concentration of hydrogen atoms within the first and second silicon doped regions becomes lower than 1e15 atoms/cm3.

In an embodiment, the step of treating the device is such that the concentration of hydrogen atoms within the dielectric region is minimised to reduce or eliminate light-induced degradation during light-soaking or subsequent operation in the field.

In an embodiment, the concentration of hydrogen atoms within the dielectric region is reduced sufficiently so that when the device is annealed at 250° C. for 10 minutes in the dark and a light-soaking process is performed, the open circuit voltage performance of the device degrades less than 2% under standard test conditions.

In an embodiment, the concentration of hydrogen atoms within the dielectric region is reduced sufficiently so that when the device is annealed at 250° C. for 10 minutes in the dark and a light-soaking process is performed, the open circuit voltage performance of the device degrades less than 1% under standard test conditions.

In an embodiment, the concentration of hydrogen atoms within the dielectric region is reduced sufficiently so that when the device is annealed at 150° C. for 5 hours in the dark and a light-soaking process is performed, the open circuit voltage performance of the device degrades less than 2% under standard test conditions.

In an embodiment, the concentration of hydrogen atoms within the dielectric region is reduced sufficiently so that when the device is annealed at 150° C. for 5 hours in the dark and a light-soaking process is performed, the open circuit voltage performance of the device degrades less than 1% under standard test conditions.

In an embodiment, the step of treating the device is such that the concentration of hydrogen atoms within the first silicon region and the second silicon region is reduced sufficiently so that when a light-soaking process is performed, the efficiency of the device degrades less than 3% under standard test conditions.

In an embodiment, the step of treating the device is such that the concentration of hydrogen atoms within the first silicon region and the second silicon region is reduced sufficiently so that when a light-soaking process is performed, the efficiency of the device degrades less than 2% under standard test conditions.

In an embodiment, the step of treating the device is such that the concentration of hydrogen atoms within the first silicon region and the second silicon region is reduced sufficiently so that when a light-soaking process is performed, the efficiency of the device degrades less than 1% under standard test conditions.

In an embodiment, the step of treating the device is such that atomic hydrogen is moved away from the dielectric region to the second silicon region and then to the first silicon region in a sequence.

In an embodiment, the step of treating the device comprises the step of annealing the photovoltaic device at a temperature of at least 140° C., or preferably 180° C., or more preferably 220° C.

In an embodiment, the doping threshold is $1e^{17}$ atoms/cm$^3$.

BRIEF DESCRIPTION OF THE DRAWINGS

Features and advantages of the present invention will become apparent from the following description of embodiments thereof, by way of example only, with reference to the accompanying drawings in which:

FIG. 2(*b*) shows a plot with fractional H$^0$ concentration as a function of both the Fermi Energy level (EF) (relative to the mid-gap energy level $E_m$) and the temperature;

FIGS. 5 to 10 show flow diagrams with steps required to process PV devices in accordance with embodiments;

FIG. 14 to 30 are representation of an apparatus for processing PV cells in accordance with embodiments.

DETAILED DESCRIPTION OF EMBODIMENTS

Figure 1:
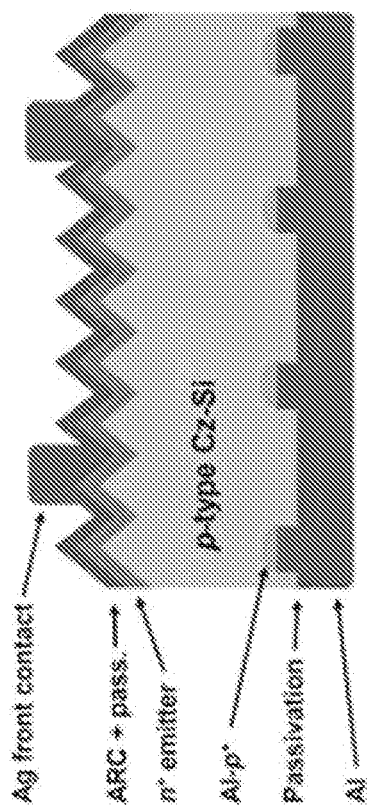
FIG. 1 is a schematic representation of a typical commercial passivated emitter rear cell (PERC) solar cell.

Embodiments of the present invention relate to the field of photovoltaics and manufacturing of high efficiency PV devices. In particular, embodiments relate to the incorporation of manufacturing processes to address issues caused by residual hydrogen atoms present in the devices after hydrogen passivation.

This disclosure is relevant to all crystalline and multi-crystalline silicon solar cells that capitalise on the hydrogen passivation of defects and/or recombination by diffusing or implanting or driving hydrogen into the silicon material from one or more external hydrogen sources.

The processes described herein allow stable bonding or dispersing of residual atomic hydrogen and, in particular, removing residual atomic hydrogen from regions of the devices where it can cause degraded performance.

This disclosure is focused on silicon solar cells. However, the techniques disclosed herein may be applied to other devices that are not silicon based, for example CZTS devices, CIGS devices, CdTe devices, GaAs devices, or Ge devices.

HIR occurs, for example, in the lightly doped regions of the devices and can therefore be eliminated by dispersing the atomic hydrogen from such regions of relatively high concentration to regions of lower concentration that are not so vulnerable to the HIR. To prevent LID, accumulated atomic hydrogen such as from the dielectric layers or any of the internal hydrogen sources within the silicon such as from the heavily doped regions, dissociating molecular hydrogen, released atomic hydrogen from bonded sites such as with boron and phosphorus atoms, needs to also be removed or greatly reduced in concentration to prevent subsequent diffusion of such hydrogen during device operation into the lightly doped regions where HIR can occur. This disclosure focuses on solving the corresponding form of LID that is particularly prevalent in p-type multi-crystalline silicon passivated emitter rear cell (PERC) solar cells by eliminating or reducing the sources and concentration of residual atomic hydrogen. This includes within any hydrogen containing dielectric layers, any accumulated molecular hydrogen and any heavily n-type doped regions where hydrogen can accumulate without causing HIR, to well below the levels existing during hydrogen passivation. Such levels are to be reduced sufficiently such that the transfer of the remaining atomic hydrogen from these sources is insufficient to cause significant degradation in cell efficiency.

Under certain circumstances, atomic hydrogen within silicon has the potential to act as a catalyst to induce the recombination of electrons from the conduction band (CB) with holes from the valence band (VB). This is of significance in lightly doped silicon when the free electron and hole concentrations are both relatively high. One example of how this can occur is due to negatively charged hydrogen atoms $H^-$ that release an electron by interacting (combining) with a hole from the VB and, in doing so, lose their charged state to become neutral, $H^0$. However, such neutrally charged $H^0$ atoms can similarly receive an electron from the CB to change back into the negative charge state $H^-$. In this way, the $H^-$ acts as a catalyst, effectively activating the recombination of an electron from the CB with a hole from the VB. This process, along with any other recombination processes within the silicon that involve only hydrogen without involvement from any other elements or defects, is known as hydrogen-induced recombination (HIR).

The equivalent reactions can occur with $H^+$ whereby an electron is received from the CB to produce $H^0$ which can subsequently then combine with a hole from the VB to transform back into $H^+$. These equivalent reactions however have a lower impact on the performance as a hole from the VB is not needed to transform $H^0$ into $H^+$ since this energy transition is so small that the $H^0$ auto-ionises. In other words, the single electron in $H^0$ is so weakly bonded that only a small amount of thermal energy (approximately 0.16 eV) is required to transform $H^0$ into $H^+$ making the reaction between $H^0$ and holes from the VB relatively unfavourable.

In common PV cells designs, both n-type and p-type regions are quite heavily doped with intentional doping in all regions typically exceeding 1e15 atoms/cm$^3$. In such heavily doped p-type silicon, virtually all of the atomic hydrogen is in the positive charge state and unable to contribute to HIR. This is in line with the analysis provided in Herring, C, Johnson, N M & Van de Walle, C G 2001, Energy levels of isolation interstitial hydrogen in silicon, Physical Review B, vol. 64.

In comparison, in heavily doped n-type silicon, the fraction of the atomic hydrogen in the negative charge state will be extremely high, but again unable to contribute significantly to HIR due to a lack of holes to combine with to transform the $H^-$ into $H^0$. A limited and simple analysis would therefore conclude that HIR could only occur in a minute volume in the vicinity of the p-n junction where compensation by the dopants can lead to low enough net doping that HIR could result if the atomic hydrogen concentration were high enough. However even in this case, it could be concluded that such a volume would be so small as to never pose a serious problem for HIR.

Referring now to FIG. 1, there is shown a schematic representation of a typical commercial PERC solar cell using a p-type Cz wafer with rear surface passivated by an $AlO_X$ dielectric layer and capped by a $SiN_X$ layer that acts as a hydrogen source during subsequent thermal processes.

The release of atomic hydrogen into the surface of the p-type silicon wafer during a thermally activated hydrogenation process is able to help passivate the $AlO_X$/Si interface such as by tying up dangling bonds and preventing their participation in recombination processes. However, to achieve the most effective hydrogen passivation of defects and contaminants throughout the entire device including passivation of the surfaces, it is beneficial to ensure that the amount of hydrogen introduced into the device or silicon wafer greatly exceeds the actual amount that will ultimately be bonded to all the defects during the passivation process. This is because the hydrogen atoms have limited diffusivity plus the concentrations of the defects requiring passivation often vary significantly throughout each device and structure type. Also, the rate of passivation is greatly increased for higher ratios of interstitial hydrogen atoms to defects needing passivation.

In fact, it is beneficial for the hydrogen concentration to significantly exceed the localized doping in some regions of the device by at least 10%, leading to corresponding short-term negative effects from the generation of hydrogen-induced recombination (HIR).

In this disclosure, the references to atomic hydrogen or monatomic hydrogen or interstitial hydrogen are intended to be equivalent. This is intended to include not only interstitial hydrogen atoms (atomic or molecular that can easily dissociate) but also weakly bonded hydrogen atoms that can act as dopants that can therefore contribute to establishing the described conditions that can lead to LID such as ones that weakly bond to or near a boron dopant ($B^-$ atom substitutionally bonded in the silicon lattice) to passivate it, therefore effectively acting as a donor dopant that nullifies (passivates) the corresponding boron atom effectively deactivating it by preventing it from acting as an acceptor dopant.

In this case, the provision of a relatively small amount of heat energy (by heating the silicon to at least 140° C. and preferably at least 180° C. and ideally above 220° C.) will thermally break the bond with the hydrogen atom (that is passivating the $B^-$), returning it to the positive charge state $H^+$ with resulting increased diffusivity if it can escape the electrostatic attraction from the $B^-$ atom.

Newer generations of higher efficiency PV devices place increased importance on bulk and surface passivation, particularly of the rear surface such as in the PERC cell. The ability of atomic hydrogen to passivate such defects has been well known for decades, but is appearing to have increased importance for the newer generations of higher efficiency devices. This is necessary to reduce the total device dark saturation current that therefore facilitates increased voltages. Surfaces however, due to the discontinuity in the semiconductor material, can often be a major source of active defects that cause recombination (increased dark saturation current) such as through dangling bonds. Work over several decades has focused on reducing such surface recombination by depositing or growing surface dielectric layers to reduce the surface state density (such as caused by dangling bonds), using atomic hydrogen to further passivate such surface states, increasing the doping at the surface to reduce the minority carrier concentration in the region of the surface states, using electrostatic effects such as through the use of charge within the surface coating or coatings to bend the energy bands near the surface to give effects similar to increasing the surface doping, coating the semiconductor surface with wider bandgap materials selected to also give bending of the energy bands at the surface of the semiconductor so as to reduce recombination at the interface and using thick heavily doped regions at the surface that electrically isolate the surface region and any associated defects from the active parts of the cell.

Reports and findings in the literature appear to universally agree that hydrogen passivation of defects that would otherwise contribute to bulk or surface recombination is a beneficial component of surface passivation.

The Applicants have found that, surprisingly, the role of residual hydrogen in the PV devices is more complex as the hydrogen atoms within silicon can act as dopants, either donors or acceptors depending on EF. For example, when $H^0$ transitions into $H^+$, it releases an electron into the CB and therefore acts as a donor. In comparison, if the $H^0$ transitions into $H^-$, it removes an electron from the CB (or equivalently adds a hole to the VB) and therefore acts as an acceptor. If, for example, we consider the typical silicon solar cell structure of a passivated emitter and rear cell (PERC) of FIG. 1, the dielectrics on both surfaces can contain hydrogen and therefore act as sources of atomic hydrogen for the silicon. If we first consider the case of $H^0$ atoms entering the top n-type surface of the PERC solar cell, since such n-type regions are very heavily doped with donor atoms such as phosphorus typically peaking at above 1e20 atoms/cm$^3$, $H^0$ will transition into $H^-$ and therefore act as an acceptor. Such $H^-$ atoms have diffusivities typically several orders of magnitude less than $H^0$ and so there is a tendency for such $H^-$ to accumulate within the heavily doped n-type layer as increasing amounts of atomic hydrogen are released from the dielectric into the silicon top surface. However since the n-type layers are very heavily doped, even if very large quantities of atomic hydrogen enter the surface of the n-type layer, it is unlikely that the localised atomic hydrogen concentration will approach that of the intentional n-type dopants, so all such hydrogen that remains as interstitial atoms will be in the negative charge state and therefore act as acceptors to counter-dope the intentional n-type dopants. If the localised concentration of atomic hydrogen atoms approaches that of the intentional n-type dopants the silicon would effectively become sufficiently lightly doped so as to lead to significant levels of HIR. This would be quite unlikely in typical PERC cells under normal circumstances given how heavily doped the n-type region is. Instead, such atomic hydrogen would simply accumulate within the n-type emitter as $H^-$ unless a mechanism is found to convert the $H^-$ to $H^0$ that has a much higher diffusivity that would allow it to diffuse from such a region of accumulation to other regions with lower concentrations of atomic hydrogen and eventually to lightly doped silicon where HIR or HAR can occur. For example, this applies regardless of whether the wafer being used is lightly doped p-type or n-type. In either case increasing the injection level through illumination will naturally increase the concentration of $H^0$ in the heavily doped n-type region and allow the $H^0$ hydrogen to diffuse to regions of lower concentration. This in turn will allow additional molecular hydrogen to dissociate into atomic hydrogen to restore the equilibrium between the molecular and atomic hydrogen. Continuation of this illumination can eventually lead to sufficient hydrogen reaching the lightly doped p or n-type regions where HIR or HAR can occur, manifesting itself as LID.

In fact, the Applicants have even found that during operation in the field the illumination increases the injection level in the same way which in turn significantly increases the $H^0$ fraction. This facilitates the diffusion of some of the accumulated $H^-$ in the n-type region through to the more lightly doped regions in the vicinity of the junction, making it possible for HIR and/or HAR to increase and manifest itself as light-induced degradation (LID). In particular, for the case of HIR, $H^0$ moving into the lightly doped material on the p-type side of the junction will transform into $H^+$ thereby acting as donor atoms and counter-doping the intentional p-type dopants. This causes the effective p-type doping to reduce. If $H^0$ continues to flow into this region, the counter-doping continues until all the p-type dopants are either neutralised by the $H^+$ atoms acting as donors or passivated by the $H^+$ atoms directly bonding to the negatively charge p-type dopants that are substitutionally bonded within the silicon lattice or a combination of both. In either case, the silicon material effectively acts like intrinsic silicon, although the continued flow of $H^0$ into this region will still lead to a large majority of the additional hydrogen atoms going into the positive charge state and therefore still act as donors. This causes EF in equilibrium to continue to rise, converting the material into being lightly doped n-type until EF reaches about 0.16 eV above mid-gap, following which, approximately half of all additional hydrogen atoms become $H^-$ and approximately half $H^+$, therefore maintaining EF at approximately this value.

This generation of significant fractions of the atomic hydrogen as $H^-$ combined with the low effective doping concentration for the silicon in this region, creates the conditions for substantial levels of HIR with corresponding significant reductions in the minority carrier lifetimes. For PERC cells operating in the field, this generation of HIR and corresponding deterioration in the minority carrier lifetime, manifests itself as LID with a corresponding significant reduction in open-circuit voltage and efficiency and to a lesser extent, loss in photo-generated current. The fill-factor (FF) can also potentially fall a little due to the injection-level dependence of the charge state fractions that result from increasing injection levels trying to shift EF closer to mid-gap.

Figure 2B:
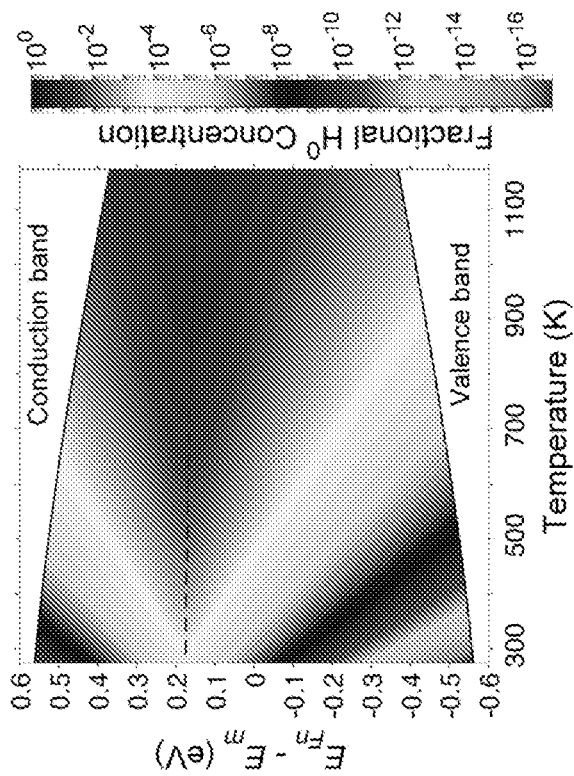
FIG. 2(*a*) shows an energy band diagram for crystalline silicon showing the energy levels corresponding to hydrogen related energy transitions.
Figure 2A:
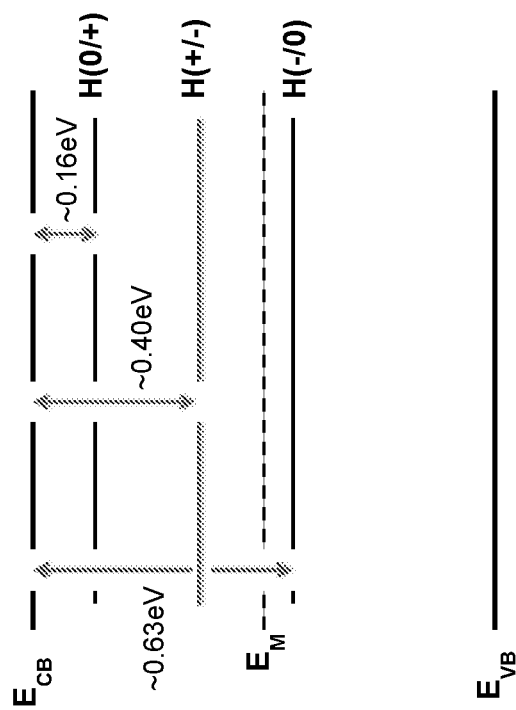

FIG. 2(a) shows an energy band diagram for crystalline silicon with energy levels corresponding to hydrogen related energy transitions When the hydrogen atom is in the negative charge state ($H^-$) with two electrons, it takes approximately 0.6 eV of energy to remove one of the two electrons at room temperature to convert the $H^-$ into the neutral charge state ($H^0$). On the energy band diagram for silicon, this transition therefore has an energy level $H^{(-/0)}$ that is about 0.6 eV below the conduction band.

This essentially means that, for a given hydrogen atom, if the $H^{(-/0)}$ energy level is occupied by an electron, then it is in the negative charge state $H^-$ whereas if $H^{(-/0)}$ is vacant, then it is in the neutral charge state $H^0$. In comparison, it takes only about 0.16 eV of energy to remove the second electron which is relatively weakly bonded to the nucleus, to convert the $H^0$ into $H^+$. On the energy band diagram for silicon, this transition therefore has an energy level $H^{(0/+)}$ that is about 0.16 eV below the conduction band (CB) as shown in FIG. 2. It therefore becomes possible for $H^0$ to transition to either $H^+$ as described or instead to take on an electron from the CB to transition to $H^-$, with the relative probabilities for these transitions determined by the EF for the silicon which in turn is determined by a range of factors including the net doping concentration of the silicon, injection level, temperature, any localised electric fields such as via the presence of electrostatic charge in surface layers or externally applied electric fields, etc.

For example, if EF is closer to $H^{(-/0)}$ than $H^{(0/+)}$, then the probability of $H^{(-/0)}$ energy level being occupied to give $H^-$ is less than one minus the probability that $H^{(0/+)}$ is occupied to give $H^+$. This is equivalent to saying that at this EF, there is a higher probability of $H^0$ transitioning to $H^+$ than there is to $H^-$. If however EF is closer to $H^{(0/+)}$ than to $H^{(-/0)}$, the reverse occurs and there is a higher probability of $H^0$ transitioning to $H^-$ than there is to $H^+$. Such conditions will therefore naturally lead to the concentration of $H^-$ exceeding that of $H^+$ as with the concentrations expected to be roughly equal when EF is half way between $H^{(-/0)}$ and $H^{(0/+)}$, depending on the respective capture cross-sections of the electrons and holes involved in facilitating these transitions which can cause a small offset if there is some asymmetry. The Fermi energy level at which there is equal probability of $H^0$ transitioning into either $H^+$ or $H^-$ that gives roughly equal concentrations of each is defined here as $H^{(0/-)}$ and in silicon is believed to occur at approximate 0.4 eV below the CB as shown in FIG. 2 based on analyses in the literature. In other words, the Fermi energy level determines the probability of $H^0$ transitioning into either $H^+$ or $H^-$ and therefore determines the fractions of the respective hydrogen charge states. When $H^0$ transitions to $H^+$, it releases an electron into the CB and is therefore acting as a donor atom. Conversely, $H^0$ transitioning to $H^-$ removes an electron from the CB (or equivalently adds a hole into the Valence Band (VB)), therefore also acting as a dopant atom, which in this case is an acceptor atom.

The net result is that in p-type silicon where EF is well below $H^{(+/-)}$, $H^0$ will preferentially transform into $H^+$ due to the fact that the fraction of $H^+$ at such Fermi energy levels greatly exceeds the fraction of $H^-$ in equilibrium at room temperature. As $H^0$ transforms into $H^+$, it is releasing an electron into the CB and therefore acting as a donor that counter-dopes or compensates the p-type doping. Importantly, this shifts EF. The Applicants are the first to realise the strong impact that the interstitial hydrogen's charge state has in acting as a dopant and the consequent effect on EF which in turn then impacts the hydrogen's fractional charge state concentrations. In particular, additional interstitial hydrogen will always go into the charge state necessary to act as a dopant of the polarity needed to shift EF towards the level $H^{(+/-)}$ at which all additional $H^0$ will transform in roughly equal proportions into $H^+$ and $H^-$ so as to maintain EF at $H^{(+/-)}$. Sufficient hydrogen, whereby its concentration exceeds the background doping concentration, will always therefore tend to push EF to the $H^{(+/-)}$ level, leading to any additional hydrogen atoms having roughly equal probability of being either $H^+$ or $H^-$.

The importance of controlling the Fermi Energy level (EF) in the way described is further emphasized in FIG. 2(b) which graphically shows both the importance of EF and also the importance of temperature. For example, in p-type silicon typical of commercial wafers, EF is close to the Valence Band (VB) with FIG. 2(b) showing that $H^0$ is reduced by approaching 10 orders of magnitude at 300 deg K compared to if EF is at its optimum value of $H^{(+/-)}$ of about 0.16 eV above midgap. It should be noted that to thermally achieve the same sort of fractional $H^0$ concentration while at the EF determined only by the p-type wafer doping in the vicinity of 1e16 atoms/cm$^3$ (i.e. without the interstitial monatomic hydrogen acting as a dopant), that the temperature needs to be raised by typically 500° C. Ideally, in addition to using sufficient interstitial (and/or monatomic) hydrogen to achieve the desired EF for maximising $H^0$ generation, raising the temperature to at least 50° C. and preferably 100° C. can be seen from FIG. 2(b) to further beneficially increase the fraction of $H^0$. Perhaps just as importantly, this temperature increase significantly increases the diffusivity of the $H^0$ enabling it to move more easily throughout the silicon while simultaneously being more reactive than in the other charge states. This massive enhancement in the fraction of $H^0$ combined with the availability of suitably large concentrations of monatomic hydrogen from the hydrogen sources, greatly enhances the effectiveness of the hydrogen passivation.

Figure 3:
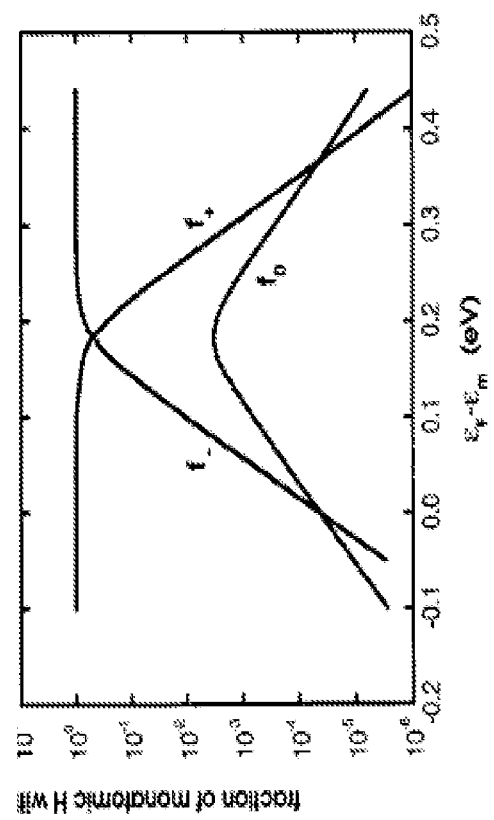
FIG. 3 shows a plot with fractional charge states of interstitial hydrogen atoms in silicon as a function of EF as reported in the literature.

FIG. 3 shows a plot with fractional charge states of interstitial hydrogen atoms in silicon as a function of the Fermi Energy level as reported in the literature.

In extreme cases where the concentration of atomic hydrogen in the vicinity of the semiconductor surface or even deeper within the semiconductor is well above the localized doping concentration of the silicon, large concentrations of both the negative ($H^-$) and positive ($H^+$) charge states of the hydrogen co-exist. In addition to the above explanation for this, these conclusions can be drawn by combining the theory relating to the interstitial hydrogen atoms acting as dopants in silicon with the background theory provided relating to the calculation of the fractional charge states for the hydrogen atoms in silicon as a function of EF at equilibrium, shown in FIG. 3. This localized accumulation of $H^-$ near the surface (or even deeper within the silicon) creates an additional component of recombination as neutrally charged hydrogen atoms ($H^0$) receive electrons from the conduction band to produce the negatively charged hydrogen atoms ($H^-$) while the negatively charged hydrogen atoms interact with the holes to complete the recombination process by producing neutrally charge hydrogen atoms. In this way, the hydrogen atoms are acting as a catalyst to induce or trigger the effective recombination of an electron from the CB with a hole from the VB.

Figure 4:
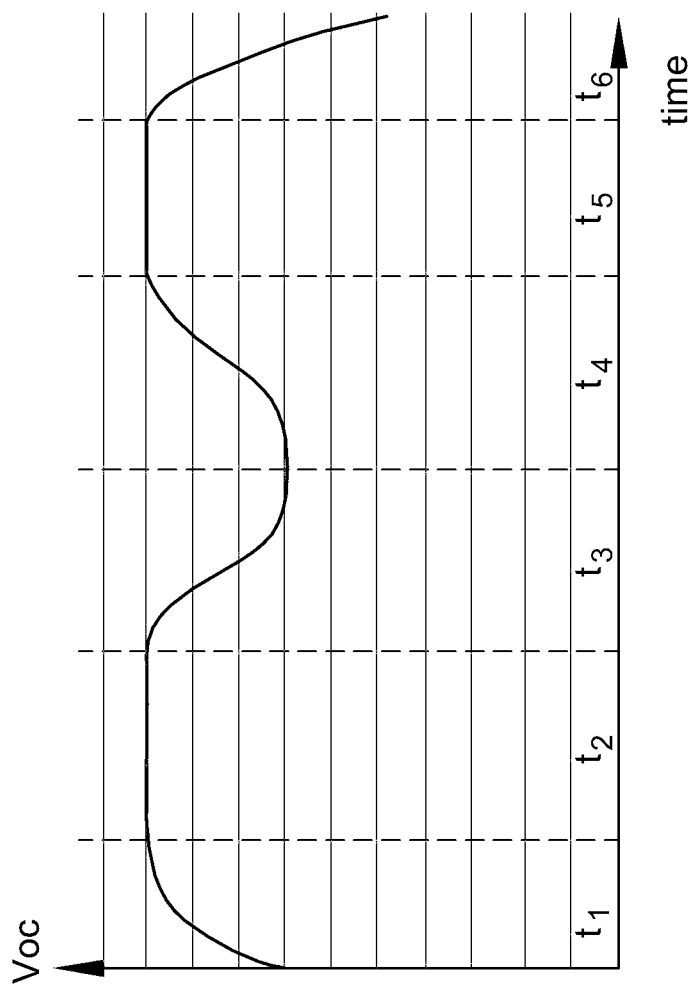
FIG. 4 shows the open circuit voltage of a PERC cell as the hydrogen atoms enter the lightly doped p-type silicon surface at the rear, initially passivating defects but subsequently causing increased recombination.

FIG. 4 shows the open circuit voltage of a PERC cell as the hydrogen atoms enter the lightly doped p-type silicon surface at the rear, initially passivating defects but subsequently causing increased recombination.

In the context of the rear surface of the device, during the hydrogen passivation process as the hydrogen atoms enter the rear surface of the silicon wafer which in this example is lightly doped p-type. A corresponding improvement in open circuit voltage is obtained during the period $t_1$, saturating during period $t_2$ with little further gains to be made through the continued flow of the interstitial hydrogen into the rear surface of the p-type PERC.

However, as discussed above, the Applicants have realised that surplus interstitial hydrogen atoms in the region of the solar cell rear surface, act as dopants to counter-dope the localized doping of the silicon and to nullify any band-bending of the conduction band due to electrostatic effects. In the case of the PERC device in FIG. 1, the rear silicon surface is p-type with electrostatic charge in the rear dielectric acting to make the rear surface act equivalently to more heavily doped p-type silicon, therefore resulting in localized interstitial hydrogen atoms going into the positive charge state ($H^+$) and acting as donors that counter-dope the existing p-type dopants in the silicon and the induced electrostatic effects from the $AlO_X$ layer. In low concentrations (much less than the localized silicon doping of typically 1e16 atoms/cm$^3$), the counter-doping has minimal impact on the rear surface passivation. Therefore, during the period $t_2$, minimal change in the Voc occurs as the interstitial hydrogen neither improves the material quality through defect passivation nor creates significant problems through the counter-doping of the silicon.

However if the interstitial hydrogen atoms continue to flow into the surface of the silicon wafer, either during the hydrogenation process or else during any other subsequent conditions the wafer is exposed to, it is possible for the hydrogen concentration to increase to such an extent that it becomes comparable to the localized p-type doping of the silicon at the rear surface, leading to the net doping significantly falling during the period $t_3$. This reduction in net doping at the surface can lead to a fall in Voc during period $t_3$ as shown in FIG. 4, reaching a minimum as the net doping approaches zero (behaving like intrinsic silicon with EF in equilibrium at mid-gap on the energy-band diagram). It should be noted that each of these atoms of interstitial hydrogen in the vicinity of the boron-doped surface will act as donor dopants regardless of whether the atoms directly passivate the boron atoms or merely remain as $H^+$ interstitial atoms. For example, if an $H^0$ atom moves into this p-type region, it will naturally auto-ionize to form $H^+$ releasing an electron into the CB as it either bonds to or adjacent to a $B^-$ atom (substitutionally bonded boron atom) or simply remains as a more mobile interstitial $H^+$ atom. Some probably do both. Both cases are electrically identical with each hydrogen atom acting as a donor dopant in each case. For the latter however, the $H^+$ retains a higher diffusivity than that of the hydrogen atom that bonds to the $B^-$ atom, as it passivates and deactivates it electrically. Although electrically the same, in the presence of an electric field, the $H^+$ interstitial atom is free to move while the $H^+$ that bonds to the silicon lattice in the vicinity of a $B^-$ atom is relatively unaffected by the electric field unless the wafer is heated. With heating, the bond between the $H^+$ and $B^-$ can be thermally broken, allowing the electric field to shift the $H^+$ away from the $B^-$ while the $B^-$ remains stationary due to it being substitutionally bonded into the silicon lattice. For this reason, even $H^+$ bonded in this way to a $B^-$ atom can be considered to still be mobile under the right conditions and still be a donor dopant and therefore is included in this disclosure when referring to 'atomic hydrogen' or 'interstitial hydrogen atoms' or 'monatomic hydrogen'.

The charge state distribution for interstitial hydrogen atoms within silicon is a function of EF, with the critical Fermi Energy level of $H^{(+/-)}$ (typically 0.16 eV above midgap) being reported by Herring to be the conditions when interstitial hydrogen atoms have equal probability of being either in the positive ($H^+$) or negative ($H^-$) charge state and when the neutral charge state ($H^0$) concentration is approximately maximized. For Fermi Energy levels in equilibrium below this value, almost all interstitial hydrogen atoms go into the positive charge state $H^+$ and act as donors while above this, almost all interstitial hydrogen atoms go into the negative charge state $H^-$ and act as acceptors. This explains why during the period $t_4$ in FIG. 4 the Voc recovers. This can be an effect localised at the surface but can also penetrate beneath the surface if sufficient hydrogen penetrates into the wafer to allow its localised concentration to approach or even exceed that of the wafer doping in one or more regions.

More specifically, at the end of period $t_3$, the monatomic hydrogen concentration is approximately the same as the localized p-type doping leading to an extremely low net doping (approximately intrinsic silicon) with a Fermi Energy level in equilibrium that magnifies the localized recombination. However, because the Fermi Energy level (in equilibrium) under such conditions is still well below the critical $H^{(+/-)}$ level (0.16 eV above midgap), further increases in the concentration of the interstitial hydrogen atoms leads to the additional atoms still predominantly acting as donors as they go into the positive charge state. This causes the localized silicon to become n-type, with the net doping continuing to increase with time until the localized EF approaches the critical value $H^{(+/-)}$ at the end of $t_4$ at which additional interstitial hydrogen atoms have equal probability of becoming $H^+$ or $H^-$, preventing any further change in either the localized net doping or EF. Therefore, during $t_4$, the effective surface passivation at the p-type silicon interface with the $AlO_X$ improves, leading to the corresponding increases in Voc seen in FIG. 4 with subsequent saturation during $t_5$ during which time there are no longer any changes in the net doping of the silicon at the rear surface for the given conditions and injection level.

Towards the end of $t_5$ however, continued flow of interstitial hydrogen atoms into the rear silicon surface leads to substantial concentrations of $H^-$ being formed locally, either at the surface or penetrating into the wafer (or both), leading to significant interaction with the minority carrier holes and corresponding recombination as the $H^-$ combines with such holes to produce $H^0$. In steady state, this is balanced by the rate at which $H^0$ is produced by majority carrier electrons from the conduction band combining with $H^0$ atoms. This additional component of recombination is an example of 'hydrogen-induced recombination' (HIR) and leads initially to a gradual fall in Voc towards the end of $t_5$, followed in $t_6$ by a much more substantial fall as the concentrations of $H^-$ continue to increase and potentially spread to a larger volume of the silicon extending deeper into the silicon from the rear surface as hydrogen atoms penetrate deeper within the silicon in increasing concentrations.

Although the above description has been primarily written in the context of the rear p-type surface of the PERC cell in FIG. 1 (that is passivated typically by an $AlO_X$ dielectric and $SiN_X$ hydrogen containing capping layer), any surfaces regardless of polarity, can be similarly affected, initially by atomic hydrogen counter-doping the dominant or background dopant at the respective surface and eventually through increased recombination if the atomic hydrogen concentration becomes comparable or even exceeds the localised background doping of the silicon surface and nearby regions. For example, the top surface of the p-type silicon wafer forming the PERC cell in FIG. 1 is doped n-type with a layer typically less than 1 micron thick. Interstitial atomic hydrogen entering this n-type surface from the top surface $SiN_X$:H layer naturally takes on the $H^-$ charge state, therefore acting as an acceptor to counter-dope the n-type surface, equivalently to the way the $H^+$ atoms counter-doped the p-type surface at the rear. Normally this n-type surface is much more heavily doped than the bulk of the p-type wafer, preventing the interstitial hydrogen from reaching the high concentrations necessary to completely counter-dope the surface. However, this monatomic hydrogen penetrating from the top surface down into the lightly doped p-type silicon wafer bulk still has the same impact in producing $H^-$ (and therefore recombination) as at the rear surface, if the atomic hydrogen concentration increases sufficiently locally to approach or even exceed the wafer p-type doping. Degradation near the surfaces due to this increasing recombination from the $H^-$ during $t_5$ can therefore equivalently occur near both the front and rear surfaces although may be shifted a little in time due to the slight variations in structure of the respective dielectrics and silicon surfaces that affect the flow of hydrogen.

It should be noted that a well designed and implemented hydrogenation process can naturally feed sufficient hydrogen into the rear and/or front p-type surfaces to take the p-type silicon wafer and respective surface through the evolutionary stages described above and reflected in the implied Voc values shown in FIG. 4 through to $t_6$. It is also possible for the equivalent hydrogenation process to be implemented progressively during device fabrication, comprising multiple processes at elevated temperatures (above room temperature) so that in combination the wafers or even finished devices are taken through the described evolutionary processes that eventually lead the device (or partly processed device) into having one or more localised regions within which the hydrogen concentration exceeds the localised background doping concentration (where the referred to background doping concentration is distinguished from the doping contribution of the interstitial hydrogen atoms acting as dopants).

To assess whether the hydrogenation processes being used during device fabrication are consistent with this invention (whereby they are able to achieve the high localised hydrogen concentrations that exceed the localised background doping concentrations), a simple test can be implemented (even on partly processed devices) to identify the device's ability to generate amounts of $H^-$ in the p-type wafer material by causing the localised hydrogen concentrations to exceed the localised background doping concentrations. This is done by heating the wafers to 150° C. to 200° C. while illuminating their dielectric coated surfaces with approximately 1-sun illumination (~100 mW/cm$^2$) and then as a function of time, monitoring the increasing recombination in the sample (such as via lifetime measurements, implied Voc values, PL measurements, etc) that is indicative of the increasing $H^-$ in the regions where the hydrogen concentration exceeds the net background doping level and creates increased recombination.

A crucial step implemented by the Applicants consists in dispersing or eliminating the $H^-$ responsible for contributing to recombination in the device so that under the range of normal operating conditions for a solar cell in the field, any remaining interstitial hydrogen will be in either the positive or neutral charge states (including neutral $H_2$) which will not contribute significantly to recombination in these forms. However before implementing processes to eliminate or disperse any residual $H^-$ that is able to produce HIR, it is important to first drain from the front and/or rear hydrogen containing dielectric layers (by thermal diffusion or through the use of electrostatic forces or electric fields) any remaining atomic hydrogen already released but still present within the dielectric layer(s). If such residual atomic hydrogen is not drained out of the dielectrics, it will remain relatively mobile and therefore be able to later diffuse or be driven out of the dielectric layers by electrostatic forces or electric fields into the silicon and therefore potentially create problems. Embodiments of the method proposed herein first drain such residual atomic hydrogen out of the dielectrics so that whatever goes into the silicon and therefore likely to contribute HIR, can be dispersed during the subsequent process specifically designed to eliminate such $H^-$. If this is done thermally, temperatures in excess of 150° C. should be used and preferably above 200° C. and even 250° C. to enable the draining of the atomic hydrogen from the dielectrics to take place in a matter of hours rather than days. However to be effective in less than an hour, temperatures approaching 300° C. can be usefully used and even approaching 400° C. or even 500° C. can allow this to happen in a matter of minutes. However temperatures this high have the disadvantage that they may provide sufficient thermal energy to release additional bonded hydrogen within the dielectrics with such additional hydrogen atoms then able to subsequently diffuse into the silicon surface from the external hydrogen sources, therefore potentially at a later stage adding additional hydrogen that may cause recombination and therefore may also need to be dispersed or got rid of. For these reasons, temperatures in excess of 650° C. should not be used in this process and preferably below 500° C. or even 450° C.

To eliminate the detrimental effects of the $H^-$ recombining with the minority carriers (holes), it is important to recognize that this is just a localized phenomenon within the p-type wafer that occurs where the hydrogen has attained concentrations comparable to or even well in excess of the intentional background wafer doping concentration. However for devices with n-type regions, particularly if they are heavily n-type doped, it is possible for relatively large concentrations of $H^-$ to be present in such regions without contributing significantly to the HIR due to the extremely low concentrations of minority carrier holes in such regions. Never-the-less, after draining the dielectric layers of residual atomic hydrogen it is also necessary to disperse this $H^-$ or else it will subsequently be able to diffuse into more damaging regions when converted to $H^0$ when illuminated or heated sufficiently.

The processes described herein allow altering the charge state of residual hydrogen to promote diffusion and redistribution of hydrogen through the device by, for example, generating atomic hydrogen with a neutral charge. Further, some of the processes described allow moving charged atomic hydrogen across different regions of the device. In addition, further processes described herein allow creating hydrogen sink regions in the device to attract residual atomic hydrogen or to more rapidly drain atomic hydrogen out of the dielectric layers by creating hydrogen sinks within the silicon.

In some embodiments of the present amounts of hydrogen are deliberately diffused or implanted into the silicon surface well in excess of the concentrations needed to passivate all the defects at the surface and within the semiconductor material which therefore causes damage through the degradation of the electrical properties, but to then subsequently fix this damage. This is done by using a subsequent process to the passivation process for dispersing the excess interstitial or high mobility hydrogen atoms to bring down the concentrations of atomic hydrogen in the vicinity of the semiconductor surface to acceptable levels whereby the counter-doping and any nullifying of the electrostatically induced band-bending effects are minimal. This allows maximum benefit to be gained from the hydrogen passivating the surface defects in the semiconductor or at the semiconductor/dielectric interface but while causing minimal increase in surface or bulk recombination through the doping effects of the hydrogen.

Referring now to FIG. 5 there is shown a flow diagram 500 of a method for processing a PV device in accordance with embodiments. At step 502, a thermal treatment can be applied so that hydrogen atoms migrate towards at least one of the doped regions so that the concentration of hydrogen within the at least one of the doped regions becomes at least 10% higher than a doping concentration of that region. Hydrogen atoms distribute within the at least one of the doped silicon regions. This can include a hydrogen passivation step. A further thermal treatment is performed, step 504, so that atomic hydrogen stably bonds or migrates out of the at least one of the doped silicon regions and the concentration of atomic hydrogen within the at least one of the doped regions drops below the doping concentration of that region. During step (b) at least a portion of charged hydrogen atoms change their charge state to become neutral.

A. Autogeneration of the Neutral Charge State for Hydrogen Atom in Silicon

A silicon wafer, device or partly fabricated device that has the atomic hydrogen concentration in one or more regions exceeding the localized doping concentration for the silicon as a result of the hydrogen passivation process (such as in the presence of a hydrogen source provided by a hydrogen containing surface dielectric layer or layers deposited by PECVD), will naturally have its Fermi Energy level (EF) determined by the interstitial hydrogen atoms acting as dopants. Once this EF $H^{(+/-)}$ is achieved (that is compatible with the donor and acceptor energy levels determined by the bonding arrangements and energy levels of the respective electrons), any additional interstitial hydrogen atoms not required for achieving this EF will have roughly equal concentrations of both H and $H^-$ so as not to affect EF. It should be noted that in this scenario, the $H^+$ atoms are acting as 'donor' dopants contributing their electron(s) to the conduction band while the $H^-$ atoms are acting as 'acceptor' atoms, removing electrons from the conduction band or equivalently adding holes to the valence band. Therefore, even though it is of significant benefit for the hydrogen passivation to have localized regions where the atomic hydrogen concentration exceeds the background doping concentration, there are several important consequences for the electronic properties of the device, both positive and negative, that make this invention particularly important. Firstly, even in silicon wafers or silicon material with net p-type dopants, when the interstitial hydrogen concentration exceeds the localized p-type dopant concentration, sufficient hydrogen atoms will go into the $H^+$ state and act as donors or directly passivate boron acceptors or a combination of both, to eliminate the effective or net p-type doping and can even potentially make the material n-type doped along the lines with EF $H^{(+/-)}$ in equilibrium shifting to a little above midgap in response to the doping by the hydrogen atoms. Any excess hydrogen atoms over and above those necessary to achieve this EF $H^{(+/-)}$, will in combination not affect EF, being roughly equally divided between the $H^+$ and $H^-$ charge states so that the corresponding additional donors and acceptors contributed by such hydrogen atoms, nullify each other from a doping perspective. Secondly, in this situation, the light (or low) net n-type doping created by the hydrogen, results in relatively high concentrations of holes (compared to conventional n-type doped regions) in the valence band in this region which then increases the interaction and recombination with the $H^-$ atoms that were formed from the excess interstitial hydrogen atoms in such regions. Thirdly, these conditions are conducive to increased generation of $H^0$, whenever there is excess interstitial hydrogen atoms that simultaneously generate significant quantities of H+ and $H^-$. $H^0$ is the 'high-mobility' or 'high-diffusivity' state for interstitial hydrogen atoms with diffusivities many orders of magnitude higher than for the other charge states. Nevertheless, this diffusivity is still very temperature dependent, necessitating temperatures of at least 100° C. and preferably above 150° C. for the $H^0$ to be able to move a reasonable distance before being returned to one of the other low mobility charge states. The aim in this invention therefore is to use sufficiently high temperatures so that this 'auto-generation' of $H^0$ can lead to its dispersal in a reasonable time period. This is described as 'auto-generation' of $H^0$ since it is the atomic hydrogen acting as dopants in sufficient quantities that automatically shifts EF to the value at which $H^0$ is significantly increased, or even maximised at EF of $H^{(+/-)}$. The mechanism of dispersal is that as the $H^0$ atoms are auto-generated as described, they move a distance determined by their diffusivity (which in turn is determined by their temperature) such that if in their new position the interstitial atomic hydrogen concentration is no longer high enough for the hydrogen atoms to be determining the net doping concentration (and hence the Fermi energy level) then the auto-generation of the $H^0$ no longer applies and the hydrogen atom is able to remain in a low mobility charge state in that location with minimal $H^-$ and therefore minimal contribution to recombination and minimal further movement of that hydrogen atom. If however in the new location the interstitial hydrogen concentration still exceeds that necessary for the hydrogen atom dopants to determine the net doping, then the auto-generation of $H^0$ will continue in this new location and the $H^0$ will continue to be dispersed until reaching locations where the auto-generation of $H^0$ is no longer taking place in which case the $H^-$ concentration will also be minimized as the silicon returns to having a net p-type doping concentration. This is of great importance to the present invention since this 'auto-generation' of $H^0$ is providing an important mechanism for getting rid of the surplus $H^-$ from such regions that are causing the recombination with the holes.

It should be noted that this concept of 'auto-generation' of $H^0$ is defined here to correspond to the conditions where there is sufficient interstitial hydrogen atom concentrations relative to the background doping to determine the localized Fermi Energy level $H^{(+/-)}$ that naturally then leads to any surplus interstitial hydrogen atoms leading to the greatly increased generation of $H^0$ and with the other additional hydrogen atoms being split equally between $H^-$ and $H^+$ so as not to affect the Fermi Energy level.

Referring now to FIG. 6 there is shown a flow diagram 600 of a method for processing a PV device in accordance with embodiments. At step 502, at least a portion of the device is exposed to hydrogen atoms in a manner such that, hydrogen atoms migrate towards at least one of the doped regions and the concentration of hydrogen within the at least one of the doped regions becomes at least the same as the doping concentration of that region. The conditions are formed for the autogeneration of $H^0$. A further thermal treatment is performed, step 604, when at least a portion of the device is annealed while exposed to hydrogen atoms in a manner such that at least a portion of charged atomic hydrogen within the at least one of the doped regions become neutral hydrogen atoms. During step (b) at least a portion of charged hydrogen atoms change their charge state to become neutral.

As mentioned, the auto-generation of $H^0$ needs to be done at elevated temperature above 100° C. and preferably above 150° C. to increase the diffusivity of the resulting $H^0$ atom so that it can move away at reasonable speed from its existing location where the interstitial hydrogen concentration is high enough to maintain some of them in the negative charge state $H^-$. Even higher temperatures above 200° C. or even 250° C. will further speed up the process by further increasing the diffusivity of the H0. From a manufacturing perspective, even higher temperatures above 300° C. or even 350° C. may be beneficial to increase throughput although with the disadvantage that at such high temperatures, the amount of additional interstitial hydrogen atoms diffusing into the silicon surface from external hydrogen sources may be higher, therefore potentially adding additional hydrogen that may cause recombination and therefore may also need to be dispersed or got rid of. For these reasons, temperatures in excess of 700° C. should not be used in this process and preferably below 650° C. or even 600° C.

If such high temperatures in excess of 500° C. are considered important for speeding up the process, a subsequent reduction in temperature can be beneficially used so that the majority of the $H^-$ can be progressively and repeatedly converted to $H^0$ and dispersed quickly during the higher temperature part of the process while during the lower or gradually reducing temperature part of the process, the amount of additional hydrogen entering the silicon is greatly reduced and the remaining small amount of $H^-$ can be converted to $H^0$ via auto-generation and then dispersed or got rid of in a relatively short time frame. For example, during this part of the auto-generation of $H^0$ and dispersal process, the temperature of 700° C. can be used for 30 secs followed by 30 secs at 600° C. then 30 secs at 500° C. and then 30 secs at 400° C. and then 30 secs at 300° C. and finally 30 secs at 200° C. From a practical perspective, this is more easily implemented as a gradually reducing temperature over a period of typically 3-4 mins as the temperature is reduced from 700° C. down to below 200° C. while the wafers are kept in the dark. This achieves essentially the same outcome.

A.1. Expanding Regions of Autogeneration of $H^0$

Once one or more regions have established the conditions necessary for the autogeneration of $H^0$, these regions can be expanded to other areas to enhance the hydrogen passivation by holding the wafer at a temperature of at least 50° C. and advantageously above 100° C. in the dark (illumination level below 0.1 mW/cm$^2$ and preferably below 1 μW/cm$^2$) while preferably maintaining the supply of hydrogen into the regions already auto-generating $H^0$ such as the surfaces of the wafer or at the extremities of lightly doped regions or in the vicinity of crystallographic defects such as grain-boundaries etc. Under these conditions, the $H^0$ from a region X where the $H^0$ is auto-generated is able to diffuse into an adjacent region Y where the concentration of atomic hydrogen is too low to achieve the Fermi Energy level in the vicinity of $H^{(+/-)}$ as needed for the autogeneration of $H^0$. If for example region Y is still p-type with EF below midgap, then it can be seen from FIG. 2 that the $H^0$ flowing into this region will be converted preferentially to $H^+$ and in so doing, releases its electron into the CB as the hydrogen acts as a donor atom. This shifts EF towards $H^{(+/-)}$. As $H^0$ continues to flow into Y from X, as long as EF remains below $H^{(+/-)}$ then the $H^0$ continues to preferentially act as donor atoms, shifting EF closer and closer towards $H^{(+/-)}$ until it gets close enough to $H^{(+/-)}$ so as to cause significant increase in the $H^0$. Under these conditions, as referred to previously, the generation of $H^0$ is then close to its maximum value also in region Y and the autogeneration of $H^0$ is considered to commence, representing an expansion of region X. This process can continue, leading the regions of autogeneration of $H^0$ to expand across the entire device or semiconductor layer provided sufficient hydrogen is supplied and the temperature is maintained high enough and for long enough while the device is maintained in a state of suitably low enough injection.

A.2. Importance of Time at Elevated Temperature to Facilitate Expansion of $H^0$ Autogeneration Regions and Effective Hydrogenation As described above, once a given region has established the conditions necessary for the autogeneration of $H^0$, provided the supply of monatomic hydrogen and the conditions of low injection are maintained, this region can be expanded to other areas to enhance the hydrogen passivation by holding the wafer at an elevated temperature of at least 50° C. and preferably above 100° C. This process can in fact occur even at room temperature although the diffusivity of the hydrogen at such temperatures is too low to be practical in manufacturing. The most useful temperature range for this process is therefore 100-450° C., above which the thermal generation of $H^0$ is sufficient to therefore not need the autogeneration of $H^0$ by the hydrogen. The higher the temperature within this usable range the faster the process. For example, provided there is sufficient supply of monatomic hydrogen, significant impact of the quality of the hydrogen passivation can be achieved through this process if applied for a period of at least 1 second if the temperature is approaching 400° C. and preferably for at least 10 seconds if the temperature is in the vicinity of 350° C. and 100 seconds if the temperature is below 300° C. and preferably at least 1000 seconds if the temperature is below 200° C. Each of these time periods for each temperature range can of course be extended to further enhance the effectiveness of the hydrogen passivation.

A.3. Application of the Process of Autogeneration of $H^0$ to n-Type Wafers

The same process of autogeneration of $H^0$ can apply in principle also in n-type silicon, both in an n-type emitter for a p-type cell or in the n-type wafer of an n-type cell. For example, if a n-type wafer doping of 1e16 atoms/cm3 is used, then EF is well above $H^{(+/-)}$ and therefore any neutrally charged hydrogen entering region X of the wafer will naturally be converted to $H^-$ in accordance with the predictions by Herring. In this instance, the atom of hydrogen is effectively taking an electron from the CB and therefore acting as an acceptor atom as this is basically equivalent to adding a hole to the VB. This shifts EF in the direction of $H^{(+/-)}$. This process can continue with the continued flow of monatomic interstitial hydrogen into region X until EF is again pinned to $H^{(+/-)}$ in a similar way as happens with p-type silicon if sufficient hydrogen is present. This again triggers the process of enhanced generation of $H^0$ with all additional atomic hydrogen in region X in excess of that necessary to achieve $H^{(+/-)}$, being converted in roughly equal proportions into $H^+$ and $H^-$ (i.e. roughly half as donors and half as acceptors) which therefore does not affect $H^{(+/-)}$ but simultaneously creates the conditions necessary for maximising the $H^0$ fraction. The $H^0$ is therefore able to relatively easily diffuse into adjacent regions Y as in the p-type case, leading again to the expansion of the regions for autogeneration of $H^0$. It should be noted that, just as in the p-type case, when the monatomic hydrogen concentration that has gone into a region is less than the total number of n-type dopants in that same region, the neutral hydrogen atoms can either receive an electron from the CB to produce an $H^-$ interstitial atom or it can bond or neutralise or passivate a positively charged n-type dopant atom substitutionally bonded within the silicon lattice. In both cases the hydrogen atom is acting as an acceptor to remove an electron from the CB (or equivalently add a hole to the VB) and therefore both cases are electronically equivalent and are therefore considered as equivalent from the perspective of this disclosure.

A.4. Application of the Process of Autogeneration of $H^0$ to Regions of Crystallographic Defects Such as Grain Boundaries The same process of autogeneration of $H^0$ can be particularly effective when applied to crystallographically defected regions which are very common in multicrystalline silicon wafers. This is partly because such regions tend to be the source of most of the device's recombination and therefore the regions most in need of hydrogen passivation, but also because such regions tend to have the highest diffusivities for any foreign interstitial atoms such as hydrogen and are therefore regions where it is relatively easy to get large amounts of hydrogen to pass through. In fact it is relatively easy for dielectrics containing hydrogen to release their monatomic hydrogen atoms into such crystallographically defected regions because the high associated diffusivities keep the hydrogen concentrations relatively low therefore establishing a higher concentration gradient between such regions and the hydrogen containing dielectric therefore facilitating higher diffusive flow from the dielectric into the defected region. In this way, such crystallographically defected regions resulting from grain boundaries, dislocations, dangling bonds, microcracks, etc. act as sinks for the hydrogen, therefore magnifying the release of the atomic hydrogen into these sinks from the dielectric.

Hydrogen travelling along such defects will again have diffusivities varying enormously with charge state, with $H^0$ having much higher diffusivity than either $H^+$ or $H^-$. If such crystallographic defects are in p-type silicon, then hydrogen will naturally convert to $H^+$, again acting as a donor and contributing to shifting EF towards $H^{(+/-)}$. Eventually, with sufficient hydrogen within or in the vicinity of the defect, provided a reasonably low injection level is maintained, $H^{(+/-)}$ is reached and the autogeneration of $H^0$ commences. Additional hydrogen beyond this accentuates the generation of $H^0$ in the same way as described above except with even higher diffusivities due to the crystallographically defected regions. With the higher flow of monatomic hydrogen into these regions, it is therefore easier (than within non defected crystalline silicon) to reach the conditions necessary for the autogeneration of $H^0$ (i.e. atomic hydrogen concentration exceeding the localised background doping in the vicinity of the defect) and the rate of hydrogen passivation can accordingly be greatly enhanced where it is most needed. The same constraints as listed previously however apply with regard to requiring low injection level (such as determined by an appropriately low illumination level) as well as the same benefits achieved through the use of elevated temperatures to further enhance the diffusivity. In fact the diffusivities within regions such as grain boundaries are enhanced to such an extent when combined with the autogeneration of $H^0$ that the atomic hydrogen, provided there is sufficient hydrogen supply, is able to pass right through the silicon wafer in significant quantities in a matter of minutes at temperatures well below 300° C. This is able to greatly enhance the effectiveness of the hydrogen passivation of crystallographic defects through the entire wafer thickness.

A.5. Application of the Process of Autogeneration of $H^0$ for Enhanced Hydrogenation in the Field and at Room (Non-Elevated) Temperature Provided the atomic hydrogen concentration within a region of the silicon exceeds the background doping concentration, the autogeneration of $H^0$ will potentially take place at any temperature although as previously described, its effectiveness in subsequently hydrogen passivating defects is greatly enhanced at elevated temperatures. However, even at room temperature or outside air temperature or operating temperature of photovoltaic modules in the field, the autogeneration of $H^0$ will take place provided the previously explained conditions regarding atomic hydrogen concentration and injection level are satisfied. This makes it possible to still use the autogeneration of $H^0$ to effectively hydrogen passivate various forms of recombination within semiconductor devices such as solar cells even at room or outside air temperatures provided long enough time-frames in the order of days, months and even years are available to compensate for the low diffusivities of the $H^0$ at such low temperatures. Such hydrogen passivation can therefore be carried out via the autogeneration of $H^0$ in the field on a continuous basis, but will be most effective when the injection levels are low such as when the solar panels are not illuminated with light or not forward biased by external power sources. Modules designed and manufactured according to this criteria that capitalise on the autogeneration of $H^0$, are referred to as self-repairing modules. Such self-repairing modules are a good example of the use of this invention based on hydrogen's autogeneration of $H^0$.

A.6. Application of the Process of Autogeneration of $H^0$ for Enhanced Hydrogenation in p-Type PERC Cells Although the described concept of autogeneration of $H^0$ is easily applied to hydrogen entering the rear p-type surface of the PERC cell in FIG. 3 (that is passivated typically by an $AlO_X$ dielectric and $SiN_X$ hydrogen containing capping layer), any regions regardless of polarity, can be similarly affected, initially by interstitial hydrogen counter-doping the dominant dopant in the respective region and eventually through autogeneration of $H^0$ if the interstitial hydrogen becomes comparable or even exceeds (preferably by at least 10%) the localised background doping of the silicon region and perhaps even nearby regions. For example, the top surface of the p-type silicon wafer forming the PERC cell in FIG. 1 is heavily doped n-type with a layer typically less than 1 μm thick. Interstitial monatomic hydrogen entering this n-type surface from the top surface $SiN_X$ layer naturally takes on the $H^-$ charge state, therefore acting as an acceptor to counter-dope this n-type region, equivalently to the way the $H^+$ atoms counter-doped the p-type silicon at the rear. Normally this n-type surface is much more heavily doped than the wafer, preventing the interstitial hydrogen from reaching the high concentrations necessary to completely counter-dope the front surface emitter region. However, this interstitial hydrogen penetrating from the top surface emitter into the p-type silicon still has the same impact in initially counter-doping the p-type dopants and then eventually autogenerating $H^0$ as in the p-type regions towards the rear, if the interstitial hydrogen concentration increases sufficiently to significantly exceed the localised wafer p-type doping.

It should be noted that a well designed and implemented hydrogenation process can naturally feed sufficient hydrogen into the rear and/or front p-type surfaces to take various regions of the p-type silicon wafer and/or emitter through the counter-doping stages to achieve the autogeneration of $H^0$. It is also possible for the equivalent hydrogenation process to be implemented progressively during device fabrication, comprising multiple processes at elevated temperatures (above room temperature) so that in combination the wafers or even finished devices are taken through the described evolutionary processes that eventually lead the device (or partly processed device) into having one or more localised regions within which the hydrogen concentration exceeds the localised doping concentration (where the referred to doping concentration does not include the doping contribution of the interstitial monatomic hydrogen acting as dopant atoms).

To test whether the hydrogenation processes being used during device fabrication are consistent with this invention (whereby they are able to achieve the high localised hydrogen concentrations that exceed the localised background doping concentrations), a simple test can be implemented on one of the partly processed devices (and is sometimes observable on finished cells prior to encapsulation) to identify the device's ability to achieve the autogeneration of $H^0$ which occurs when the localised hydrogen concentrations exceed the localised background doping concentrations. This test is done by heating the wafers to 150-200° C. while illuminating their dielectric coated surfaces with approximately 1-sun illumination (100 mW/cm$^2$) and then determining whether the $H^-$ concentration is increasing with time in accordance with autogeneration of $H^0$ by monitoring the corresponding increase in Hydrogen induced recombination (HIR). This increasing HIR in the sample can be monitored in numerous ways such as via lifetime measurements, $iV_{oc}$ values, PL measurements, etc. To identify whether a sample has already implemented this invention by already using the autogeneration of $H^0$ in its hydrogen passivation, the presence of the corresponding $H^-$ that unavoidably accompanies the $H^0$ autogeneration can be identified by observing the behaviour of the HIR it causes. This can be done by heating the wafer to above 120° C. and exposing it to either sub-bandgap photons or full spectrum illumination with about 100 mW/cm$^2$ intensity to convert the $H^-$ into $H^0$ and allowing it to disperse, thereby causing the corresponding HIR to reduce. This corresponding reduction in HIR (and $H^-$) can be similarly monitored and measured by via lifetime measurements, $iV_{oc}$ values, PL measurements, etc.

A. 7 Removing Excess Atomic Hydrogen Following Auto-Generation of $H^0$ to Reduce LID Satisfying the conditions for the autogeneration of $H^0$ whereby there is significant quantities of atomic hydrogen in excess of the background doping, inevitably leads to almost all this excess atomic hydrogen being split equally between the donor ($H^+$) and acceptor ($H^-$) states so as to retain EF at the same value. In this scenario, different forms of hydrogen are able to readily interact with electrons and holes from the conduction band respectively, thereby inducing recombination without any other species involved. For example, the $H^-$ is able to interact with holes in the VB to produce $H^0$ while the $H^0$ is able to subsequently receive an electron from the CB to reform the $H^-$ contributing to the total device recombination current. Perhaps an equally important part of this invention is therefore the subsequent implementation (or can be integrated all into a single process) of a third process (which in itself can be one or more processes) specifically aimed at getting rid of this component of recombination in the device by dispersing or eliminating the $H^-$ that was formed as a result of establishing the high hydrogen concentrations needed for the autogeneration of $H^0$. This is so that under the range of normal operating conditions for the solar cell in the field, any remaining interstitial atomic hydrogen will be in either the positive or neutral charge states which will not contribute significantly to recombination.

To eliminate the detrimental effects of the $H^-$ recombining with the minority carriers (holes), we effectively have to remove the conditions that were established for the auto-generation of $H^0$. It is important to recognize that this is just a localized phenomenon within the p-type wafer (or equivalently in an n-type region) that can occur where the hydrogen has attained concentrations well in excess of the background wafer doping concentration. To eliminate the recombination created by the $H^-$, it is necessary to eliminate the $H^-$, which requires dispersing of the hydrogen from such regions of high concentration into regions of lower concentration where the $H^-$ is effectively converted to $H^+$ and therefore the corresponding recombination is eliminated. The most effective way of achieving this dispersion is to convert the low diffusivity $H^-$ charge state into the much higher diffusivity $H^0$ charge state so that the interstitial hydrogen atoms can diffuse away from the regions of high concentration. This will happen automatically for a region if we continue the process for the autogeneration of $H^0$ but remove the source for new hydrogen atoms into that region. The following gives numerous examples of processes that can also be used following hydrogen passivation through the autogeneration of $H^0$ to reduce the subsequent HIR recombination caused by the hydrogen such as by dispersing or eliminating the interstitial $H^-$ atoms from the p-type doped silicon region and any corresponding surfaces and/or any interstitial hydrogen acting as dopants to counter-dope the background doping or nullify electrostatic effects at surfaces:

A.7.1 Example 1 (Sub-Bandgap Photons)

A silicon wafer, device or partly fabricated device that has the hydrogen concentration in one or more regions exceeding the localized doping concentration for the silicon as a result of the use of the autogeneration of $H^0$ for hydrogen passivation (in the presence of a hydrogen source such as provided by a hydrogen containing surface dielectric layer or layers deposited by PECVD), can be exposed to a source of sub-bandgap photons to convert $H^-$ into $H^0$ and thereby disperse or get rid of the $H^-$ that causes the HIR. This is most effectively done at low injection level as previously described and is done by the photons exciting an electron from each interstitial $H^-$ atom into the conduction band, therefore converting the $H^-$ atom into $H^0$. This greatly increases its diffusivity and therefore its ability to be dispersed away from such regions of high $H^-$ concentration.

This process however needs to be done at elevated temperature above 50° C. and preferably above 100° C. This is to increase the diffusivity of the resulting $H^0$ atom so that it can move away at reasonable speed from its existing location where the interstitial hydrogen concentration is high enough to maintain some of the hydrogen atoms in the negative charge state $H^-$. Even higher temperatures above 150° C. or even 200° C. will further speed up the process by further increasing the diffusivity of the $H^0$. From manufacturing perspective, even higher temperatures in the range 250-300° C. may be beneficial to increase throughput. For high throughput manufacturing, the process may even need to be sped up further by using preferably higher intensities of sub-bandgap photons as well as even higher temperatures in the range 300-400° C. and in the extreme, in the range 400-450° C.

However these increased temperatures have the disadvantage that at such high temperatures, the amount of additional interstitial hydrogen atoms diffusing into the silicon surface from external hydrogen sources may be higher, therefore potentially adding additional hydrogen that may cause recombination and therefore may also need to be dispersed or got rid of. For these reasons, temperatures in excess of 650° C. should not be used in this process and preferably below 500° C. or even 400° C.

If such high temperatures are considered important for speeding up the process in manufacturing, a subsequently reducing temperature while continuing the sub-bandgap electromagnetic radiation exposure can be beneficially used so that the majority of the H− can be dispersed quickly during the higher temperature part of the process while during the lower or gradually reducing temperature part of the process, the amount of additional hydrogen entering the silicon is greatly reduced and the remaining reduced amount of H− dispersed or got rid of in a relatively short time frame. For example, during this part of the process with sub-bandgap photon exposure, the temperature of 600° C. can be used for 30 secs followed by 30 secs at 500° C. then 30 secs at 400° C. and then 30 secs at 300° C. and then 30 secs at 200° C. and finally 30 secs at 100° C. From a practical perspective, this is more easily implemented as a gradually reducing temperature over a period of typically 3 mins as the temperature is reduced from 600° C. down to below 100° C. while the wafers are exposed to the sub-bandgap photons.

Although sub-bandgap photons in the energy range 0.6 to 1.1 eV are ideal for use in this process, photons in the broader range of 0.4 to 2 eV can still be beneficially used, particularly if higher temperatures are used that lead to significant reductions in the silicon bandgap energy. The disadvantage of using photons with energy above the bandgap of the semiconductor material (which is 1.12 eV for silicon at room temperature) is two-fold. Firstly, such photons increase the injection level (increase the carrier concentrations in the CB and VB) which tends to shift the Fermi energy closer to midgap, leading to significant amounts of the H− temporarily converting to H+ which then makes it unresponsive to the sub-bandgap photons. Secondly, photons with energy above the bandgap can be absorbed by the silicon, leaving less photons able to be absorbed by the H− atoms so as to convert them to $H^0$, particularly for H− atoms located further from the surface where the photons are entering the silicon. This can be a particular problem where the dielectric passivated p-type surface is at the rear of the device such as in a PERC cell and yet the photons are being fed into the front surface due to metal across the rear preventing such photons from being fed into the rear surface. In such cases, sub-bandgap photons are even more important so they can penetrate through the thickness of the wafer to where H− atoms are located.

The rate at which the H− atoms are converted to $H^0$ for dispersing is obviously a function of the intensity of the sub-bandgap photons. The higher the intensity (power density) of the photons, the more rapidly the H− can be dispersed although excessively high intensities have the negative effect that the rate of converting the H− to $H^0$ tends to saturate while the additional interstitial hydrogen atoms released within the dielectric layer are then available to subsequently diffuse into the silicon and cause more problems. The preferred range of intensities for the sub-bandgap photons with energy in the range of 0.6 to 1.1 eV is 1-1,000 mW/cm². However intensities for such photons in the range of 0.1 mW/cm² to 10,000 mW/cm² can also beneficially be used.

A.7.2 Example 2 (Auto-Generation of $H^0$)

A silicon wafer, device or partly fabricated device that has the hydrogen concentration in one or more regions exceeding the localized doping concentration for the silicon as a result of the autogeneration of $H^0$ hydrogen passivation process (such as in the presence of a hydrogen source provided by a hydrogen containing surface dielectric layer or layers deposited by PECVD), will naturally have its EF determined by the interstitial hydrogen atoms acting as dopants. Once this EF $H^{(+/-)}$ is achieved (that is compatible with the donor and acceptor energy levels determined by the bonding arrangements and energy levels of the respective electrons), as explained previously, any additional interstitial atomic hydrogen not required for achieving this EF will have these additional or excess interstitial hydrogen atoms with roughly equal concentrations of both H+ and H− so as not to affect EF. It should be noted that in this scenario, the H+ atoms are acting as 'donor' dopants contributing its electron(s) to the conduction band (CB) while the H− atoms are acting as 'acceptor' atoms, removing electrons from the CB or equivalently adding holes to the valence band (VB). Therefore, even though in this autogeneration of $H^0$ passivation process it is of significant benefit for the hydrogen passivation to have localized regions where the interstitial hydrogen concentration exceeds the background doping concentration, there are also negative consequences. These arise from the light (or low) net n-type doping created by the hydrogen, that results in the co-existence of H− and relatively high concentrations of holes (compared to conventional n-type doped regions) in the valence band in this region which then increases the interaction and recombination (HIR) between the holes and the H− atoms. Another solution to solving this problem of HIR is to continue to use the autogeneration of $H^0$ in such regions to deplete the local atomic hydrogen concentration and therefore eliminate the associated HIR. However this needs to be done while simultaneously removing the source or sources of new atomic hydrogen dissociating from molecules or entering such regions that would otherwise replenish the hydrogen and therefore continue or even create additional HIR. Ceasing the hydrogen supply involves either turning it off such as in the case of a plasma generated source of atomic hydrogen or else reducing the temperature to reduce the thermal release of atomic hydrogen from hydrogen containing dielectric layers on the surfaces of the wafer or device. For these regions, temperatures for this part of the process for eliminating the HIR need to be kept below about 450° C. and preferably below 400° C. and advantageously below 300° C. In fact the best results are achieved for temperatures in the range of 100° C. to 200° C. but with the disadvantage that the times required are prohibitively long for manufacturing purposes. Higher temperatures above 200° C. and preferably 300° C. are therefore probably necessary for shortening the process, but with some reduction in the effectiveness of the elimination of HIR. From a manufacturing perspective, even higher temperatures above 300° C. or even 350° C. may be beneficial to increase throughput although with the disadvantage that at such high temperatures, the amount of additional interstitial hydrogen atoms diffusing into the silicon surface from external hydrogen sources may be higher, therefore potentially adding additional hydrogen that may cause recombination and therefore may also need to be dispersed or got rid of. For these reasons, temperatures in excess of 600° C. should not be used in this process and preferably below 500° C. or even 450° C.

If such high temperatures in excess of 500° C. are considered important for speeding up the process, a subsequently reducing temperature can be beneficially used so that the majority of the H− can be dispersed quickly during the higher temperature part of the process while during the lower or gradually reducing temperature part of the process, the amount of additional hydrogen entering the silicon is greatly reduced and the remaining reduced amount of H$^-$ dispersed or got rid of in a relatively short time frame. For example, during this part of the autogeneration of H$^0$ and dispersal process, the temperature of 600° C. can be used for 30 secs followed by 30 secs at 500° C. then 30 secs at 400° C. and then 30 secs at 300° C. and finally 30 secs at 200° C. From a practical perspective, this is more easily implemented as a gradually reducing temperature over a period of typically 3-4 mins as the temperature is reduced from 700° C. down to below 200° C. while the wafers are kept in the dark. This achieves essentially the same outcome.

In other words, whenever the conditions exist in a localised region whereby there is excess interstitial hydrogen atoms compared to background dopants that allow the generation of significant quantities of H$^0$, H$^+$ and H$^-$, there is inevitably a corresponding increase in HIR. In this scenario, H$^0$ is the 'high-mobility' state for interstitial hydrogen atoms with diffusivities many orders of magnitude higher than for the other charge states. Never-the-less, this diffusivity is still very temperature dependent, necessitating temperatures of at least 100° C. and preferably above 200° C. for the H$^0$ to be able to move a reasonable distance before being returned to one of the other low mobility charge states. The aim in this part of the process is therefore to use sufficiently high temperatures so that this autogeneration of H$^0$ can lead to its dispersal in a reasonable time period that therefore brings down the localised atomic hydrogen concentration sufficiently to eliminate the significant presence of H$^-$ that can cause HIR. The mechanism of dispersal is that as the H$^0$ atoms are auto generated as described, they move a distance determined by their diffusivity (which in turn is determined by their temperature) such that if in their new position the interstitial hydrogen concentration is no longer high enough for the interstitial hydrogen atoms to be determining the net doping concentration (and hence EF) then the auto generation of the H$^0$ no longer applies and the hydrogen atom is able to remain in a low mobility charge state in that location with minimal H$^-$ and therefore minimal contribution to recombination and minimal further movement of that hydrogen atom. If however in the new location the interstitial hydrogen concentration still exceeds that necessary for the hydrogen atom dopants to determine the net doping, then the autogeneration of H$^0$ will continue in this new location and the H$^0$ will continue to be dispersed until reaching locations where the autogeneration of H$^0$ is no longer taking place in which case the H$^-$ concentration will also be minimized as the silicon returns to having a net p-type doping concentration. This is of great importance to the present invention since this 'auto generation' of H$^0$ is providing an important mechanism for getting rid of the surplus H$^-$ from such regions that are causing this form of HIR (recombination between the H$^-$ and the holes).

A.7.3 Example 3 (Thermal Generation of H$^0$)

This example differs from examples 1 and 2 in that it only requires the thermal generation of H$^0$ to facilitate the dispersal of interstitial hydrogen from regions of high concentration. It therefore does not require the use of sub-bandgap photons nor the very high concentrations of interstitial hydrogen needed for the autogeneration of H$^0$. At higher temperatures, the doped silicon naturally behaves more like intrinsic silicon with much higher fractions of the interstitial hydrogen atoms in the neutral charge state H$^0$ with corresponding higher diffusivities. This is partly due to the increased fractions of H$^0$ as a result of changes in EF but also due to the increase in atomic hydrogen as bound hydrogen is released from molecules or bonds with boron.

The disadvantage again though is that at such higher temperatures, additional atoms of hydrogen continue to be released within the hydrogen containing surface dielectric layers and then diffuse into the silicon, potentially increasing the concentrations of hydrogen atoms needing to be dispersed. For these reasons, it may be beneficial to use this approach in combination with different hydrogen sources for the hydrogen passivation process whereby the hydrogen source can be independently turned off such as with a plasma generated source of atomic hydrogen atoms. For the H$^-$ dispersal process in this example, the thermal generation of H$^0$ needs to be done at elevated temperatures above 300° C. for n-type and preferably above 400° C. or even 500° C. for p-type and even n-type so as to increase the concentrations of H$^0$ atoms so that they can move away at a reasonable rate from existing locations where the interstitial hydrogen concentration is high enough to maintain some of them in the negative charge state H$^-$.

Even higher temperatures above 600° C. or even 650° C. will further speed up the process by further increasing the thermal generation of H$^0$ but may start to cause some defects already passivated by hydrogen to be reactivated as the hydrogen is released from its bond, so preferably, temperatures below 600° C. and ideally below 500° C. should be used. From a manufacturing perspective, even higher temperatures above 700° C. or even 750° C. may be beneficial to increase throughput although with the disadvantage that at such high temperatures, the amount of additional interstitial hydrogen atoms diffusing into the silicon surface from external hydrogen sources may be higher, therefore potentially adding additional hydrogen that may cause recombination and therefore may also need to be dispersed or got rid of. For these reasons, temperatures in excess of 1000° C. should not be used in this process and preferably below 900° C. or even 800° C.

If such high temperatures approaching 700° C. or above are considered important for speeding up the process, a subsequently reducing temperature can be beneficially used so that the majority of the H$^-$ can be dispersed quickly during the higher temperature part of the process while during the lower or gradually reducing temperature part of the process, the amount of additional hydrogen entering the silicon is greatly reduced and the remaining reduced amount of H$^-$ dispersed or got rid of in a relatively short time frame. For example, during this part of the thermal-generation of H$^0$ and dispersal process, the temperature of 1000° C. can be used for 10 secs followed by 10 secs at 900° C. then 10 secs at 800° C. and then 20 secs at 700° C. and then 30 secs at 600° C. and finally 60 secs or longer at 500° C. before further cooling is implemented with less importance on rate.

An important benefit of this approach over examples 1 and 2 is that even with higher injection levels or other conditions that may cause EF to depart from H$^{(+/-)}$, the localised atoms of hydrogens can still be thermally converted to H$^0$ and dissipated or dispersed away from the region in a way not easily achieved in the previous examples.

A.7.4 Example 4 (Electric Fields)

Another example of how the H$^-$ can be dispersed to regions where it no longer causes recombination following the autogeneration of H$^0$ is to apply an electric field to the silicon and hence a force on the H$^-$ atoms causing them to move. Although their mobility (or diffusivity) is much lower than that of atoms with the neutral hydrogen charge state $H^0$, the $H^0$ atoms do not have any force exerted on them by an applied electric field while the $H^-$ does. Therefore although a slow process due to the poor diffusivity of the $H^-$ atoms, the $H^-$ atoms do slowly move in response to the applied force and eventually move to a location where the interstitial hydrogen concentration is low enough that HIR is no longer a problem and is no longer responsible for contributing to the total dark saturation current or recombination in the device. Any bonded or non-charged hydrogen does not respond to such an applied electric field in terms of moving to another location.

An example of how to apply such an electric field to implement the hydrogen dispersal process as part of this invention to the cell of FIG. 3 is to use an external power supply to forward bias the finished solar cell by making electrical contact to both the front (negative) and rear (positive) contacts. This application of the external electric field causes current to flow through the solar cell even without illumination in the forward bias direction, but simultaneously applies the electric field (force) to the mobile $H^-$ causing it to move. This process can be accelerated by increasing the applied electric field to increase the current flow and corresponding force on the charged interstitial hydrogen atoms. This however also has a negative consequence of increasing the injection level in the active regions of the device whereby the increased carrier concentrations, particularly the increased minority carrier concentrations, cause EF to try and shift towards the midgap (halfway between the Conduction and Valence bands) for the silicon, therefore causing some of the $H^-$ to convert to $H^+$, and therefore in the process acting as double donors to try and again shift EF back away from the midgap and back towards where it was located in equilibrium (at low injection level). The problem with this is that it temporarily gets rid of the $H^-$ from such regions, but only for the period while the device is at the higher injection level, potentially leading to the $H^+$ converting back to $H^-$ when the power supply is removed (or its current reduced) and the device is returned to its lower injection level. This approach at higher currents may therefore not necessarily lead to the shifting or dispersing of most of the $H^-$ to a region or regions where it no longer creates recombination although should at least still lead to some smaller amount of movement of the $H^+$ in response to the electric field. Again, a potentially more effective variation for implementing this part of the invention could be by initially using a higher applied electric field (and therefore higher current) as described in the forward biased direction to shift most of the interstitial hydrogen atoms from the regions where they exceed the local doping concentration followed by the use of a reduced electric field with lower currents. The latter with lower injection levels for the active parts of the device allow the hydrogen atoms the opportunity to return to the $H^-$ charge state wherever the local concentrations still exceed the background p-type doping. This allows the remaining smaller amounts of $H^-$ to be shifted to less damaging regions in a way that is not possible at higher applied electric fields with higher injection levels.

A.7.5 Example 5 (Transients)

Following the autogeneration of $H^0$ hydrogenation process, many of the preceding examples use techniques for controlling or changing the charge state of the interstitial hydrogen atoms for the purpose of improving the diffusivity of the hydrogen atoms to help relocate or disperse them to areas of lower concentration where they cause less recombination and damage. A particularly powerful approach for aiding several of the above mentioned techniques is to use transient responses where the conditions such as the injection level for the device that can determine the hydrogen charge state, is rapidly changed and then changed back again to bring about the desired transitions in the hydrogen charge state. For example, if there is a region of the device where some of the interstitial hydrogen still resides as $H^-$ at the end of the hydrogenation process such as in an n-type region, short pulses of illumination with sub-bandgap photons can be used to convert some of the $H^-$ into $H^0$ and even $H^+$ by exciting the electrons into the CB. At the end of each pulse, when the sub-bandgap illumination ceases, some of the interstitial hydrogen that was originally $H^-$, is able to relax or decay back to the preferred $H^-$ charge state for the prevailing conditions. Any transitions in charge state for the interstitial hydrogen atoms always involve the neutral (high diffusivity) charge state $H^0$ which makes the frequent use of transitions valuable for allowing the hydrogen to move (diffuse) throughout the device. For example, even the most extreme transitions from $H^-$ to $H^+$ or the reverse, naturally involves transitioning through the preferred $H^0$ state with the highest diffusivity. Such pulses can vary in duration from 1 µs to many seconds depending on the intensity of photons used and the number of hydrogen atoms needing to transition in charge state. Similarly, the off period between pulses can vary enormously in duration from 1 µs to many seconds although ideally, maximising the number of transitions in the hydrogen charge state is in general beneficial for speeding up the dispersal or passivation processes. Frequencies for the pulses approaching 1 GHz can therefore potentially be valuable although frequencies below 100 KHz are often used to ensure sufficient hydrogen during the off period for the photon illumination exists to facilitate a significant amount transitioning back to its original $H^-$ state. Frequencies below 1 Hz can also be used but tends to increase the overall time required for the process. It should be noted that these transient effects can also be used to enhance the hydrogen passivation of defects and contaminants as well as for dispersing the hydrogen to reduce recombination. This is because in general, the $H^0$ charge state has both the highest diffusivity as well as the highest reactivity and since it is by far the most difficult to produce and least stable charge state, it is also the most desirable and effective one to keep generating. Despite this, it has been shown that some types of defects (recombination), particularly ones that are charged with a specific polarity, need a particular charge state for the hydrogen atom to allow bonding and hence passivation to take place. This can therefore mean that in some devices and material types, all three charge states can be required for most effective passivation, therefore further adding importance to the use of transient effects that can be used to naturally and readily produce the various charge states.

In addition to transient effects introduced through the pulsing of the sub-bandgap photons, any of the approaches used in the above examples for controlling the charge states for the interstitial hydrogen atoms can in principle be modified to capitalise on the benefits offered through transient responses. For example, a common approach for controlling the hydrogen charge state is by changing the injection level (carrier concentrations) so as to effectively shift the Fermi level that controls the charge state distribution. This can be done by illumination or through changing the terminal voltage or both. These injection level changes can also be done by pulsing or by rapidly varying in either direction the light intensity or terminal voltage to produce transient effects, provided sufficient time is allowed following the rapid variations to facilitate the changes in carrier concentrations and corresponding changes in hydrogen charge state, for each such change in either illumination level or terminal voltage. Thermal variations can also in principle be used to produce beneficial transient effects although the times involved for the changes are much longer and the variations much smaller in relative magnitude. Variations or transient effects in the use of electric fields (such as in conjunction with example 4) can also be used for a range of benefits, again both in relation to shifting the hydrogen around to reduce recombination but also in enhancing the reactivity and ability of the hydrogen to passivate defects. For example, in a solar cell made from p-type silicon with the interstitial hydrogen still exceeding that of the p-type dopants at the completion of the hydrogen passivation using the autogeneration of $H^0$ concept in at least one region, it is possible for approaching half of all the hydrogen in that region to still be in the negative charge state and contributing to HIR. However to try and shift this $H^-$ using an applied electric field, the device needs to be forward biased which causes current to flow and the injection level to change. This unfortunately will tend to change the hydrogen charge state to $H^+$, therefore reversing the direction the hydrogen atom moves. To avoid this, transients can be used. A high intensity pulse (large electric field) can be applied for a short duration while the hydrogen is still $H^-$. It typically takes many ms or even up to a second for the $H^-$ to respond to the changed injection level, allowing the strong electric field to apply significant force to the $H^-$ for this period. The applied electric field is then removed for the period that the hydrogen atom is in the positive charge state, allowing the injection level to reduce back down and the H to convert back to $H^-$. The next pulse is then applied and the process continually repeated. The frequency of such pulses can be anywhere from about 1 Hz (for pulse durations approaching 1 sec) to 1 MHz where the applied pulses are less than 1 µs. The preferred duration of pulses however is from 0.5 ms to 500 ms with corresponding frequencies for the pulses of typically 2 Hz to 1 kHz since the off-time in general to allow the decay in the injection level needs be much less than the time for which the pulse is applied.

A.8 Removal of Residual Hydrogen Neutralising Dopant Atoms

Following the completion of the hydrogen passivation process through the autogeneration of $H^0$ and the subsequent elimination of $H^-$ causing HIR, it can be beneficial to also remove or relocate remaining hydrogen from regions where it is acting (or could dissociate) to counter-dope the background dopants, particularly if in such regions there are recombination sites such as crystallographic defects. This is because the counterdoping acts to increase the minority carrier concentrations which therefore can lead to damaging recombination. Examples of how to shift, get rid of or relocate such atomic hydrogen to reduce recombination are as follows:

A.8.1 Example 6 (Electric Fields to Shift Charged Hydrogen from the Surfaces with Optional Sub-Band Gap Photons)

Following hydrogenation and dispersal of $H^-$ causing HIR in a p-type wafer, the $H^+$ (acting as donor atoms) can be driven out of the silicon or to less harmful regions of the silicon where its counter-doping of the local dopants is causing less recombination. This can be done in various ways such as at the surface of the silicon through the use of a corona discharge or other form of deposition of positive electrostatic charge onto the surface of the dielectric or through the application of a sufficiently strong electric field, to apply sufficient force onto the mobile $H^+$ charge to cause it to move. However to speed up this process, sufficient positive charge can be applied to the dielectric surface to introduce sufficient bending of the conduction band at the surface of the semiconductor to give a localised Fermi level above $H^{(+/-)}$ that will therefore lead to some or even most of the $H^+$ at the surface converting to $H^-$ and $H^0$. The $H^0$ will naturally diffuse away from the surface more easily, while the presence of the $H^-$ allows the simultaneous use of sub-bandgap photons (similarly to in example 2) to subsequently convert the $H^-$ also into the high diffusivity neutral charge state $H^0$ that will allow it to move away from the surface region where it is damaging the effective surface passivation.

A.8.2 Example 7 (Thermal Generation of $H^0$ to Shift Charged Hydrogen from the Surfaces or Other Regions where there has been HIR)

This example differs from example 6 in that it only requires the thermal generation of $H^0$ to facilitate the dispersal of interstitial hydrogen from regions where the $H^+$ is counter-doping the p-type surface or bulk. This is because a thermal process can be used to do multiple things such as thermal breaking boron-hydrogen bonds to reactivate the boron and free the hydrogen, increasing the dissociation of molecular hydrogen into atomic hydrogen and increasing the neutral charge state fraction of the hydrogen to allow more rapid dispersal. It therefore does not require the use of electrostatic charge or sub-bandgap photons. At higher temperatures, doped silicon of either polarity naturally behaves more like intrinsic silicon with much higher fractions of the interstitial hydrogen atoms in the neutral charge state $H^0$ with corresponding higher diffusivities.

The disadvantage again though is that at such higher temperatures, additional atoms of hydrogen may continue to be released within the hydrogen containing surface dielectric layers (if present) and then diffuse into the silicon, potentially increasing the concentrations of hydrogen atoms needing to be dispersed. However, the hydrogen concentration and volumes responsible for counter-doping of the silicon are relatively small compared to those used for the autogeneration of $H^0$, enabling the thermal process for its dispersing or elimination to be quite short or at lower temperature and therefore able to minimise the flow of additional hydrogen from the dielectric.

For the $H^+$ dispersal process in this example, the thermal generation of $H_0$ needs to be done at elevated temperature above 250° C. and preferably above 300° C. to increase the concentrations of $H^0$ atoms so that they can move away from the surface at reasonable rate. Even higher temperatures above 350° C. or even 400° C. will further speed up the process by further increasing the thermal generation of $H_0$. From a manufacturing perspective, even higher temperatures above 500° C. or even 600° C. may be beneficial to increase throughput although with the disadvantage that at such high temperatures, the amount of additional interstitial hydrogen atoms diffusing into the silicon surface from external hydrogen sources may be higher, therefore potentially adding additional hydrogen that may cause counter-doping in bad areas and even HIR recombination and therefore may also need to be dispersed or got rid of. For these reasons, temperatures in excess of 700° C. should not be used in this process and preferably below 600° C. or even 500° C. If such high temperatures above 500° C. are considered important for speeding up the process, a subsequently reducing temperature can be beneficially used so that the majority of the $H^+$ can be dispersed quickly during the higher temperature part of the process while during the lower or gradually reducing temperature part of the process, the amount of additional hydrogen entering the silicon is greatly reduced and the remaining reduced amount of $H^+$ dispersed or got rid of in a relatively short time frame. For example, during this part of the thermal-generation of $H^0$ and dispersal process for $H^+$, the temperature of 600° C. can be used for 10 secs followed by 30 secs at 500° C. then 3 mins at 400° C. and then 3 mins at 300° C. before further cooling.

B. Generation of Neutral Atomic Hydrogen Using Sub-Bandgap Photons

This concept exposes the silicon to photons with energy ($E_{ph}$) less than the bandgap ($E_g$) of silicon but enough to excite an electron from interstitial negatively charged $H^-$ atoms into the conduction band, therefore converting the $H^-$ atom into $H^0$ which can have very important benefits for passivating defects and contaminants within the silicon. For such a process it is therefore beneficial to have large concentrations of $H^-$. The same technique can be used for removing the accumulated hydrogen from the vulnerable sites containing high concentrations of $H^-$ where it may be causing hydrogen induced recombination (HIR) or hydrogen induced series resistance (HISR) commonly seen at the surfaces and contact interfaces, to the sites of low hydrogen concentration. The rate of diffusion for neutral hydrogen atoms is higher than charged hydrogen atoms in silicon material. Therefore, the newly generated neutral hydrogen atoms can easily diffuse to other regions of low hydrogen concentrations.

Referring now to FIG. 7 there is shown a flow diagram 700 of a method for processing a PV device in accordance with embodiments. At step 702, at least a portion of the device is exposed to photons with an energy lower than the bandgap of silicon at the at least one of the doped silicon regions in a manner such that at least a portion of charged hydrogen atoms become neutral hydrogen atoms and the concentration of atomic hydrogen atoms within the at least one of the doped regions drops below the doping concentration of that region. Further, at step 704, the temperature of the at least one of the doped silicon regions is maintained above 80° C. and hydrogen migrates out of the at least one of the doped silicon regions.

This technique is particularly important for n-type wafers and in n-type regions of p-type devices where the majority of the atomic hydrogen is in the negative charge state $H^-$. Sub bandgap photons can therefore be used to clear large stores of $H^-$ which can be trapped in n-type regions, by converting the $H^-$ to $H^0$ so that it can diffuse away or throughout the device to regions of lower concentration for improved passivation or to reduce future HIR.

In some embodiments, sub-bandgap photons are used in conjunction with auto-generation of $H^-$. Auto-generation of $H^-$ is particularly valuable and effective in p-type silicon where it is normally near impossible to form $H^-$ according to FIG. 3. To achieve auto generation of $H^-$, high concentrations of atomic hydrogen act as a dopant to shift EF to its preferred value a little above mid-gap at which approximately 50% of all atomic hydrogen exceeding the background doping concentration will be in the negative charge state $H^-$, even if the intentional background doping is p-type.

This is referred to as the auto-generation of $H^-$ by the hydrogen, since without the doping abilities of the atomic hydrogen, it is essentially impossible to generate significant levels of $H^-$ in p-type silicon. This is a new concept introduced through this patent disclosure and can apply to localised volumes of silicon of either polarity and of any background doping concentration provided the sufficiently high hydrogen conditions are maintained. These conditions include the provision of sufficient hydrogen into the silicon to counter-dope the localised intentional background doping so that it no longer determines the net doping and therefore the EF, while simultaneously maintaining a low enough injection level to prevent the shifting of EF to a value below $H^{(+/-)}$ which would cause a shift in favour of more $H^+$ and less $H^-$.

According to the inventors, combining the auto generation of $H^-$ with the use of sub bandgap photons greatly improves the hydrogen passivation process. Once one or more regions have established the necessary conditions for auto-generation, these regions can be expanded to other areas to enhance the hydrogen passivation by holding the wafer at a temperature of at least 50° C. and advantageously above 100° C. while using sub-bandgap photons to convert some of the $H^-$ into $H^0$ to allow it to diffuse to adjacent regions of lower hydrogen concentration where the $H^0$ can convert back to $H^+$, therefore acting as a donor to raise EF towards that necessary for the autogeneration of $H^-$. This is done preferably while maintaining the supply of hydrogen into the regions already auto-generating $H^-$ such as the surfaces of the wafer or at the extremities of lightly doped regions or in the vicinity of crystallographic defects such as grain-boundaries etc. Under these conditions, the $H^0$ from a region X where the $H^0$ is formed from the absorption of a sub-bandgap photons by the auto-generated $H^-$, is able to diffuse into an adjacent region Y where the concentration of monatomic hydrogen is too low to achieve EF of $H^{(+/-)}$ needed for the auto-generation of $H^-$. For example, if region Y is p-type doped with EF below midgap, then the $H^0$ flowing into this region will be converted preferentially to $H^+$ and in so doing, releases its electron into the conduction band as the hydrogen acts as a donor atom. This shifts EF towards $H^{(+/-)}$. As $H^0$ continues to flow into Y from X, as long as EF remains below $H^{(+/-)}$ then the $H^0$ continues to preferentially act as donor atoms, shifting EF closer and closer towards $H^{(+/-)}$ until it reaches $H^{(+/-)}$. Under these conditions, the auto-generation of $H^-$ is considered to commence an expansion of region X. This process can continue, leading the regions of auto-generation of $H^-$ to expand across the entire device or semiconductor layer provided illumination by sub-bandgap photons continues and sufficient hydrogen is supplied and the temperature is maintained high enough and for long enough while the device is maintained in a state of suitably low enough injection.

The combined method of application of autogeneration of $H^-$ and sub-bandgap photons can be used in p-type PERC cells to achieve enhanced hydrogen passivation. Although the described concept of auto-generation of $H^-$ is easily applied to hydrogen entering the rear p-type surface of the PERC cell in (that is passivated typically by an $AlO_X$ dielectric and $SiN_X$ hydrogen containing capping layer), any regions regardless of polarity, can be similarly affected, initially by interstitial atomic hydrogen counter-doping the dominant (or background) dopant in the respective region and eventually through auto-generation of $H^-$ if the hydrogen becomes comparable or even exceeds (preferably by at least 10%) the localised background doping of the silicon region and perhaps even nearby regions. For example, the top surface of the p-type silicon wafer forming the PERC cell is heavily doped n-type with a layer typically less than 1 µm thick. Interstitial monatomic hydrogen entering this n-type surface from the top surface $SiN_X$ layer naturally takes on the $H^-$ charge state, therefore acting as an acceptor to counter-dope this n-type region, equivalently to the way the $H^+$ atoms counter-doped the p-type silicon at the rear. Normally this n-type surface is much more heavily doped than the wafer, preventing the interstitial hydrogen from reaching the high concentrations necessary to completely counter-dope the front surface emitter region. However, this interstitial hydrogen, when exposed to the sub-bandgap photons, accelerates its penetration from the top surface emitter into the p-type silicon where it still has the same impact in initially counter-doping the p-type dopants and then eventually with sufficient hydrogen, pushing the localised EF towards the $H^{(+/-)}$ level where auto-generation of $H^-$ occurs, just as in the p-type regions towards the rear. Again the requirement is simply that there needs to be sufficient atomic hydrogen concentration in the relevant region or regions for it to become comparable to or even exceed the localised wafer p-type doping. Additional atomic hydrogen beyond this is then beneficial to significantly increase the $H^-$ concentration in such regions, making the subsequent or simultaneous exposure to sub-bandgap more effective in producing larger quantities of $H^0$ to enhance the hydrogen passivation and/or disperse the accumulation of atomic hydrogen.

A well designed and implemented hydrogenation process will naturally feed sufficient hydrogen into the rear and/or front p-type surfaces to take various regions of the p-type silicon wafer and/or emitter through the counter-doping stages to achieve the autogeneration of $H^-$. It is also possible for the equivalent hydrogenation process to be implemented progressively during device fabrication, comprising multiple processes at elevated temperatures (above room temperature) so that in combination the wafers or even finished devices are taken through the described evolutionary processes that eventually lead the device (or partly processed device) into having one or more localised regions within which the hydrogen concentration exceeds the localised doping concentration (where the referred to doping concentration does not include the doping contribution of the interstitial monatomic hydrogen acting as dopant atoms).

To test whether the hydrogenation processes being used during device fabrication are consistent with this aspect of the invention (whereby they are able to achieve the high localised hydrogen concentrations that exceed the localised background doping concentrations), a simple test can be implemented on one of the partly processed devices (and is sometimes observable on finished cells prior to encapsulation) to identify the device's ability to achieve the auto-generation of $H^-$ which occurs when the localised hydrogen concentrations exceed the localised background doping concentrations. This test is done by heating the wafers to 150° C. to 200° C. while illuminating their dielectric coated surfaces with approximately 1-sun illumination (100 mW/cm²) and then determining whether the $H^-$ concentration is increasing with time in accordance with auto-generation of $H^-$ by monitoring the corresponding increase in Hydrogen induced recombination (HIR). This increasing HIR in the sample can be monitored in numerous ways such as via lifetime measurements, $iV_{oc}$ values, PL measurements, etc. To identify whether a sample has already implemented the auto-generation of $H^-$ in its processing, the presence of the corresponding $H^-$ that has resulted from establishing the conditions for the $H^-$ auto-generation can be identified by observing the behaviour of the HIR it inevitably causes. This can be done by heating the wafer to 120° C. to 150° C. and exposing it to either sub-bandgap photons or full spectrum illumination with about 100 mW/cm² intensity to convert the $H^-$ into $H^0$ and allowing it to disperse, thereby causing the corresponding HIR to reduce. This corresponding reduction in HIR (and $H^-$) can be similarly monitored and measured via lifetime measurements, $iV_{oc}$ values, and PL measurements etc. It should be noted that satisfying the conditions for the autogeneration of $H^-$ whereby there is significant quantities of atomic hydrogen in excess of the background doping, inevitably leads to almost all this excess atomic hydrogen being split equally between the donor ($H^+$) and acceptor ($H^-$) states so as to retain EF at approximately the same value in the vicinity of $H^{(+/-)}$. The $H^-$ however is able to contribute significantly to the total device recombination current by interacting with the minority carrier holes in the VB.

In embodiments, the use of sub-bandgap photons can be used in conjunction with autogeneration of $H^-$ and a third step that allows minimising recombination in the device by dispersing or eliminating the $H^-$ that was formed as a result of establishing the high hydrogen concentrations needed for the auto-generation of $H^-$. This is so that under the range of normal operating conditions for the solar cell in the field, any remaining interstitial atomic hydrogen will be in either the positive or neutral charge states which will not contribute significantly to recombination.

To eliminate the detrimental effects of the $H^-$ recombining with the minority carriers (holes), the conditions that were established for the auto-generation of $H^-$ have to be reversed. It is important to recognize that this is just a localized phenomenon within the p-type wafer (or equivalently in an n-type region) that occurs where the interstitial hydrogen atoms have attained concentrations well in excess of the background wafer doping concentration. To eliminate the recombination created by the $H^-$, it is necessary to eliminate the $H^-$ which requires dispersing of the hydrogen from such regions of high concentration into regions of lower concentration where the $H^-$ is effectively converted to $H^+$ and therefore the corresponding recombination is eliminated. The most effective way of achieving this dispersion is to use the sub-bandgap photons to convert the low diffusivity $H^-$ charge state into the much higher diffusivity $H^0$ charge state so that the interstitial hydrogen atoms can diffuse away from the regions of high concentration. This will happen automatically for a region if we continue the process for the auto-generation of $H^-$ but remove the source for new hydrogen atoms into that region.

B.1. Use of n-Type Regions for Increasing $H^-$ Concentrations for Subsequent Exposure to Sub-Bandgap Photons to Generate $H^0$ for Improved Hydrogen Passivation A 1-2 ohm-cm p-type silicon wafer has one or both of its surfaces diffused with phosphorus to provide n-type surface(s) to the silicon wafer with a junction depth of typically 0.3 µm. Atomic hydrogen is then released into the n-type surface layer from a PECVD deposited surface dielectric layer such as SiNx:H or AlOx:H or stack of dielectric layers with at least one containing hydrogen, by heating the wafer to typically 700-900° C. for several seconds. The n-type surface layer or layers ensure that most of the atomic hydrogen entering the semiconductor is in the negative charge state H⁻ to facilitate subsequent exposure to sub-bandgap photons to convert a fraction of the H⁻ repeatedly into H⁰. As described, this can greatly enhance the reactivity and diffusivity of the atomic hydrogen, increasing its ability to move throughout the semiconductor and just as importantly, increase its effectiveness in passivating defects and contaminants.

In embodiments, this type of cell design or structure is that it can be used to create an internal source of atomic hydrogen within the n-type layer or layers. This internal source of H⁻ can effectively be stored for years within heavily doped n-type regions of the silicon at room temperature or operating temperatures for PV modules in the field and then gradually exposed to the sub-bandgap photons in the solar spectrum over a period of 10-20 years or even longer while the photovoltaic cells or modules are operating in the field. In this scenario, large amounts of atomic hydrogen are fed into the n-type layer or layers during cell manufacture where they can then reside as H⁻ with a very low diffusivity that can allow them to remain virtually in the same position for many years at the temperatures that photovoltaic modules are exposed to in the field during operation or even storage. The sun's spectrum fortuitously contains a low concentration of sub-bandgap photons within the required energy range to be able to penetrate deep enough into the silicon but still have sufficient energy to convert some of the H⁻ atoms into H⁰ at a slow rate. This facilitates hydrogen passivation of existing or new defects within the solar cells in real time in the field. This concept is called the 'self-repairing' solar cell or PV module.

A variation of this approach is to apply an electric field or static charge to the surface of the silicon to bend the energy bands so as to effectively transform a p-type surface into behaving the same as if it was n-type with the local EF in equilibrium shifted to above midgap. This again allows any atomic hydrogen within this region to be converted to H⁻ in the same way as if it was an n-type layer and therefore get the same benefits as above by exposing the silicon and H⁻ atoms to sub-bandgap photons to convert some or all of the H⁻ to H⁰ and to potentially do it repeatedly. Again this is beneficially done at elevated temperatures. Such electric field can be applied through the application of positive static charge from a corona discharge onto the surface dielectric layers or through the application of an external electric field.

B.2. Use of n-Type Wafers for Increased F Concentrations Throughout the Wafer A limitation of the approach in B.1 is that the device design employs only a very small percentage of its silicon material as doped n-type silicon that can contain and retain potentially large concentrations of H⁻. In fact in typical PERC solar cells shown in FIG. 4, the percentage of the silicon that has net background doping that is n-type, is well below 1%. To overcome this limitation, the use of n-type wafers doped above 1e13 atoms/cm³ and preferably above 1e14 atoms/cm³ and ideally above 1e15 atoms/cm³, allows H⁻ to be formed throughout virtually all the silicon material except in a very small volume that may be deliberately doped p-type. In fact in heterojunction devices, it is possible to retain the entire n-type wafer as n-type and therefore able to retain H⁻ in the entire volume. In any of these scenarios using n-type wafers, the atomic hydrogen still needs to be fed into the wafer via the surfaces where the concentrations can be many orders of magnitude higher than the average atomic hydrogen concentration throughout the entire wafer. The hydrogen sources can include ion implantation of hydrogen ions or equivalent, or can again be gaseous hydrogen sources, or plasma-based sources containing hydrogen ions, or solutions containing hydrogen ions, or even hydrogen containing surface layers on the silicon wafer such as could be deposited by PECVD with layers such as hydrogenated silicon nitride, hydrogenated silicon oxynitride, hydrogenated silicon dioxide, hydrogenated aluminium oxide etc.

Subsequent exposure of the wafer to sub-bandgap photons allows some or most of the H⁻ atoms within the silicon wafer to be converted to H⁰, thereby greatly enhancing their diffusivity and reactivity. If initially the hydrogen concentrations are much greater near the surfaces, repeated conversion of the H⁻ to H⁰ by illumination by sub-bandgap photons can allow it to diffuse a short distance before decaying back to H⁻ as determined by the n-type doping. However repeated generation of the H⁰ from the H⁻ atoms via absorption of sub-bandgap photons makes it relatively easily for the hydrogen atoms to diffuse throughout the wafer from regions of high concentration to regions of low concentration. This diffusion process can occur even at room temperature or operating temperatures in the field in a similar way as described above in forming a self-repairing module. However raising the temperature can increase the diffusivity of the H⁰ when generated by the sub-bandgap photons, allowing the H⁰ to diffuse faster and further throughout the entire n-type wafer, making it possible to passivate the total number of defects more effectively and making it possible to more uniformly improve the wafer quality. In general, when this approach is being used to either enhance the hydrogen passivation of defects and contaminants within the semiconductor or to eliminate the remaining H⁻ following hydrogenation that is contributing to the HIR, an elevated temperature of at least 50° C. is beneficial and more valuably above 100° C. and even above 150° C. to enhance the diffusivity and reactivity of the H⁰ generated by the sub-bandgap photons. If it is important to keep the processing times in the order of minutes or even less, it can be beneficial to use temperatures in excess of 200° C. and even 300° C. Temperatures in the range of 400° C. to 800° C. will provide the shortest processing times if needed for manufacturability although temperatures in excess of 700° C. will lead to relatively high levels of atomic hydrogen being continually released into the silicon (and therefore able to potentially create additional H⁻ and associated HIR) if the hydrogen sources are dielectric layers containing hydrogen. This can certainly be beneficial in the early stages of hydrogen passivation to get large concentrations of atomic hydrogen into the n-type silicon and reasonably well distributed throughout the volume of n-type silicon. However following this it is preferable to use temperatures below 500° C. to minimise additional atomic hydrogen entering the semiconductor and even below 450° C. or even 400° C. if the surface of the semiconductor has significant concentrations of crystallographic defects such as high densities of grain boundaries or dislocations that more easily lead to the release of hydrogen from the surface dielectric layers into the semiconductor material at a given temperature. It is also preferable to use temperatures below 500° C. and even 450° C. towards the end of the process to minimise the thermal reactivation of defects due to bonds with hydrogen atoms being thermally broken. As a compromise between achieving faster processes by using higher temperatures and minimising the potential negative effects of the higher temperatures, the higher temperatures can be used for a very short time of only 1 second to 30 seconds followed by a period at lower temperature below 500° C. or even below 400° C. or even a gradually reducing temperature to even lower values to make the overall passivation process and elimination of HIR most effective.

One of the most effective ways of ultimately eliminating enough of the atomic hydrogen to prevent there being too much HIR from the residual H⁻ is to maintain the illumination of the silicon by sub-bandgap photons at elevated temperature to keep converting the H⁻ to H⁰ making it relatively easy for the hydrogen to escape from the silicon wafer to convert to another form where it is no longer atomic hydrogen able to produce H⁻.

B.3. Enhanced Hydrogen Passivation Through the Auto-Generation of H⁻ and Use of Sub-Bandgap Photons Localised regions of silicon with any doping concentration or polarity can be made to receive very high atomic hydrogen concentrations that exceed the localised net background doping. This creates increased concentrations of H⁻ in such regions. This is particularly valuable and effective in p-type silicon where it is normally near impossible to form H⁻ according to FIG. 3.

This approach for producing H⁻ in silicon involves the use of the monatomic hydrogen as a dopant to shift EF to its preferred value a little above midgap at which approximately 50% of all atomic hydrogen exceeding the background doping concentration will be in the negative charge state H⁻, even if the background doping is p-type. This is referred to as the auto-generation of H⁻ by the hydrogen, since without the doping abilities of the atomic hydrogen, it is essentially impossible to generate significant levels of H⁻ in p-type silicon. As described earlier, the combination of the autogeneration of H⁻ and the use of sub-bandgap photons to convert such H⁻ into H⁰ can be used to greatly enhance the ability of the atomic hydrogen to passivate defects and contaminants in the vicinity of where the H⁰ is being generated.

In addition, in all such regions of the silicon where the H⁻ is formed by auto-generation, the silicon can be heated and illuminated by sub-bandgap photons as previously described, to convert some or all of the H⁻ into either H⁰ or H⁺ for either enhanced hydrogen passivation or elimination of HIR and/or HISR.

Once one or more regions have established the conditions necessary for the auto-generation of H⁻, these regions can be expanded to other areas to enhance the hydrogen passivation by holding the wafer at a temperature of at least 50° C. and advantageously above 100° C. in the dark (illumination level below 1 mW/cm² and advantageously below 0.1 mW/cm² and preferably below 1 ρW/cm²) while preferably maintaining the supply of hydrogen into the regions already auto-generating H⁻ such as the surfaces of the wafer or at the extremities of lightly doped regions or in the vicinity of crystallographic defects such as grain-boundaries etc. Whenever the conditions for the auto-generation of H⁻ are achieved, the additional use of the sub-bandgap photons can allow increased concentrations of H⁰ to be formed. Under these conditions, the H⁰ from a region where the H⁻ is auto-generated is able to diffuse into an adjacent region Y where the concentration of monatomic hydrogen is too low to achieve the Fermi Energy level of about $H^{(+/-)}$ needed for the auto-generation of H. If for example region Y is still p-type with EF below midgap, then it can be seen from FIG. 2 that the H⁰ flowing into this region will be converted preferentially to H⁺ and in so doing, releases its electron into the CB as the hydrogen acts as a donor atom. This shifts EF towards $H^{(+/-)}$. As H⁰ continues to flow into Y from X, as long as EF remains below $H^{(+/-)}$ then the H⁰ continues to preferentially act as donor atoms. This shifts EF closer and closer towards $H^{(+/-)}$ until it gets close enough that there is a significant presence of H⁻. Under these conditions, as referred to previously, the auto-generation of H⁻ is considered to commence, representing an expansion of region X. This process can continue, enhanced by the use of the sub-bandgap photons, leading the regions of auto-generation of H⁻ to expand across the entire device or semiconductor layer provided sufficient hydrogen is supplied and the temperature is maintained high enough and for long enough while the device is maintained in a state of suitably low enough injection. This provides enhanced hydrogen passivation throughout the entire device, although at the completion of the passivation process when the hydrogen source is removed, terminated or sufficiently reduced, it is necessary to eliminate any residual H⁻ that would otherwise cause HIR or HISR. This can again most effectively be done through illumination of the silicon by sub-bandgap photons, leading to the conversion of the H⁻ to less harmful charge states and potentially achieve reduced atomic hydrogen concentrations that are no longer able to sustain the auto-generation of H⁻ (as will be discussed in B.4).

As described above, the expansion of H⁻ auto generation regions to other areas to enhance the hydrogen passivation is carried out by holding the wafer at an elevated temperature of at least 50° C. and preferably above 100° C. This process can occur even at room temperature although the diffusivity of the hydrogen at room temperatures is too low. The most useful temperature range for this process is 100° C. to 450° C., above which the thermal generation of H⁰ is so high that there is no need of the auto-generation of H⁻ and use of sub-bandgap photons. The higher the temperature within this temperature range, the faster the expansion of H⁻ auto-generation regions. For example, provided there is sufficient supply of monatomic hydrogen, significant improvement in the hydrogen passivation can be achieved through this process if applied for a period of at least 1 second if the temperature is approaching 400° C. and preferably for at least 10 seconds if the temperature is in the vicinity of 350° C. and 100 seconds if the temperature is below 300° C. and preferably at least 1000 seconds if the temperature is below 200° C. Each of these time periods for each temperature range can be extended to further enhance the effectiveness of the hydrogen passivation.

B.4. Use of Sub-Bandgap Photons to Eliminate Excess H⁻ to Prevent HIR

A silicon wafer, device or partly fabricated device that has received a hydrogen passivation process may have residual concentrations of H⁻ in one or more regions that are able to contribute to HIR. Examples would be within n-type regions or wherever the hydrogen concentration exceeds the localized doping concentration for the silicon leading to the auto-generation of H⁻. In these cases, the silicon (and hence the H⁻) can be exposed to a source of sub-bandgap photons to convert H⁻ into H⁰ and thereby disperse or get rid of the H⁻ that causes the HIR. This is most effectively done at low injection level (to retain as much of the atomic hydrogen as possible in the negative charge state) and is done by the photons exciting an electron from each interstitial H⁻ atom into the conduction band, therefore converting the H⁻ atom into H⁰. This greatly increases its diffusivity and therefore its ability to be dispersed away from such regions of high H⁻ concentration. As previously described, elevated temperatures for the silicon will accelerate this process.

This process however needs to be done at elevated temperature above 50° C. and preferably above 100° C. This is to increase the diffusivity of the resulting $H^0$ atom so that it can move away at reasonable speed from its existing location where the interstitial hydrogen concentration is high enough to maintain some of the hydrogen atoms in the negative charge state $H^-$. Even higher temperatures above 150° C. or even 200° C. will further speed up the process by further increasing the diffusivity of the $H^0$. From a manufacturing perspective, even higher temperatures in the range 250° C. to 300° C. may be beneficial to increase throughput. For high throughput manufacturing, the process may even need to be sped up further by using preferably higher intensities of sub-bandgap photons as well as even higher temperatures in the range 300° C. to 400° C. and in the extreme, in the range 400 to 450° C.

However these increased temperatures have the disadvantage that at such high temperatures, the amount of additional interstitial hydrogen atoms diffusing into the silicon surface from external hydrogen sources may be higher, therefore potentially adding additional hydrogen that may cause recombination and therefore may also need to be dispersed or got rid of. For these reasons, temperatures in excess of 650° C. should not be used in this process and preferably below 500° C. or even 400° C.

If such high temperatures are considered important for speeding up the process in manufacturing, a subsequently reducing temperature while continuing the sub-bandgap electromagnetic radiation exposure can be beneficially used so that the majority of the $H^-$ can be dispersed quickly during the higher temperature part of the process while during the lower or gradually reducing temperature part of the process, the amount of additional hydrogen entering the silicon is greatly reduced and the remaining reduced amount of $H^-$ dispersed or got rid of in a relatively short time frame. For example, during this part of the process with sub-bandgap photon exposure, the temperature of 600° C. can be used for 30 secs followed by 30 secs at 500° C. then 30 secs at 400° C. and then 30 secs at 300° C. and then 30° C. at 200° C. and finally 30 secs at 100° C. From a practical perspective, this is more easily implemented as a gradually reducing temperature over a period of typically 3 minutes as the temperature is reduced from 600° C. down to below 100° C. while the wafers are exposed to the sub-bandgap photons.

Although sub-bandgap photons in the energy range 0.6 to 1.1 eV are ideal for use in this process, photons in the broader range of 0.4 eV to 2.3 eV can still be beneficially used, particularly if higher temperatures are used that lead to significant reductions in the silicon bandgap energy. The disadvantage of using photons with energy above the bandgap of the semiconductor material (which is 1.12 eV for silicon at room temperature) is two-fold. Firstly, such photons increase the injection level (increase the carrier concentrations in the CB and VB) which tends to shift EF closer to midgap, leading to significant amounts of the $H^-$ temporarily converting to $H^+$ which then makes it unresponsive to the sub-bandgap photons. Secondly, photons with energy above the bandgap can be absorbed by the silicon, leaving less photons able to be absorbed by the $H^-$ atoms so as to convert them to $H^0$, particularly for $H^-$ atoms located further from the surface where the photons are entering the silicon. This can be a particular problem where the dielectric passivated p-type surface is at the rear of the device such as in a PERC cell of FIG. 1 and yet the photons are being fed into the front surface due to metal across the rear preventing such photons from being fed into the rear surface. In such cases, sub-bandgap photons are even more important so they can penetrate through the thickness of the wafer to where $H^-$ atoms are located.

The rate at which the $H^-$ atoms are converted to $H^0$ for dispersing is a function of the intensity of the sub-bandgap photons. The higher the intensity (power density) of the photons, the more rapidly the $H^-$ can be dispersed although excessively high intensities have the negative effect that the rate of converting the $H^-$ to $H^0$ tends to saturate while the additional interstitial hydrogen atoms released within the dielectric layer are then available to subsequently diffuse into the silicon and cause more problems. The preferred range of intensities for the sub-bandgap photons with energy in the range of 0.6 eV to 1.1 eV is 1 mW/cm$^2$ to 1,000 mW/cm$^2$. However intensities for such photons in the range of 0.1 mW/cm$^2$ to 10,000 mW/cm$^2$ can also beneficially be used.

B.5. Use of Sub-Bandgap Photons to Create or Accelerate Transient Responses

In some embodiments of the method transient responses where the conditions such as the injection level for the device that can determine the hydrogen charge state can be used. The charge state can be rapidly changed and then changed back again to bring about the desired transitions in the hydrogen charge state. For example, if there is a region of the device where some of the interstitial hydrogen still resides as $H^-$ at the end of the hydrogenation process such as in an n-type region, short pulses of illumination with sub-bandgap photons can be used to convert some of the $H^-$ into $H^0$ and even $H^+$ by exciting the electrons into the CB. At the end of each pulse, when the sub-bandgap illumination ceases, some of the interstitial hydrogen that was originally $H^-$, is able to relax or decay back to the preferred $H^-$ charge state for the prevailing conditions. Any transitions in charge state for the interstitial hydrogen atoms always involve the neutral (high diffusivity) charge state $H^0$ which makes the frequent use of transitions valuable for allowing the hydrogen to move (diffuse) throughout the device. For example, even the most extreme transitions from $H^-$ to $H^+$ or the reverse, naturally involves transitioning through the preferred $H^0$ state that has the highest diffusivity. Such pulses can vary in duration from 1 µs to many seconds depending on the intensity of photons used and the number of hydrogen atoms needing to transition in charge state. Similarly, the off period between pulses can vary enormously in duration from 1 µs to many seconds although ideally, maximising the number of transitions in the hydrogen charge state is in general beneficial for speeding up the dispersal or passivation processes. Frequencies for the pulses approaching 1 GHz can therefore potentially be valuable although frequencies below 100 KHz are often used to ensure sufficient hydrogen during the off period for the photon illumination exists to facilitate a significant amount transitioning back to its original $H^-$ state. Frequencies below 1 Hz can also be used but tends to increase the overall time required for the process. It should be noted that these transient effects can also be used to enhance the hydrogen passivation of defects and contaminants as well as for dispersing the hydrogen to reduce recombination. This is because in general, the $H^0$ charge state has both the highest diffusivity as well as the highest reactivity and since it is by far the most difficult to produce and least stable charge state, it is also the most desirable and effective one to keep generating. Despite this, it has been shown that some types of defects (recombination), particularly ones that are charged with a specific polarity, need a particular charge state for the hydrogen atom to allow bonding and hence passivation to take place. This can therefore mean that in some devices and material types, all three charge states can be required for most effective passivation, therefore further adding importance to the use of transient effects that can be used to naturally and readily produce the various charge states.

In addition to transient effects introduced through the pulsing of the sub-bandgap photons, any of the approaches used for controlling the charge states for the interstitial hydrogen atoms can in principle be modified to capitalise on the benefits offered through transient responses. For example, a common approach for controlling the hydrogen charge state is by changing the injection level (carrier concentrations) so as to effectively shift the Fermi level that controls the charge state distribution. This can be done by illumination or through changing the terminal voltage or both. These injection level changes can also be done by pulsing or by rapidly varying in either direction the light intensity or terminal voltage to produce transient effects, provided sufficient time is allowed following the rapid variations to facilitate the changes in carrier concentrations and corresponding changes in hydrogen charge state, for each such change in either illumination level or terminal voltage. Thermal variations can also in principle be used to produce beneficial transient effects although the times involved for the changes are much longer and the variations much smaller in relative magnitude. Variations or transient effects in the use of electric fields can also be used for a range of benefits, again both in relation to shifting the hydrogen around to reduce recombination but also in enhancing the reactivity and ability of the hydrogen to passivate defects. For example, in a solar cell made from p-type silicon with the interstitial hydrogen still exceeding that of the p-type dopants at the completion of the hydrogen passivation using the auto-generation of $H^-$ concept in at least one region, it is possible for approaching half of all the hydrogen in that region to still be in the negative charge state and contributing to HIR. However to try and shift this $H^-$ using an applied electric field, the device needs to be forward biased which causes current to flow and the injection level to change. This unfortunately will tend to change the hydrogen charge state to $H^+$, therefore reversing the direction the hydrogen atom moves. To avoid this, transients can be used. A high intensity pulse (large electric field) can be applied for a short duration while the hydrogen is still $H^-$. It typically takes many ms or even up to a second for the $H^-$ to respond to the changed injection level, allowing the strong electric field to apply significant force to the $H^-$ for this period. The applied electric field is then removed for the period that the hydrogen atom is in the positive charge state, allowing the injection level to reduce back down and the $H^+$ to convert back to $H^-$. The next pulse is then applied and the process continually repeated. The frequency of such pulses can be anywhere from about 1 Hz (for pulse durations approaching 1 sec) to 1 MHz where the applied pulses are less than 1 μs. The preferred duration of pulses however is from 0.5 ms to 500 ms with corresponding frequencies for the pulses of typically 2 Hz to 1 kHz since the off-time in general to allow the decay in the injection level needs be much less than the time for which the pulse is applied.

The use of sub-bandgap photons in general can only contribute to speeding up transient responses in the direction of converting $H^-$ to either $H^0$ or $H^+$. However the slowest transition is normally the one involving the conversion of $H^-$ to $H^0$ due to the relative stability of the $H^-$ atoms. It has been reported in the literature that the time constant for this transition is many orders of magnitude longer than any of the other transitions. The use of the sub-bandgap photons can very beneficially therefore speed up this transition time by many orders of magnitude. It can therefore be combined with other approaches that in combination create the desired transient responses and transient changes in the charge state of the hydrogen atoms whereby the sub-bandgap photons control the transition in one direction.

C. Using Electric Fields to Manipulate Charged Hydrogen to Solve Contact Resistance and Hydrogen-Induced Recombination in Solar Cells In some embodiments, hydrogen can be dispersed by using electric fields, which capitalizes on the fact that interstitial hydrogen atoms can exist in silicon in three charge states: positive ($H^+$), negative ($H^-$) and neutral ($H^0$). Through the application of an electric field in the appropriate direction, charged interstitial hydrogen atoms can be manipulated to move by the force of an electric field. The neutral hydrogen will not be influenced by the electric field, but has much higher diffusivity than the charged hydrogen and so can move easily even without the electric field. This allows maximum benefit to be gained from the hydrogen passivation of defects throughout the device while minimising the increase in surface or bulk recombination through the doping effects of the hydrogen. This removal process can also be included as an integral but latter part of the hydrogen passivation process to avoid the use of separate processes or equipment.

Referring now to FIG. 8 there is shown a flow diagram 800 of a method for processing a PV device in accordance with embodiments. At step 802, at least a portion of the device is thermally treated in a manner such that, hydrogen atoms migrate towards at least one of the doped regions so that the concentration of hydrogen within the at least one of the doped regions becomes at least 10% higher than a doping concentration of that region. Further, at step 804, an electric field is applied across at least a portion of the device in a manner such that, charged hydrogen atoms are driven away, by the electric field, from the at least one of the doped silicon regions.

Step 802 is conducted such that hydrogen atoms distribute within the at least one of the doped silicon regions and step 804 is conducted such that charged hydrogen migrates out of the at least one of the doped silicon regions.

Once the concentration of hydrogen atoms has exceeded the levels desired for defect passivation in any region of a device, the application of electric fields can be employed to manipulate and shift the charged hydrogen atoms so as to enhance the hydrogen passivation of defects and contaminants. Following the hydrogen passivation process, electric fields can continue or again be used to manipulate and shift any charged excess interstitial hydrogen away from any problematic areas where the hydrogen has the potential in the present or future to deteriorate the electrical performance of the device. In summary, the shifting of hydrogen can have multiple benefits, as it can be shifted away from problematic regions to reduce the negative effects associated with the excess hydrogen (HISR and HIR), and/or moved into regions requiring larger volumes of hydrogen for enhanced defect passivation.

In general, when this embodiment is being used to either enhance the hydrogen passivation of defects and contaminants within the semiconductor or to eliminate excess concentrations of charged hydrogen contributing to HISR or HIR, an elevated temperature of at least 50° C. is beneficial and more valuably above 100° C. and even above 150° C. to enhance the diffusivity and reactivity of the hydrogen. Temperatures above 100° C. and especially 120° C. or even 150° C. are particularly beneficial to thermally break the bonds of any hydrogen atoms that are neutralising the fixed intentional dopants through bonding rather than simply compensation, thereby releasing the hydrogen so it can be shifted by the electric field. If it is important to keep the processing times in the order of minutes, it can be beneficial to use temperatures in excess of 200° C. and even 300° C. Temperatures in the range of 300° C. to 450° C. will provide the shortest processing times if needed for manufacturability although temperatures in excess of 450° C. will lead to reactivation of some defects and also relatively high levels of atomic hydrogen being continually released into the silicon (and therefore able to potentially create additional HISR and HIR) if the hydrogen sources are still present, such as from dielectric layers. In fact for the latter it is preferable to use temperatures below 450° C. to minimise additional atomic hydrogen entering the semiconductor, and even below 400° C. if the surface of the semiconductor has significant concentrations of crystallographic defects (such as high densities of grain boundaries or dislocations) that more easily lead to the release of hydrogen from the surface dielectric layers into the semiconductor material at a given temperature. It is also preferable to use temperatures below 400° C. towards the end of the process to minimise the thermal reactivation of defects due to bonds with hydrogen atoms being thermally broken. As a compromise between faster processes at higher temperatures but minimising the potential negative effects of the higher temperatures, the higher temperatures can be followed by a period at lower temperature or even a gradually reducing temperature.

Another means of speeding up the process of shifting interstitial hydrogen using electric fields is of course increase the applied electric field to increase the current flow and corresponding force on the charged interstitial hydrogen atoms. The latter however also has a negative consequence of increasing the injection level in the active regions of the device whereby the increased carrier concentrations, particularly the increased minority carrier concentrations, cause EF to try and shift towards the midgap (halfway between the Conduction and Valence bands) for the silicon. This causes some of the hydrogen to switch charge states. Although the concentrations are likely to be small, any hydrogen that changes charge state will move in the opposite direction due to the applied electric field thereby reducing the effectiveness of the desired movement, and in the case of $H^-$ shifting to $H^+$ also reduces mobility so more hydrogen may remain in the problem region. The problem with this is that it is also only a temporary conversion while the device is at the higher injection level, potentially leading to the hydrogen returning to the harmful charge state for the particular region when the power supply is removed (or its current reduced) and the device is returned to its lower injection level. This approach at higher currents may therefore not necessarily lead to the shifting or dispersing of most of the hydrogen where it is no longer problematic. Again, a potentially more effective variation for implementing this part of the invention could be by initially using a higher applied electric field (and therefore higher current) as described in the forward biased direction to shift most of the interstitial hydrogen atoms from the regions where they exceed the local doping concentration, followed by the use of a reduced electric field with lower currents. The latter with lower injection levels for the active parts of the device allows the hydrogen atoms the opportunity to return to the $H^-$ charge state wherever the local concentrations still exceed the background p-type doping. The remaining smaller amounts of $H^-$ can then be shifted to less damaging regions in a way that is not possible at higher applied electric fields with higher injection levels.

C.1. Use of Electric Fields to Move Hydrogen that is Trapped, Stored or Causing Problems in Surface Regions A typical solar cell has a hydrogen containing dielectric on top of an n-type emitter. Thermal treatment results in an influx of hydrogen into the typically heavily doped n-type emitter surface. Due to EF, almost all the atomic hydrogen will exist as $H^-$ and become trapped and stored at the surface. In PERC cell structures, a hydrogen containing dielectric also exists on the rear which provides a hydrogen source to the rear p-type surface. At this surface almost all atomic hydrogen entering the silicon exists as $H^+$ due to EF, and will become trapped and stored in a similar way. This storage of hydrogen can be intentional for further hydrogen passivation processes or unintentional and potentially result in high series resistance (including contact resistance) or surface passivation deterioration as the surface doping becomes counter-doped by the hydrogen. In any case, a forward biased electric field can be applied to the solar cell contacts to shift the mobile $H^-$ and $H^+$ hydrogen stores away from the respective n-type and p-type surfaces and contacts to deeper regions for reduction of HISR or poor surface passivation effects or enhanced hydrogen passivation. Bonded hydrogen atoms however, such as those hydrogen atoms passivating boron atoms, are less mobile and not easily influenced by the electric field. In this case it is beneficial to heat the silicon sufficiently to thermally break the bonds and therefore release the hydrogen atoms and increase their diffusivity (which is very temperature dependent) so they can then move under the influence of the applied electric field as described above for the mobile hydrogen atoms. Temperatures above 100° C. and preferably at least 150° C. or even above 220° C. can be used for this purpose. Increased temperature is also beneficial for increasing the diffusivity of the hydrogen to accelerate the process.

In addition to series resistance problems and surface passivation deterioration, a build-up of $H^-$ at the surface or any other region in the solar cell can lead to recombination losses in the form of hydrogen induced recombination (HIR). A build-up of $H^-$ can occur if the concentration of interstitial hydrogen atoms anywhere within the device is comparable or even significantly exceeds the localized doping concentration of the silicon. In this case, the H atoms act to counter-dope the silicon to bring EF to ~0.16 eV above bandgap, at which large concentrations of $H^+$ and $H^-$ can coexist. The localized accumulation of $H^-$ creates an additional component of recombination, as neutrally charged hydrogen atoms receive electrons from the conduction band to produce the negatively charged hydrogen atoms, whilst the negatively charged hydrogen atoms interact with holes to complete the recombination process by producing neutrally charged hydrogen atoms. One way to alleviate this problem is to apply an electric field to the silicon in the appropriate direction to exert a force on the $H^-$ atoms causing them to move and disperse into a region or regions of the solar cell where amount of hydrogen no longer exceeds the background doping concentration. Although their mobility (or diffusivity) is much lower than that of atoms with the neutral hydrogen charge state $H^0$, the $H^0$ atoms do not have any force exerted on them by an applied electric field while the H⁻ does. Therefore although a slow process due to the poor diffusivity of the H⁻ atoms, the H⁻ atoms do slowly move in response to the applied force and eventually move to a location where the interstitial hydrogen concentration is low enough that H⁻ is no longer sustained or generated. They therefore change to a different charge state in such locations and therefore they are no longer responsible for contributing to the total dark saturation current or recombination in the device. Any bonded or non-charged hydrogen does not respond to such an applied electric field in terms of moving to another location unless heated to a high enough temperature to break the bonds.

An example of how to apply such an electric field to implement the hydrogen dispersal process as part of this invention is to connect the positive terminal of an external power supply to the positive contact of a solar cell (rear of the device in FIG. 1) or module or string of series connected cells and the negative terminal of the same external power supply to the negative contact of the same solar cell (front of the device in FIG. 1) or module or string of series connected cells, so as to forward bias the solar cell or module or string of series connected solar cells. This results in an electric field that causes current to flow across the forward biased p-n junction of each solar cell. This process can be accelerated by increasing the applied electric field to increase the current flow and corresponding force on the charged interstitial hydrogen atoms. This however also has a negative consequence of increasing the injection level in the active regions of the device whereby the increased carrier concentrations, particularly the increased minority carrier concentrations, cause EF to try and shift towards the midgap (halfway between the conduction and valence bands) for the silicon, therefore causing some of the hydrogen to switch charge states. Although the concentrations are likely to be small, any hydrogen that changes charge state will move in the opposite direction due to the applied electric field thereby reducing the effectiveness of the desired movement, and in the case of H⁻ shifting to H⁺ also reduces mobility so more hydrogen may remain in the problem region. The problem with this is that it is also only a temporary conversion while the device is at the higher injection level, potentially leading to the hydrogen returning to the harmful charge state for the particular region when the power supply is removed (or its current reduced) and the device is returned to a lower injection level. This approach at higher currents may therefore not necessarily lead to the shifting or dispersing of most of the hydrogen to where it is no longer problematic. Again, a potentially more effective variation for implementing this invention could be by initially using a higher applied electric field (and therefore higher current) as described in the forward biased direction to shift most of the interstitial hydrogen atoms from the regions where they exceed the local doping concentration followed by the use of a reduced electric field with lower currents and therefore lower injection levels for the active parts of the device to allow the hydrogen atoms the opportunity to return to the H⁻ charge state wherever the local concentrations are still sufficiently high for the hydrogen to still be determining the local effective net doping concentration that can therefore lead to the existence of the H⁻ in the material that was previously p-type doped. This allows the remaining smaller amounts of H⁻ to be shifted to less damaging regions in a way that is not possible at higher applied electric fields with higher injection levels.

C.2 Use of Electric Fields in Conjunction with Illumination to Move Hydrogen that is Trapped Stored or Causing Problems in Surface Regions Including at Metal Contact Interfaces In a situation similar to that described in C.1., a typical solar cell has a hydrogen containing dielectric present on the front n-type emitter surface (also applicable for p-type emitters). Without charge state control, any thermal treatment causes the hydrogen to enter the silicon surface which will mostly become H⁻ due to the n-type doping (or H⁺ in a p-type emitter) which becomes trapped and builds up at the surface. This potentially causes series resistance effects, damages surface passivation and prevents hydrogen travelling deeper into the wafer bulk for passivation where needed. A quicker method than that of C.1. for shifting this hydrogen is to use illumination or increased injection level to generate significantly increased quantities of H⁰. In n-type silicon, the illumination can increase the H⁰ fraction either through the impact of the increased injection level created, or by removing an electron from H⁻ atoms through a direct photon interaction. The neutral H⁰ can quickly diffuse away due to its higher mobility and no interaction with charged species (dopants or impurities) reducing the HISR and surface passivation deterioration, while dispersing it within the bulk for improved bulk passivation.

One of the unfortunate side effects of using illumination to increase the H⁰ concentration and cause it to scatter the hydrogen, is that the atomic hydrogen can accumulate in regions shaded from the illumination by the metal contacts. For example, if the top surface emitter is n-type, H⁰ which moves to a region under the contacts will have reduced charge state control (injection level will be slightly lower than in the surrounding regions), and therefore convert back into H⁻, and also no photons to strip the electron of the H⁻ so it becomes trapped. In converting to H⁻, it acts as an acceptor, therefore counter-doping the n-type doping; and similarly in a p-type emitter it will convert back to H⁺ acting as a donor to counter-dope the p-type. In such regions, the H accumulation can effectively passivate the metal/silicon interface and cause an unwanted increase in the contact resistance. This reduction in effective doping in the vicinity of the metal/silicon interface increases the effective contact resistance since such ohmic contacts generally rely on the heavy doping to achieve conductivity. This unwanted accumulation of atomic hydrogen at the metal contacts can be solved in several ways.

One possible approach involves applying an electric field to the region where the hydrogen has accumulated in the vicinity of the metal contact. For n-type contacts, the accumulated atomic hydrogen will be H⁻ (acting as acceptors to counterdope the n-type doping) making it beneficial to apply an electric field in the direction that will drive the H− away from the metal/silicon interface towards the p-n junction. This involves applying an external electric field so as to forward bias the p-n junction and drive negative charge (including H⁻) from the n-type metal contacts towards the p-n junction. The equivalent occurs at the p-type metal contact where any atomic hydrogen will take on the positive charge state and be driven by the same applied electric field towards the junction from the other polarity of the device. In both cases, the electric field needs to be applied for sufficient time to allow the negatively or positively charged hydrogen to move sufficient distance so as to no longer interfere with the ohmic nature of the respective contact.

Any bonded or non-charged hydrogen does not respond to such an applied electric field in terms of moving to another location. In this case it is beneficial to heat the silicon sufficiently to thermally break the bonds and therefore release the hydrogen atoms so they can then move under the influence of the applied electric field as described above for the mobile hydrogen atoms. Temperatures above 100° C. and preferably at least 150° C. or even above 220° C. can be used for this purpose. As in In example C.1., further increased temperatures and currents can be used to speed the process, while being mindful of the other effects that may occur such as undoing passivation of hydrogen bound to impurities or changes in injection level and therefore altered concentrations of charge states.

C.3. Charge State Control in Combination with Electric Fields

This example pertains to any silicon solar cell with hydrogen present. Without charge state control, the concentration ratio of the various hydrogen charge states at each location will be determined by the local EF. As shown in FIG. 2, almost all hydrogen in n-type silicon will be $H^-$ and almost all hydrogen in p-type will be $H^+$. In a typical solar cell with a p-n junction, applying a forward biased electric field will therefore shift any mobile hydrogen ($H^-$ in n-type or $H^+$ in p-type) inwards away from the surfaces towards and potentially across the junction. This is beneficial for dispersing large volumes of hydrogen at the surfaces causing HISR or surface passivation issues, however there may be occasions when shifting the hydrogen in the other direction is desirable. This could be the case for example when a problematic build-up of hydrogen occurs near the junction or if it is more desirable to shift the hydrogen back towards the surfaces for future release and elimination, surface dangling bond passivation or other.

A reverse bias will not shift hydrogen significantly in quasi-neutral regions, as current flow is negligible in the p-n junction. This however can be changed through illumination which then allows the photo-generated current to flow in the opposite direction to which current would flow if the device was forward biased in the dark. This allows the charged atoms and particles in the quasi-neutral regions to experience the electric field and therefore to move, but in the opposite direction to when the device was forward biased (discussed further in C.4).

Alternatively, increasing injection level can be used to shift the EF of the silicon and convert some of the hydrogen into the minority charge states. Then, when an electric field is then applied in the same way as described previously in C.1 and C.2, the $H^+$ generated in n-type and $H^-$ generated in p-type will then move away from the junction and back towards the surfaces due to the forward bias, while any $H^0$ generated will also disperse, unaffected by the doping and electric fields.

Again, as in the previous examples increased temperature can be beneficial for increased hydrogen diffusivity, EF and charge state control, and breaking bonds to mobilise more of the hydrogen. Temperatures above 100° C. and preferably at least 150° C. or even above 220° C. can be used for this purpose. Higher temperatures and also currents, can also be used to speed the process, while being mindful of the other effects that may occur such as undoing passivation of hydrogen bound to impurities or changes in injection level and therefore altered concentrations of charge states. In this example, the latter may actually be utilized for added benefits in charge state control.

C.4. Illumination Combined with Reverse Bias Electric Field

Using an electric field to shift hydrogen within the quasi-neutral region of a silicon p-n diode or solar cell requires current to flow for charged carriers to move when subjected to the bias. Typically this requires the p-n junction to be forward biased for current to flow; current flow under reverse bias is typically negligible and could therefore not have a significant impact on the charged hydrogen. However, if a p-n junction is illuminated, the photovoltaic effect causes carriers to be generated, which can then flow when subjected to a reverse bias. In this way, if a scenario such as that in C.1 & C.2. exists, whereby large concentrations of hydrogen exist near the devices surfaces, it is possible to use hydrogen charge state control techniques in combination with a reverse bias to shift the hydrogen deeper into the silicon. High illumination or injection level changes will generate large volumes of carriers as well as convert large concentrations of hydrogen from the majority charge state into the opposite charge state (ie. generate $H^+$ in the n-type and $H^-$ in the p-type). Application of a reverse bias will then cause significant current flow that will shift this charged hydrogen away from the surfaces, deeper into the sample as $H^+$ moves toward the p-type that is negatively biased and $H^-$ moves toward the n-type that is positively biased.

Conversely, a situation may arise where a concentration of charged hydrogen exists in a region that would be beneficially shifted away from the junction toward the surfaces such as in C.3. Again illumination can be used to generate carriers and enable current to flow under reverse bias to move charged hydrogen species, however in this case the hydrogen in the p-type side needs to move toward the p-type surfaces and contacts which are negatively biased and vice versa for the n-type side. This requires that EF reflects the background doping and therefore the injection level is not too significantly increased, so that $H^+$ dominates in the p-type and $H^-$ in the n-type. A tradeoff therefore exists whereby too high illumination will result in too much hydrogen converting to the wrong charge state and therefore shifting in the undesirable direction, while too little illumination will result in too smaller current and therefore a slow process. With all such processes, elevated temperatures act to increase diffusivity to speed up such processes.

C.5. Manipulating Hydrogen in a Dielectric Using Electric Fields

Charged hydrogen atoms in a dielectric can be particularly harmful for photovoltaic devices operating in the field. The effects of such hydrogen may not present themselves for many years as the hydrogen slowly releases into the devices and takes time to build up to harmful concentrations in localised regions. It is therefore important to clear the un-bonded hydrogen from the dielectric before operation. The use of a high voltage electrode (at high voltage relative to the cell voltage) mounted adjacent to the solar cell or deposition of electrostatic or corona charge onto the dielectric layer surface can be used to help drive the charged hydrogen atoms either into the silicon from the dielectric layer or else out of the dielectric layer in the direction away from the semiconductor surface depending on the polarity of the electrode or electrostatic charge respectively and the charge states of the hydrogen atoms. $H^0$ atoms within the dielectric will be unaffected by such electric fields although this is relatively unimportant since it is always a minority charge state and further, this charge state has high diffusivity and so can be removed from the dielectric layer by diffusion at relatively low temperatures. Thermal effects can be applied either simultaneously or separately to the application of the electrostatic charge with elevated temperatures useful for increasing the diffusivity of the charged atoms or particles.

C.6. Reverse Bias to Solve Counter-Doping Near the Junction Via Direct Electric Field In example C.4, a reverse bias was applied while using illumination so that current could flow in order to manipulate and shift any charged hydrogen even in quasi-neutral regions as desired. This is a relatively slow process, as the hydrogen atoms are not subjected to any significant direct electric field.

This example applies to a scenario when the hydrogen has counterdoped the background dopants near the junction resulting in high resistivity or almost intrinsic regions. In such a situation, a reverse bias could be applied that would expand the depletion region of the junction to encompass the counterdoped regions, thereby applying a direct electric field across the problematic region so that any mobile hydrogen can be directly manipulated. This could occur for example after various hydrogenation processes, dark anneals, operation in the field or light soaking which allow hydrogen to migrate to and even across a junction. A particularly harmful scenario can arise following a large build-up of hydrogen in the junction region causing the dopants on the p-type side to be entirely counterdoped and even possibly become n-type with EF approaching the $H^{(+/-)}$ level, essentially shifting the location of the p-n junction. Wherever EF has been shifted by the hydrogen to be in the vicinity of the $H^{(+/-)}$ level, hydrogen induced recombination (HIR) can become problematic. At this point, conditions can also allow auto generation of $H^0$ whereby large quantities of $H^-$ can exist with the $H^+$, and any extra hydrogen above that required to dope to the EF $H^{(+/-)}$ has equal probability of existing as $H^+$ or $H^-$, creating a situation where hydrogen can freely change between states always passing through the neutral charge state. The relatively large concentrations of $H^0$ have much higher diffusivity and do not get affected by charged dopants, impurities or defects allowing much of the excess hydrogen above that required to cause the $H^{(+/-)}$EF to exit the problematic region relatively quickly. However, as the $H^0$ leaves the $H^{(+/-)}$ EF region, for example across the new p-n junction into the p-type base, it will quickly convert into $H^+$ and couterdope the p-type adjacent to the new junction. This process can continue and keep expanding the $H^{(+/-)}$ region, shifting the p-n junction as long as a supply of hydrogen is flowing into such a region, whether due to processing, operation in the field or otherwise.

At some point, the hydrogen entering this region can become less than that dispersing from this region due to autogeneration of $H^0$ or otherwise in which case this process will slow down and potentially stop. As the excess hydrogen (above that required to cause the $H^{(+/-)}$ Fermi level) clears out, the hydrogen induced recombination will reduce. The hydrogen existing in this region to create the $H^{(+/-)}$ level will remain and can be particularly harmful to cell performance. Under such circumstances, the dark saturation current component originating from such effectively very lightly doped regions is greatly amplified due to the increased minority carrier concentrations in the junction region. This will lead to the corresponding recombination causing deterioration in the device fill-factor due to the increase in the ideality-factor that accompanies the junction recombination. This hydrogen is also particularly difficult to shift as it is charged hydrogen with low mobility and potentially even bound to dopant atoms; under normal operation conditions this will be a very slow recovery process.

Electric fields can be beneficially used to shift the hydrogen that is essentially stuck in this harmful region. In this case, with the hydrogen counterdoping the dopants in the junction region, the silicon can be almost intrinsic or at least very high resistivity. This means applying a reverse bias to the device can cause the depletion region to expand and to cover a particularly wide region, importantly encompassing all of that containing the harmful concentrations of hydrogen, allowing a relatively strong electric field to be applied to any residual non-bonded $H^+$ to shift it away from the junction. A small amount of illumination can be used to also allow current flow so that an additional force exists for the charged hydrogen continuing to guide the hydrogen even once it has shifted from the direct influence of the electric field and into the quasi neutral regions.

As in example C.4., the reverse bias will help to move the hydrogen away from the junction region as the $H^+$ hydrogen on the p-type side moves further into the bulk of a p-type cell toward the p-type surfaces and contacts which are negatively biased and vice versa for the n-type side. This therefore again requires that the injection level is not too significantly increased, so that $H^+$ dominates in the p-type and $H^-$ in the n-type. A tradeoff therefore exists whereby too high illumination will result in too much hydrogen converting to the wrong charge state and therefore shifting in the undesirable direction, while too little illumination will result in too smaller current and therefore a slow process Again an elevated temperature of at least 50° C. is beneficial and more valuably above 100° C. and even above 150° C. to enhance the diffusivity and reactivity of the hydrogen. Temperatures above room temperature and preferentially above 100° C. and ideally above 120° C. can be further beneficial to thermally break the bonds of any hydrogen atoms that are neutralising or could neutralise the fixed intentional dopants through bonding rather than simply compensation, thereby releasing the hydrogen so it can be shifted by the electric field. If it is important to keep the processing times in the order of minutes, it can be beneficial to use temperatures in excess of 200° C. and even 300° C. Temperatures in the range of 400° C. to 800° C. will provide the shortest processing times if needed for manufacturability although temperatures in excess of 700° C. will lead to relatively high levels of atomic hydrogen being continually released into the silicon (and therefore able to potentially create additional HISR and HIR) if the hydrogen sources are still present, such as from dielectric layers. In fact for the latter it is preferable to use temperatures below 500° C. to minimise additional atomic hydrogen entering the semiconductor, and even below 400° C. if the surface of the semiconductor has significant concentrations of crystallographic defects (such as high densities of grain boundaries or dislocations) that more easily lead to the release of hydrogen from the surface dielectric layers into the semiconductor material at a given temperature. It is also preferable to use temperatures below 500° C. towards the end of the process to minimise the thermal reactivation of defects due to bonds with hydrogen atoms being thermally broken. As a compromise between faster processes at higher temperatures but minimising the potential negative effects of the higher temperatures, the higher temperatures can be followed by a period at lower temperature or even a gradually reducing temperature

C.7. Electric Fields and Hydrogen in Grain Boundaries

Grain boundaries in silicon solar cells can help to accelerate the influx of hydrogen into the device from hydrogen sources. Processes such as a dark anneal can encourage the hydrogen to then diffuse along grain boundaries or defects preferentially to diffusion without the bulk of the silicon. A side-effect of increasing the concentration of atomic hydrogen within localised regions of the GBs (or other crystallographic defects) in p-type silicon to above the background doping concentration in the GB, is that the conversion of such atomic hydrogen to $H^+$ and its impact as a donor dopant, can turn such localised regions n-type. This creates a p-n junction with the adjacent silicon that has less atomic hydrogen and remains p-type. The electric field created by this junction is somewhat unstable as the junction and electric field are effectively created by hydrogen donor dopants, which are mobile compared to normal dopants that are substitutionally bonded. Normally, such hydrogen donors have sufficiently low diffusivity at room or operating temperatures for PV devices operating in the field that their movement can be considered negligible except when the timescales are of the order of months or even years. However, with the reasonably strong electric field created by the junction formed by the hydrogen donors, there is significant force applied to the hydrogen donors that are creating the field, which causes them to slowly move, even at room temperature during periods of only days or even hours. The corresponding movement of the hydrogen donors is such as to gradually nullify or destroy the electric field created by the donors. This gradually eliminates the corresponding p-n junction by lowering the localised H donor concentrations to approximately the same as the background p-type doping concentration, therefore eliminating the n-type region formed by the $H^+$ donors and corresponding unstable p-n junction.

The trouble this causes however is that the walls of the GBs transform from being n-type with the high concentrations of $H^+$ donors to essentially intrinsic silicon as the $H^+$ concentration falls to being about the same or less than that of the background dopants. Under these circumstances, the dark saturation current component originating from such effectively very lightly doped regions in the vicinity of the GBs (or other crystallographic defects) is greatly amplified due to the increased minority carrier concentrations in what is probably the worst regions for recombination due to the defects. Due to the effective low doping, it is even possible for such regions to be automatically incorporated into the depletion region if such lightly doped regions extend to the p-n junction. This will lead to the corresponding recombination causing deterioration in the device fill-factor due to the increase in the ideality-factor that accompanies the junction recombination. Such very light effective doping in the vicinity of GBs is therefore a bad scenario for device performance.

The remaining atomic hydrogen as interstitial $H^+$, and any $H^+$ that has bonded locally in passivating the negatively charged boron atoms (that are substitutionally bonded within the silicon lattice) that are responsible for causing the very low effective net doping, therefore need to be shifted away to other regions, to allow the background dopants in or near the GBs to raise the effective net doping back to its original level prior to the concentration of atomic hydrogen increasing within the GBs. An approach for increasing the rate at which the H can be shifted away is to apply an external electric field that reverse biases the junction, causing the depletion region from the p-n junction to expand across this region of the GB where the net doping is so low and therefore allowing a relatively strong electric field to be applied to any residual non-bonded $H^+$ to shift it away from the junction and away from the GBs to regions where they cause less damage. For $H^+$ that has bonded to boron atoms while passivating (neutralising) them, the device can be beneficially simultaneously heated to above 150° C. and preferably above 200° C. to thermally break such bonds to release the $H^+$ and allow it to be shifted by the electric field.

C.8. Transients

Variations or transient effects in the use of electric fields can also be used for a range of benefits, again both in relation to shifting the hydrogen around to reduce recombination but also in enhancing the reactivity and ability of the hydrogen to passivate defects. For example, in a solar cell made from p-type silicon with the interstitial atomic hydrogen exceeding that of the p-type dopants in at least one region, it is possible for approaching half of all the hydrogen in that region to be in the negative charge state and contributing to recombination. However to try and shift this $H^-$ using an applied electric field, the device needs to be forward biased which causes current to flow and the injection level to change. This unfortunately will tend to change the hydrogen charge state to $H^+$, therefore reversing the direction the hydrogen atom moves. To avoid this, transients can be used. A high intensity pulse (large electric field) can be applied for a short duration while the hydrogen is still $H^-$. It typically takes many ms or even up to a second for the $H^-$ to respond to the changed injection level, allowing the strong electric field to apply significant force to the $H^-$ for this period. The applied electric field is then removed for the period that the hydrogen atom is in the positive charge state, allowing the injection level to reduce back down and the H to convert back to $H^-$. The next pulse is then applied and the process continually repeated. The frequency of such pulses can be anywhere from about 1 Hz (for pulse durations approaching 1 sec) to 1 MHz where the applied pulses are less than 1 µs. The preferred duration of pulses however is from 0.5 ms to 500 ms with corresponding frequencies for the pulses of typically 2 Hz to 1 kHz since the off-time in general to allow the decay in the injection level needs be much less than the time for which the pulse is applied.

C.9. Application of Electric Field During Lamination

This example allows for the application of all of the above concepts from the previous examples to be performed during the module lamination process. Such a process could include the thermal treatments for release of hydrogen from surface dielectrics or similar, or else could follow other thermal processes during cell fabrication that resulted in the release of hydrogen. Typical thermal conditions for lamination can be beneficial for shifting interstitial hydrogen, however purpose built laminators for greater control of thermal conditions as well as illumination are likely to be further beneficial. Electric fields during the lamination process can be applied by contact with cell or string interconnects or external module contacts.

C.10. Stacked Cells

Example C.9. presented a method of applying electric fields to large batches of cells by applying the electric field to series connected cells in a module during lamination. Another example of a way that electric fields could be applied to large batches of cells is to stack the cells or strings of cells. In such a stack the cells are all series connected allowing application of a bias from the top to the bottom of the stack to cause the cells to all become similarly biased.

Many solar cells or strings of solar cells or stacks of modules can be stacked on top of each other and all series (or parallel) connected so that all can be processes simultaneously using the applied external electric fields resulting from an external power supply.

D. Use of Hydrogen Sinks to Eliminate Regions of High Atomic Hydrogen Concentration Causing HIR and Hydrogen Counter-Doping at the Surface Deteriorating Surface Passivation A particularly effective way of implementing the use of thermal generation of $H^0$ to solve the problems created by the hydrogen donors (and even the HIR created by the $H^-$), is to deliberately create sinks for the hydrogen near where the problems exist, while heating the silicon. These sinks greatly lower the atomic hydrogen concentration in the vicinity of the sinks and allow monatomic hydrogen from much further distances away to diffuse towards these sinks due to the concentration gradients created.

Referring now to FIG. 9 there is shown a flow diagram 800 of a method for processing a PV device in accordance with embodiments. At step 852, at least a hydrogen sink region arranged to attract atomic hydrogen from other regions of the device is formed. Further, at step 854, at least a portion of the device is exposed to hydrogen atoms in a manner such that, hydrogen atoms migrate towards at least one of the doped regions so that the concentration of hydrogen within the at least one of the doped regions temporarily increases to be at least the same as a doping concentration of that region and, subsequently, hydrogen migrates out of the at least one of the doped silicon regions towards the hydrogen sink region to allow for the concentration of atomic hydrogen within the at least one of the doped regions to drop below the doping concentration of that region.

For example, the use of an element that forms a molten eutectic with silicon at the desired temperature can be used in local regions to create such sinks by forming localised molten regions at or above the eutectic temperature. Aluminium for example forms a eutectic with silicon at 577° C. Therefore, a sink could be created by depositing or printing aluminium so as to facilitate its contact with the rear p-type surface of a silicon wafer and then heating for several seconds to a temperature above the eutectic temperature, allowing both the simultaneously thermal generation of $H^0$ and the creation of a strategically located molten sink right across the rear of the device. This allows much of the excess monatomic hydrogen to be drawn away (or diffuse away) from the surfaces and anywhere else that its presence is causing problems such as HIR or counter-doping or even series resistance problems with the metal/silicon interfaces.

In a preferred implementation, localised molten sink regions can be strategically formed across the rear surface of the wafer by first coating the rear p-type surface of the wafer with a dielectric layer, locally patterning the dielectric layer such as with a laser to locally expose the silicon surface and then depositing a layer of aluminium (or other material that forms molten regions at the interface with the silicon at the desired temperature) onto the dielectric layer whereby it also contacts the exposed localised regions of p-type silicon.

Upon heating to a temperature above the eutectic temperature for several seconds, thermal generation of $H^0$ and the creation of strategically located localised molten sinks across the rear of the device occur simultaneously, facilitating the diffusion of excess atomic hydrogen from regions of high concentration to these sinks. This has been shown suitable for eliminating most HIR throughout the device as well as for solving any contact resistance problems created by hydrogen accumulating at the metal/silicon interfaces. However, although periods of time above the eutectic temperature from 1 to 1,000 seconds have been shown capable of solving these problems created by excess atomic hydrogen, 2 to 100 seconds is a preferred range since less than 2 seconds leaves insufficient time for most of the hydrogen to diffuse to the sinks while durations of above 100 seconds can lead to damage to the device due to some defects being reactivated at such temperatures. For these reasons, durations of 3 to 10 seconds above the eutectic temperature are ideal.

Another example of creating a sink would be to use a localised heat source such as a laser to melt the silicon surface in one or more localised regions where the sink is to be formed. With such a localised heat source, the average temperature for the wafer can be separately set to the preferred value within the range 300° C. to 900° C. for the desired period while the localised heat source can be independently but simultaneously applied to create the localised sink for hydrogen by locally heating the silicon to above 1400° C. at which temperature it melts. Advantageously, such a hydrogen sink created through melting the silicon can be created intermittently such as through the use of a pulsed or Q-switched laser so that the silicon only remains molten for a small percentage of time. This remains effective since the local atomic hydrogen concentration is reduced to virtually zero each time the silicon becomes molten, then increases gradually while the silicon is solid and hydrogen diffuses into the region from surrounding areas where the atomic hydrogen concentration is too high. Each laser pulse then repeats this cycle, allowing the atomic hydrogen to be continually diffusing into this sink, even though it may be molten for less than 1% of the time. For example, a frequency doubled Nd-YAG laser operating at 532 nm and with Q-switching frequency of 100 kHz, can keep the silicon molten for 10-100 ns with each pulse, meaning that the silicon is only molten for 0.1-1% of the time, yet still creating a continuous sink for the hydrogen.

It is preferable for such sinks to only be effective as hydrogen sinks during the period when the atomic hydrogen concentration is to be reduced and not during the period of time that the hydrogen passivation is taking place when it is advantageous to have higher concentrations of atomic hydrogen. If however it is necessary for simplicity or cost to have the sinks present while the hydrogen passivation is taking place, a compromise that can still be quite effective is to substantially increase the atomic hydrogen supply into the device to still raise the atomic hydrogen concentrations in most regions of the device despite the presence of the sinks that act to lower the hydrogen concentration. For example, if PECVD deposited dielectric layers on the surface or surfaces of a silicon wafer are the source or sources of hydrogen atoms for the hydrogen passivation, then during the hydrogen passivation the temperature can be raised to higher values than would normally be used such as above 700° C. or even above 800° C. or ideally above 900° C. so as to greatly increase the amount of atomic hydrogen diffused into the wafer for the hydrogen passivation. The temperature can be maintained above this predetermined elevated temperature for at least 1 second to ensure good hydrogen passivation and preferably for at least 5 seconds or even 20 seconds, but not for longer than 5 minutes or the hydrogen source can be exhausted. The temperature can then be reduced such as to below 700° C. or even below 600° C. so as to reduce the flow of hydrogen into the silicon to then allow the sinks to be effective at greatly reducing the atomic hydrogen concentrations throughout the device. Temperatures within the range of 400° C. to 700° C. can be particularly effective for lowering the hydrogen concentration within the silicon depending on the temperature dependence of the hydrogen sinks.

In general, heating the silicon to at least 300° C. in n-type silicon and at least 400° C. in p-type silicon is necessary to achieve sufficient diffusivity for the atomic hydrogen such as by generating sufficient $H^0$. The hydrogen sinks can then be effective at greatly lowering the atomic hydrogen concentration in the vicinity of the sinks and allow monatomic hydrogen from much further distances away to diffuse towards these sinks due to the concentration gradients created. In its simplest implementation, such a sink could be created across the entire rear surface of the device although alternatively, localised sinks throughout the device could be created to achieve similar outcomes.

Another type of sink could be the creation of a region of extremely high defect density whereby as atomic hydrogen diffuses into the region to passivate the defects, the defect density is so high as to prevent stable passivation by the atomic hydrogen. In this case, the defects act as a catalyst to allow the atomic hydrogen to convert to molecular hydrogen and therefore cease to be able to contribute to recombination in the active regions of the device. In so doing, this creates a sink for the atomic hydrogen by reducing the localised atomic hydrogen concentration to virtually zero. Again, elevated temperatures as described above are required to increase the diffusivity of the atomic hydrogen.

It should be recognised, that on occasions, the creation of such hydrogen sinks could also create regions of high recombination that degrade device performance. In such situations, it can be advantageous to heavily dope the silicon in the region of the hydrogen sink so as to block the flow of minority carriers (electrons in p-type regions or holes in n-type regions) into the sink while still facilitating the flow of atomic hydrogen into the sink at elevated temperatures. This can also be viewed as locating the sinks for the hydrogen atoms within localised heavily doped regions that contribute little to the total device recombination or dark saturation current.

The creation of the sinks for the atomic hydrogen can also be used in conjunction with a range of techniques suitable for increasing the diffusivity of the hydrogen atoms and therefore their ability to diffuse to the hydrogen sinks. Such techniques include heating the device to increase hydrogen diffusivity, use of sub-bandgap photons to convert $H^-$ into $H^0$, increasing the injection level through illumination or electric field application to increase the concentrations of the minority charge states for the atomic hydrogen and in particular the neutral charge state which has highest diffusivity, etc.

E. Use of Crystallographic Defects to Eliminate Regions of High Atomic Hydrogen Concentration Causing HIR and Hydrogen Counter-Doping at the Surface Deteriorating Surface Passivation In a similar manner as described for hydrogen sinks, crystallographic defects can also be used like a sink for atomic hydrogen to attract atomic hydrogen. Once the hydrogen containing dielectrics have been heated to high temperature to thermally release atoms of hydrogen within the dielectric, these crystallographic defects adjacent to the dielectric layer(s) such as at the surface of the silicon where it interfaces to the dielectric, then act as sinks or regions where the hydrogen has high diffusivities so as to accelerate the rate at which the atomic hydrogen can diffuse from the dielectric into the wafer surface and deeper into the wafer. This can significantly increase the rate and total amount of hydrogen released from the dielectric into the silicon and therefore significantly enhance the quality of hydrogen passivation within the silicon. This still benefits from being at higher temperature preferably above 300° C. and probably ideally at 400° C. to 450° C. for best hydrogen passivation. Temperatures above this can also be used to speed it all up so that the process only takes 10 to 1,000 seconds, but passivated defects can tend to be reactivated at temperatures above 450° C. to 500° C. and so the quality of hydrogen passivation deteriorates. However, following passivation, large concentrations of residual atomic hydrogen can remain that can cause HIR, or counterdope the silicon to cause HISR or deterioration of surface passivation. Similar to the sinks in section D., the crystallographic defects can also be used as sinks to remove the problematic residual hydrogen. Referring now to FIG. 10 there is shown a flow diagram 860 of a method for processing a PV device in accordance with embodiments. At step 862, a region in the silicon comprising a concentration of crystallographic defects higher than an average concentration of crystallographic defects of a silicon wafer used to manufacture the photovoltaic device is formed; the region being arranged to attract atomic hydrogen from other regions of the device including from dielectric layers acting as hydrogen sources. Further, at step 864, at least a portion of the device is exposed to hydrogen atoms in a manner such that, hydrogen atoms migrate towards at least one of the doped regions so that the concentration of hydrogen within the at least one of the doped regions temporarily increases to be at least the same as a doping concentration of that region and, subsequently, hydrogen migrates out of the at least one of the doped silicon regions towards the region comprising a concentration of crystallographic defects higher than an average concentration of crystallographic defects to allow for the concentration of atomic hydrogen within the at least one of the doped regions to drop below the doping concentration of that region.

Wafers or silicon layers can be deliberately formed with smaller grains and therefore higher densities of grain boundaries to enhance both of these effects, namely to firstly, help drain more hydrogen out of dielectric layers and into the silicon and secondly, to help drain hydrogen out of regions of the doped silicon with high residual hydrogen concentrations. Also, wafer surfaces can be deliberately roughened or damaged either chemically (such as texturing or roughening the surface), thermally (thermal gradients and/or thermal expansion mismatch etc.), optically (such as with a laser) or mechanically (such as mechanical abrasion or bending of the wafer) to increase the densities of crystallographic defects to also enhance this effect. Surface layers on the silicon can also be used to create stresses within the silicon surface that cause dislocations and other forms of crystallographic defects for this purpose. Wafers can even be grown in such a way as to cause increased stress within the solidifying silicon that creates crystallographic defects that can be used in this invention. Causing damage to the silicon through various forms of crystallographic defects (that would normally degrade performance) to enhance the hydrogenation that then ultimately leads the device overall to perform better (by passivating defects and recombination throughout the entire device) was a surprising result obtained by the Applicants.

Following hydrogenation and dispersal of any $H^-$ causing HIR in a p-type wafer, the remaining $H^+$ atoms (acting as donor atoms to counter-dope the p-type silicon) near the surfaces or other crystallographic defects such as grain boundaries, need to be stably bonded, driven out of the silicon or to less harmful regions of the silicon where its counter-doping of the local dopants will cause less recombination. This can be done in various ways such as at the surface of the silicon through the use of a corona discharge or other form of deposition of positive electrostatic charge onto the surface of the dielectric or through the application of a sufficiently strong electric field, to apply sufficient force onto the mobile $H^+$ charge to cause it to move. However to speed up this process, sufficient positive charge can be applied to the dielectric surface to introduce sufficient bending of the conduction band at the surface of the semiconductor to give a localised EF above $H^{(+/-)}$ that will therefore lead to some or even most of the atomic $H^+$ that remains at the surface converting to $H^-$ and $H^0$. The $H^0$ will naturally diffuse away from the surface more easily, while the presence of the $H^-$ allows the simultaneous use of sub-bandgap photons (similarly to previous examples) to subsequently convert the $H^-$ also into the high diffusivity neutral charge state $H^0$ that will allow it to move away from the surface region where it is damaging the effective surface passivation.

Bonded hydrogen atoms however, such as those hydrogen atoms in molecules or passivating the boron atoms, are less mobile and not easily influenced by either the electric fields or the sub-bandgap photons. For these it is beneficial to heat the silicon sufficiently to thermally break the bonds and therefore release the hydrogen atoms that can then move under the influence of the applied electric field as described above for the mobile hydrogen atoms. Temperatures above 100° C. or even 120° C. are necessary to release such hydrogen atoms while above 150° C. will give a better result and preferably at least 180° C. or even above 220° C. can be used for this purpose. The releasing of the hydrogen atoms can be aided by the application of an electric field or positive electrostatic charge onto the dielectric that bends the conduction band (shifts EF upwards) to make $H^-$ the preferred charge state and therefore be repelled by the negatively charged boron atoms previously passivated by the hydrogen. This can also be beneficially used in conjunction with the sub-bandgap photons that then convert the $H^-$ into $H^0$ to allow its rapid dispersion. This is an effective way of eliminating the counter-doping of the p-type silicon by the atomic hydrogen donors $H^+$, particularly in surface regions.

In the vicinity of grain boundaries (GBs) and other crystallographic defects, although the same counter-doping problems are created by the atomic hydrogen as at the surfaces, it is not possible to use many of the above techniques to solve the counter-doping problem as they are only applicable at the surfaces that are accessible. The problem again occurs when sufficiently high concentrations of $H^+$ donors exist in such regions to locally convert the silicon essentially into intrinsic silicon as the $H^+$ concentration becomes about the same or a little less than that of the background p-type dopants. Under these circumstances, the dark saturation current component originating from such effectively very lightly doped regions in the vicinity of the GBs (or other crystallographic defects) is greatly amplified due to the increased minority carrier concentrations in what is probably the worst regions for recombination due to the defects. It is even possible for such regions, due to the effective low doping, to be automatically incorporated into the depletion region if such lightly doped regions extend to the p-n junction. This will lead the corresponding recombination to cause deterioration in the device fill-factor due to an increase in the ideality-factor that accompanies the junction recombination. Such very light effective doping in the vicinity of GBs is therefore a bad scenario for device performance.

The remaining atomic hydrogen is $H^+$ and any $H^+$ that has bonded locally in passivating the negatively charged boron atoms (that are substitutionally bonded within the silicon lattice) which are therefore responsible for causing the very low effective net doping, or $H_2$ that could dissociate and counterdope, therefore need to be shifted away to other regions to allow the background dopants in or near the GBs to raise the effective net doping back to its original level prior to the concentration of atomic hydrogen increasing within the GBs. An approach for increasing the rate at which the $H^+$ can be shifted away is to apply an external electric field that reverse biases the junction, causing the depletion region from the p-n junction to expand across this region of the GB where the net doping is so low and therefore allowing a relatively strong electric field to be applied to any residual non-bonded $H^+$ to shift it away from the junction and away from the GBs to regions where they cause less damage. For H that has bonded to another hydrogen atom or boron atoms while passivating (neutralising) them, the device can be beneficially simultaneously heated to above 100° C. or even 120° C. as previously described with above 150° C. being more suitable and preferably above 180° C. and even 220° C. to quickly thermally break such bonds to release the $H^+$ and allow it to be shifted by the electric field. Alternatively, raising the injection level (such as via illumination or forward biasing the junction using an externally applied electric field) while heating the silicon (to above 150° C. and preferably above 200° C. to thermally break the hydrogen bonds) allows the released H atoms to be converted to another charge state (particularly $H^0$) and therefore escape from its respective bond and be shifted to another location where the counter-doping is less of a problem.

F. Other Methods

F.1. Draining Dielectric Layers of Atomic Hydrogen to Minimise Future LID

During a high temperature thermal process above 600° C., a silicon solar cell with a surface dielectric layer or layers containing hydrogen can accumulate relatively large concentrations of atomic hydrogen within the dielectric as the hydrogen atoms are released from their bonds. Some of this hydrogen beneficially diffuses into the silicon device at such temperatures and has been shown to be capable of passivating various defects. However at the end of the thermal process, residual atomic hydrogen within the dielectric remains dormant, yet still relatively mobile and able to slowly diffuse into the silicon surface over long periods of time under the normal illuminated operating conditions for solar cells in the field, such as when operating at temperatures within the range of 40° C. to 70° C. This atomic hydrogen diffusing (or being driven by electrostatic forces or electric fields) into the silicon can cause increased recombination as previously described. This is often described as light-induced degradation (LID) and is particularly prevalent in multicrystalline (mc) PERC solar cells due to the crystallographic defects such as GBs making it easier for the atomic hydrogen to diffuse from the dielectric layer and into the silicon.

To prevent this happening in the field, it is beneficial to heat the solar cells to at least 150° C. for a period of many hours to speed up the diffusion of this atomic hydrogen out of the dielectric layer(s). Raising this temperature to at least 200° C. will accelerate the process allowing it to be effective in less than an hour although longer times will more completely drain the interstitial atomic hydrogen from the dielectrics and therefore give greater immunity to LID. Raising this temperature further to at least 250° C. can enable the process of draining the dielectric layers to take place reasonably effectively in only 2-5 minutes although 5-10 minutes are preferable and above 10 minutes are beneficial for greater immunity to LID. Temperatures above 300° C. can also be used to further speed up the process although temperatures above 450° C. appear to create additional problems through thermally releasing additional atomic hydrogen within the dielectric layers that can later diffuse into the silicon and create problems.

Following the thermal treatment above, minimal atomic hydrogen should remain within the dielectric layers and the problem of disposing of any residual atomic hydrogen shifts to the silicon material where the hydrogen concentration can increase to sufficiently high levels in localised regions where its concentration exceeds the background doping concentrations, therefore establishing the conditions that can cause HIR. This is particularly the case where the silicon surface is lightly doped such as for the rear surface of the PERC structure shown in FIG. 1, allowing the atomic hydrogen diffusing in from the dielectric layer to easily counter-dope the existing background dopants. Many examples have already been provided as to how this HIR can be eliminated. However for typical solar cell structures with heavily doped n-type surface layers (emitters) such as shown in the front surface of the PERC cell in FIG. 1, the atomic hydrogen entering the n-type layer during the above thermal process (that was designed to drain the dielectric of atomic hydrogen), goes into the negative charge state with low diffusivity and effectively gets trapped within the n-type layer. This is exacerbated by the typical doping profiles for such n-type diffused layers whose doping gradient establishes an electric field that makes it difficult for $H^-$ to move towards the junction (and p-type wafer bulk). Such $H^-$ therefore tends to remain trapped until either the cell is illuminated to allow the $H^-$ to be converted to $H^0$ or an electric field is applied to drive the $H^-$ in the desired direction or the injection level is increased to help control the charge state of the $H^-$ atoms.

Figure 11:
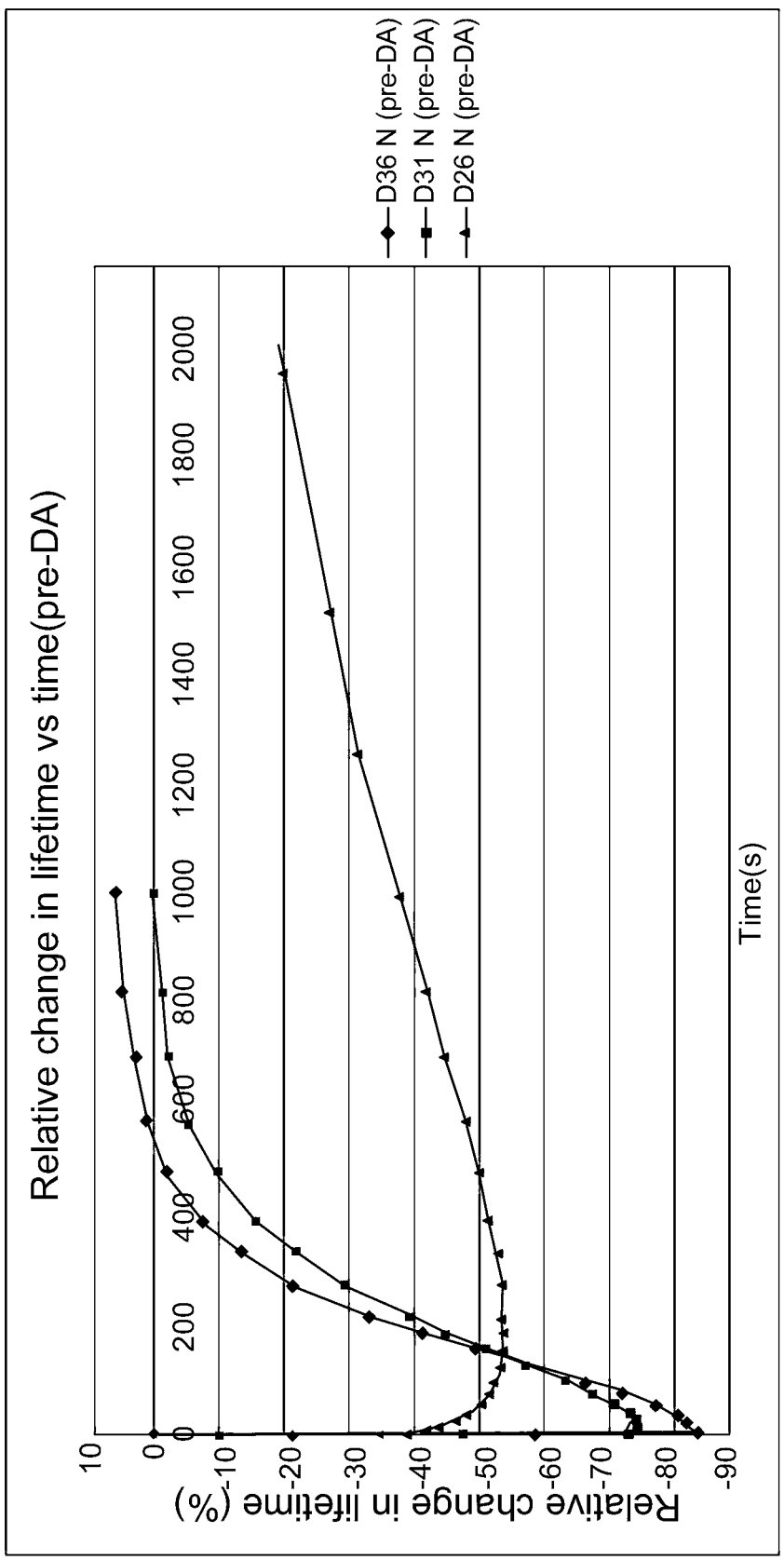
FIG. 11 is a plot showing the relative change in effective lifetime as a function of time of exposure to laser light.

Referring now to FIG. 11, there is shown the effective lifetime as a function of time for a test structure (identical to that used for the PERC cell of FIG. 1 but without the metal) subjected to various conditions. The control structure (green curve) has received standard PERC processing including the high temperature firing process normally used to simultaneously fire the metal contacts and release atomic hydrogen into the front and rear of the silicon wafer. As described, this firing process releases large amounts of atomic hydrogen within the dielectric, some of which diffuses into the silicon wafer. Following such a firing process, an accumulation of atomic hydrogen naturally occurs within both the dielectric and all regions of the silicon such as within the heavily doped n-type layer (as $H^-$) and within the bulk as $H_2$, B—H or $H^+$. As noted, all forms of accumulation that could contribute to HIR need to be eliminated to prevent future LID during operation in the field.

FIG. 11 shows this deterioration as a function of time using illumination from a laser and an elevated temperature of 130° C. to accelerate the deterioration due to HIR and recovery compared to what would happen in the field. The green curve shows what will naturally happen for a PERC cell under such accelerated conditions if no attempt is made following the high temperature firing of the metal contacts, to drain or eliminate the described reservoirs of atomic hydrogen. In comparison, the blue and red curves are identical test structures to that of the green curve but have received a thermal process (in the dark) at 250° C. for 8 minutes to drain the dielectric layers of their atomic hydrogen. These latter test structures have greater accumulation of atomic hydrogen ($H^-$) within the n-type layer compared to the green curve, but are relatively free from atomic hydrogen in the dielectric. We therefore see a very rapid and more severe deterioration in effective lifetime following exposure to the laser illumination (at 130° C.) compared to the green curve, as the laser initially shifts the higher concentration of $H^-$ out of the n-type layer and into the lightly doped p-type region where it creates HIR. However, with minimal further atomic hydrogen diffusing from the dielectric into the n-type layer on its way through to the lightly doped p-type region, the $H^-$ creating the HIR is able to be quite quickly shifted (or dispersed) by the illumination even at a temperature of only 130° C. A full recovery is therefore possible within about 600 seconds even at only 130° C., whereas for the standard cell (green curve), even after 2000 seconds of laser treatment, significant degradation remains as the atomic hydrogen continues to diffuse out of the dielectric layer and into the n-type layer. In reality, the application of the laser can be done at significantly higher temperature to greatly accelerate the clearing out of the n-type reservoir of atomic hydrogen and this will also accelerate the corresponding recovery. For example raising the temperature to 250° C. for the laser treatment allows the $H^-$ to be cleared from the n-type layer and the subsequent recovery through eliminating the HIR in only 30 seconds rather than the 600 seconds at 130° C. Even higher temperatures can of course further speed up this process.

F.2. Restriction of External Hydrogen Sources to Reduce Atomic Hydrogen Concentrations within the Silicon As discussed in F.1., while a hydrogen containing dielectric exists on the device surface(s), high temperature processes can release atomic hydrogen which is then free to migrate into the silicon and cause HIR or HISR at some stage in the future. A way to prevent this is to deliberately exhaust the hydrogen sources so that additional interstitial hydrogen atoms cannot be fed into the silicon. One approach is to deliberately deposit the dielectric layers so as to reduce the hydrogen concentration or else have multiple layers for the dielectric where the layer or layers closest to the silicon surface are designed to not only avoid being hydrogen sources, but to also deliberately block or retard the flow of hydrogen into the silicon when using the conditions for dispersing the existing hydrogen (particularly $H^-$) within localized regions of the silicon where corresponding recombination exists. The trouble is that these approaches also retard the ability to effectively hydrogen passivate all the defects in the device.

Another approach is to use longer high temperature thermal processes than usually used in solar cell processing that facilitate the depletion of hydrogen (not just mobile or atomic hydrogen) within the surface dielectric layers to therefore avoid the release or flow of additional hydrogen atoms into the silicon during the period or subsequently to the period when the high concentrations of interstitial hydrogen atoms are being dispersed. For example, temperatures of at least 700° C. and preferably above 800° C. or even 900° C. are preferable for depleting the dielectric layers of hydrogen and for durations of at least 30 secs and preferably in excess of 60 seconds or even 2 minutes depending on the hydrogen concentration and deposition conditions for the dielectric layers. To ensure complete depletion of most dielectric types, exposure to temperatures of at least 900° C. and for at least 5 minutes and preferably more than 10 minutes will be preferable. The lower the temperature, the longer the time necessary. For shorter manufacturing times, temperatures in excess of 1,000° C. can be used but noting that the higher the temperatures used for this purpose, the more of the bonded hydrogen will also be lost that was previously beneficially passivating defects within the silicon.

Illumination of the dielectrics can also be used in the process described above to help accelerate the release of the interstitial hydrogen atoms and therefore the exhausting of such layers as a hydrogen source. Such illumination is beneficial for multiple reasons, as it initially aids the hydrogen passivation of defects by allowing larger amounts of hydrogen to diffuse from the dielectric into the silicon and then subsequently, by helping exhaust the supply of hydrogen in the dielectric to prevent future damage by the hydrogen.

F.3. Use of Heat and Increased Injection Levels for the Elimination of Hydrogen Counter-Doping at p-Type Surfaces to Restore the Effective Surface Passivation A variation of the examples for solving surface passivation deterioration caused by hydrogen counter doping in section C., is to use approaches for increasing the injection level for the cell while heating so as to convert some of the $H^+$ as it is released from its bond into $H^0$, therefore allowing it to diffuse away from the substitutionally bonded boron atom rather than being electrostatically attracted straight back to the $B^-$ atom. This also will reactivate the boron dopants and effectively allow the hydrogen to be shifted away from the surfaces where it is creating or enhancing recombination through its counter-doping. As in previous examples, the raising of the injection level to help control the charge state of the hydrogen atoms can be done through illumination or through the application of an external power supply to forward bias the junction and allow current to flow. Similar temperatures as used in section C. also apply here.

F.4 Use of Heat for the Elimination of Hydrogen Counter-Doping at p-Type Surfaces to Restore the Effective Surface Passivation This example differs from F.3. and section C in that it only requires the thermal generation of $H^0$ to facilitate the dispersal of interstitial hydrogen from regions where the $H^+$ is counter-doping the p-type surface. It therefore does not require the use of electrostatic charge or sub-bandgap photons or increased injection levels. At higher temperatures, the p-type doped silicon surface naturally behaves more like intrinsic silicon with much higher fractions of the interstitial hydrogen atoms in the neutral charge state $H^0$ with corresponding higher diffusivities.

The disadvantage again though is that at such higher temperatures, additional atoms of hydrogen may continue to be released within the hydrogen containing surface dielectric layers and then diffuse into the silicon, potentially increasing the concentrations of hydrogen atoms needing to be dispersed. However, the hydrogen concentration and volumes responsible for counter-doping at the silicon surface are relatively small enabling the thermal process for its dispersing or elimination to be quite short or at lower temperature and therefore able to minimise the flow of additional hydrogen from the dielectric.

For the $H^+$ dispersal process in this example, since the background doping is p-type, the thermal generation of $H^0$ needs to be done at elevated temperature above 400° C. and preferably above 450° C. to increase the concentrations of $H^0$ atoms so that they can move away from the surface at reasonable rate. Even higher temperatures above 500° C. or even 550° C. will further speed up the process by further increasing the thermal generation of $H^0$. From a manufacturing perspective, even higher temperatures above 600° C. may be beneficial to increase throughput although with the disadvantage that at such high temperatures, the amount of additional interstitial hydrogen atoms diffusing into the silicon surface from external hydrogen sources may be higher, therefore potentially adding additional hydrogen that may cause recombination and therefore may also need to be dispersed or got rid of. For these reasons, temperatures in excess of 700° C. should not be used in this process and preferably below 600° C. or even 500° C. If such high temperatures above 500° C. are considered important for speeding up the process, a subsequent reduction in temperature can be beneficially used so that the majority of the $H^+$ can be dispersed quickly during the higher temperature part of the process while during the lower or gradually reducing temperature part of the process, the amount of additional hydrogen entering the silicon is greatly reduced and the remaining reduced amount of $H^+$ dispersed or got rid of in a relatively short time frame. For example, during this part of the thermal-generation of $H^0$ and dispersal process for $H^+$, the temperature of 600° C. can be used for 10 secs followed by 30 seconds at 500° C. then 3 mins at 400° C. and then 3 mins at 300° C. before further cooling.

F.5. Application of Methods During Lamination

All of the above concepts from the previous examples (A-F) can be performed as part of the module lamination process. Such a process could incorporate one or a combination of techniques mentioned previously such as thermal processes, illumination for injection level control or sub-bandgap, electric fields etc. Such techniques could be used to manipulate the hydrogen during lamination in one or a number of ways, such as for release of the hydrogen from a hydrogen containing dielectric, dissociating and mobilizing bound hydrogen whether bonded to dopant atoms or hydrogen in a molecule, migration of the hydrogen within the silicon into or out of regions (including sinks), auto-generation of H– or H0, hydrogen charge state control, etc. Typical thermal conditions for lamination can be beneficial for shifting interstitial hydrogen, however purpose-built laminators for greater control of thermal conditions as well as with illumination and/or the ability to apply electric fields are likely to be further beneficial. Electric fields can also be applied during standard lamination processes such as through contact with cell or string interconnects or external module contacts.

G. Solving Light-Induced Degradation (LID) in Multicrystalline Silicon Solar Cells Referring now to FIG. 12, there is shown a schematic representation of the front surface of a typical p-type silicon PV cell showing three regions where atomic hydrogen can accumulate. The accumulation of hydrogen in these regions is pictorially represented by 'buckets' of hydrogen, B1, B2 and B3. In this example, B3 represents the hydrogen in the lightly doped silicon near the junction including the p-type base; B2 represents the hydrogen in the heavily doped n-type emitter and bucket B1 in the hydrogen-containing surface dielectric layer. Bucket B3 could equally well apply to either intentional lightly doped n-type (for an n-type wafer) or intentional lightly doped p-type (for a p-type wafer).

In some instances, the recovery process may take much longer than the apparent onset of the LID since accumulated hydrogen within the device not previously contributing to the HIR can continue to effectively feed into B3, therefore slowing down the rate of emptying B3 to reduce or eliminate the HIR. Examples of hydrogen within the device that can contribute to this include hydrogen within the dielectric that can continue to slowly diffuse from the dielectric into the n-type emitter and then through to the lightly doped regions, or molecular hydrogen within the silicon that under the right conditions can continue to dissociate into atomic hydrogen, or weakly bonded atomic hydrogen to dopants such as phosphorus and boron which can be easily released under the right conditions and therefore potentially contribute to the HIR, where the continual supply of atomic hydrogen from these sources into B3 can maintain some level of HIR for a prolonged period. Nevertheless, the device will eventually recover as the atomic hydrogen disperses or reforms molecular hydrogen or re-bonds to dopant atoms where they no longer cause HIR. However, complete recovery from HIR can only be assured once all regions of atomic and molecular hydrogen accumulation have been drained to a sufficiently low level which for the examples given, include all three buckets. This includes the hydrogen containing dielectric layers, hydrogen from within heavily doped regions and hydrogen from within the lightly doped regions such as in the vicinity of the junction or other lightly doped regions where the HIR can be generated and therefore be part of B3 such as the wafer bulk and particularly the rear surface.

In general, to be most effective, hydrogen passivation approaches for silicon wafers take the hydrogen concentration above 1e16 atoms/$cm^3$ in one or more localised areas of the silicon comprising the device. In fact all currently manufactured p-type silicon solar cells at the time of completion and encapsulation into modules, likely retain a hydrogen concentration in one or more localised areas of the silicon at levels above 1e16 atoms/$cm^3$. The applicants have surprisingly shown that such high concentrations of residual hydrogen cause significant light-induced degradation in such cells during light-soaking or operation in the field.

Embodiments disclosed herein provide processes, techniques or structures that facilitate lowering the hydrogen concentration in every doped silicon region of the device to below 1e16 atoms/$cm^3$ and therefore to a level unable to cause significant LID.

Embodiments also provide techniques to reduce the atomic hydrogen concentration within the dielectric(s) (bucket B1). Such hydrogen can also trigger LID for the solar cells when operating in the field as the hydrogen diffuses from the dielectric into the silicon where it can potentially locally raise the hydrogen concentration to above 1e16 atoms/$cm^3$ at which stage they become vulnerable to LID, particularly if conditions lead to the increasing of the atomic hydrogen within the lightly doped regions of the device such as by diffusion of atomic hydrogen from heavily doped regions, dissociation of molecular hydrogen, releasing of hydrogen atoms weakly bonded to dopants, or additional hydrogen diffusing from the dielectric layers into the silicon.

In order to test the amount of residual hydrogen that is in a form that is not contributing to the HIR but could contribute to the HIR in the future under the right conditions, the Applicants have developed a test that involves heating the cell or module to 150-160 deg C. in the dark for a specific period of time in the range of 5-15 hours. Light soaking is then used and the extent to which this affects the cell or module efficiency gives an indication of the total amount of residual hydrogen within the various regions of the device that could potentially contribute to HIR. For example, the light soaking could be 3,000 hours of standard light-soaking at 70° C. and 0.7 suns illumination, to the transfer atomic hydrogen to B3 (where HIR results in the lightly doped p-type or n-type wafer), so as to degrade the cell efficiency. If the degradation is less than 1.5% (in relative terms) throughout the 3,000 hours of light-soaking shows that the solutions to LID identified in this invention have been used.

The majority of commercial p-type silicon solar cells are manufactured with a doping concentration of the silicon wafer just below 1e16 atoms/$cm^3$. Therefore, a concentration of hydrogen in the doped regions of about 1e16 atoms/$cm^3$ is necessary before large levels of recombination and therefore LID can occur.

In comparison, HIR is only a secondary effect in heavily doped regions such as the n-type regions of the PERC cell in FIG. 1. However, localised atomic and molecular hydrogen accumulated at these regions can migrate to other more HIR sensitive regions during operation of the PV devices. For these reasons, the processes described herein allow reducing the localised atomic hydrogen concentration below 1e16 atoms/$cm^3$ in all regions of the device, in particular for p-type PV devices. In n-type devices, in light of the different doping concentrations, the localised atomic hydrogen concentration can be reduced below 1e15 atoms/$cm^3$ to avoid HIR.

Figure 12:
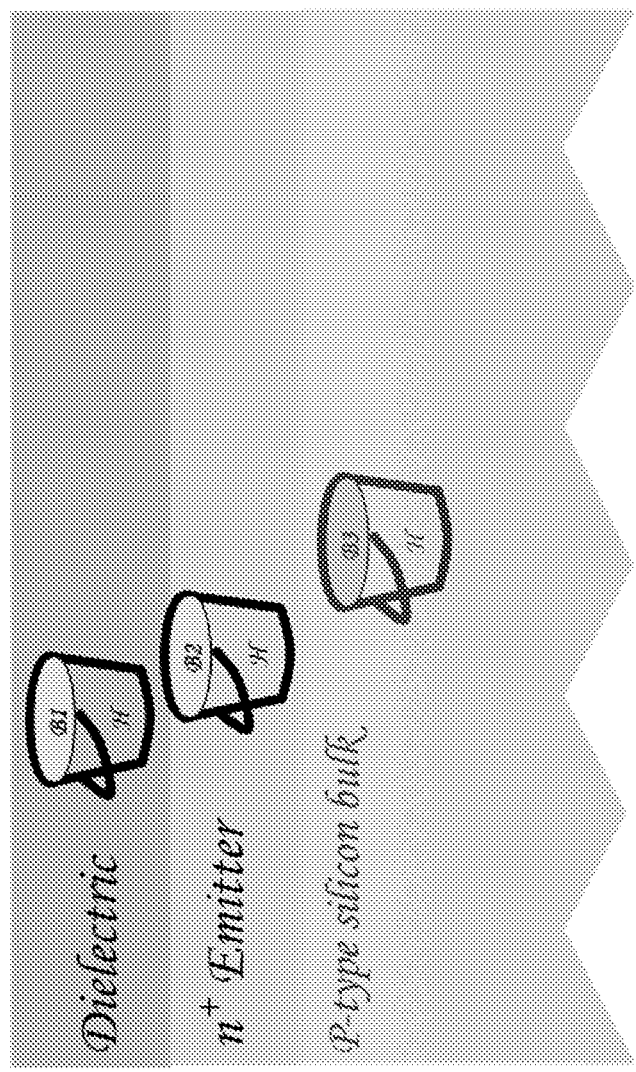
FIG. 12 is a schematic representation of a section of a typical p-type silicon PV cell showing three regions where atomic and molecular hydrogen can accumulate.

Draining hydrogen from buckets B2 and B3 in FIG. 12 is a crucial step for the techniques disclosed herein. In addition some of these techniques allow for draining of bucket B1.

Embodiments are relevant to any device structure that has a two bucket types where one is a type 3 bucket (B3) that has sufficiently low net doping concentration to allow HIR to occur when the localised atomic hydrogen concentration gets sufficiently high plus at least one either type 2 (such as B2 in FIG. 12.) or type 1 (such as B1 in FIG. 12.) bucket (or more likely one or more of each type) that allows hydrogen to accumulate without causing HIR (hydrogen not causing HIR includes all forms of hydrogen within the dielectric, heavily doped silicon regions, plus diatomic hydrogen anywhere in the device) but in such a way that subsequent light-soaking (or operation in the field) facilitates the transfer of sufficient quantities of the hydrogen into a type 3 (such as B3 in FIG. 12) bucket where HIR occurs.

In the device of FIG. 12 with all three types of buckets, preferably bucket 1 is emptied first, bucket 2 second and then bucket 3 third because most processes for emptying bucket 1 will lead to the flow of some atomic hydrogen from bucket 1 into bucket 2 while most processes for emptying bucket 2 will automatically lead to the transfer of some or even most of the atomic hydrogen from bucket 2 into bucket 3. Furthermore, in general it does not matter whether buckets are at the front surface or rear surface as equivalent buckets on the opposing surfaces in general respond similarly to the processes developed for emptying the respective buckets. Some exceptions to this will be highlighted in the disclosure of the methods below.

G.1. Type 1 Buckets (e.g Bucket B1, FIG. 12.)

Type 1 buckets are dielectric layers on the surface(s) of the silicon solar cell that contain hydrogen that is able to be released under the right conditions into the silicon wafer or device. Such layers are commonly deposited by plasma enhanced chemical vapour deposition (PECVD) such as $SiN_x$:H and $AlO_x$:H, but could also include any surface dielectric layers that receive hydrogen from a secondary source such as through ion implantation, through exposure to hydrogen containing chemicals, through exposure to a hydrogen containing plasmas or gases, etc. Such hydrogen containing dielectric layers then become hydrogen sources for the silicon wafer, although type 1 buckets are only considered to have atomic hydrogen within such buckets once the dielectric layer has been activated as a hydrogen source, such as by heating it sufficiently to thermally release hydrogen atoms from their bonds to facilitate their subsequent diffusion or transport out of the dielectric layer. In other words, only un-bonded or hydrogen atoms able to move, are considered to be present in type 1 buckets. In a typical PECVD deposited $SiN_x$:H layer used for the top surface dielectric (ARC) of silicon solar cells, the hydrogen concentration after deposition will typically be in the range 1e22 atoms/cm$^3$ to 3e22 atoms/cm$^3$. This hydrogen however is predominantly bonded and not free to diffuse into the silicon and therefore unlikely to contribute to cause LID. In general though, part of a hydrogen passivation process will be the exposure of the partly or fully fabricated device to a sufficiently high temperature to thermally activate such hydrogen containing dielectric layers by releasing atoms of hydrogen from their bonds, some of which quickly diffuse out of the dielectric while others remain within the dielectric and therefore in bucket B1. During the typical high temperature firing for screen-printed solar cells at about 850° C., roughly 10% of the hydrogen escapes from the dielectric layer (some into the silicon and some out of the other surface). From a perspective of future LID originating from bucket 1, it is the portion of the remaining hydrogen within the dielectric layer that is free to slowly move or diffuse into the silicon during operation of the solar cell that is the concern and is therefore considered to be the content of B1 that needs to be drained or removed. As a guide, typically at least 90% of the residual content of B1 following such a high temperature firing process at 850° C. needs to be removed to keep future LID to acceptable levels. A good indicator as to whether this has been achieved is to heat the solar cell or solar module to 150° C. for 10 hours or alternatively 250° C. for 10 minutes and then carry out standard light-soaking for 400 hours. If the open-circuit voltage of the solar cell falls by less than 1% during the light-soaking, then B1 has been adequately drained of atomic hydrogen in accordance with embodiments. For reference, standard light-soaking for such LID tests for multi-crystalline silicon solar cells is exposure to the solar cell to an illumination level of 0.7 suns and at a temperature of 70° C. for a period of 400 hours.

In other words, during a high temperature thermal process above 600° C., a silicon solar cell with surface dielectric layer or layers containing hydrogen, can accumulate relatively large concentrations of atomic hydrogen in B1 within the dielectric layers as the hydrogen atoms are released from their bonds. Some of this hydrogen beneficially diffuses into the silicon device at such temperatures and has been shown capable of passivating various defects. However at the end of the thermal process, residual atomic hydrogen within the dielectric remains dormant in B1, but still relatively mobile and able to slowly diffuse into the silicon surface over long periods of time under the normal illuminated operating conditions for solar cells in the field such as when operating at temperatures within the range of 40° C. to 70° C. This atomic hydrogen diffusing into the silicon can cause LID, in particular in multi-crystalline (mc) PERC solar cells. In these cells crystallographic defects, such as grain boundaries, make it easier for the atomic hydrogen to diffuse from the dielectric layer and into the silicon.

After the solar cell is encapsulated into a module, the atomic hydrogen concentration within B1 needs to be reduced to a suitably low value to avoid subsequent diffusion of significant amounts of atomic hydrogen through to the silicon surface during operation in the field. If the latter occurs, HIR can potentially occur and the electrical performance of the solar cell may deteriorate. The residual atomic hydrogen within B1 is considered suitably low if during 10,000 hours of standard light-soaking at 70° C. and 0.7 suns illumination, the transfer of atomic hydrogen from B1 through to B3 (where HIR results), is sufficiently low so as not to degrade the cell efficiency by more than 1% at any point during the 10,000 hours of light-soaking. Some of the methods described previously, independently or in combination, can be used to reduce the concentration of atomic hydrogen in B1. Some examples follow.

G.1.1 Thermal Treatment to Diffuse Atomic Hydrogen Out of B1

To drain B1, it can be beneficial to heat the solar cells to at least 150° C. for at least 20 hours and preferably 100 hours to speed up the diffusion of this atomic hydrogen out of the dielectric layer(s). Raising this temperature to at least 200° C. will accelerate the process allowing it to be effective in less than 10 hours although longer times will more completely drain the interstitial atomic hydrogen from bucket B1 (the dielectrics) and therefore give greater immunity to LID. Raising this temperature further to at least 250° C. can enable the process of draining the dielectric layers to take place reasonably effectively in only 30 minutes although one hour is preferable and 2 hours or more are beneficial for greater immunity to LID. Temperatures higher than 300° C. can also be used to further speed up the process although temperatures higher than 450° C. appear to create additional problems through thermally releasing additional atomic hydrogen into B1 within the dielectric layers that can later diffuse into the silicon and create problems as well as thermally reactivating defects within the silicon previously passivated by the hydrogen.

It can also be beneficial for the above thermal treatment to be carried out in the dark so that the atomic hydrogen diffusing from B1 to B2 will remain as H$^-$. Although illumination can beneficially increase the H$^0$ fraction within the n-type region which can help reduce the atomic hydrogen in B2, it can negatively lead to the corresponding diffusive flow of some atomic hydrogen to the region directly beneath the metal contact where the contact resistance can increase.

G.1.2 Use of Corona Discharge, Electrostatic Charge or Electric Fields to Drive Hydrogen Out of B1

Many of the techniques for manipulating and controlling the charge states of the hydrogen atoms rely on the fact that the hydrogen atoms are within the active regions of the silicon and therefore can be affected by conditions imposed on such active regions of the silicon such as injection level or the application of electric fields across the device terminals. B1 however is outside the active device volume therefore potentially necessitating different approaches for shifting the atomic hydrogen. Since B1 is outside the active volume, atomic hydrogen contained within B1 does not contribute to device recombination. However, the relatively high mobility of such hydrogen that facilitates its movement into the silicon and into active regions over very long periods of time measured in years, makes B1 potentially a significant contributor to LID during device operation in the field.

Since most of the released atomic hydrogen within hydrogen containing dielectric layers appears to be charged (mainly $H^+$ in PECVD deposited $SiN_x$:H with much smaller concentrations of $H^0$ and $H^-$) a particularly effective approach of emptying B1 is to shift the atomic hydrogen out of the dielectric layer using the application of an electric field as discussed above. For example, if a high positive voltage relative to the solar cell is applied to an electrode mounted a small distance above the top surface of the solar cell (and therefore a small distance above the top surface of the dielectric), a significant voltage can exist across the dielectric layer that creates a significant electric field within the dielectric that drives or forces the $H^+$ towards and into the silicon surface. In comparison, any negative charge will be driven by the electric field in the opposite direction and out of the dielectric. Another approach for similarly creating an electric field within the dielectric is to deposit positive static charge onto the surface of the dielectric layer such as using a high voltage corona discharge of about 0.5 kV-5 kV or even 10 kV or above. This will similarly drive the $H^+$ towards and into the silicon surface and $H^-$ in the opposite direction.

A preferable approach when solving LID could be to reverse the direction of this electric field. By using a large magnitude negative voltage relative to the solar cell applied to an electrode mounted above the solar cell surface or depositing negative static charge onto the dielectric surface, will then drive most of the $H^+$ out of the dielectric in the direction away from the solar cell's surface rather than adding additional atomic hydrogen into bucket B2 and then later B3. In this way, only the $H^-$ (whose concentration in PECVD $SiN_x$:H appears to be much lower than $H^+$) and perhaps a small amount of $H^0$ moves into the silicon into B2 and B3 to be later dispersed to avoid LID.

All the above processes involving the use of electric fields to shift the atomic hydrogen will benefit from the use of elevated temperatures to increase the diffusivity of the hydrogen atoms, including any $H^0$ that is unaffected by the electric field and therefore needs to thermally diffuse to escape the dielectric layer. Temperatures of at least 50° C. will help significantly although higher than 100° C. and even 150° C. will accelerate the process very significantly. Preferably, temperatures of 200° C. to 300° C. will give the best overall results in terms of making it a quick process while simultaneously draining almost all the atomic hydrogen out of the dielectric without thermally releasing too much additional atomic hydrogen into B1. Even higher temperatures can be used if considered important for throughput in manufacturing although temperatures above 450° C. will likely lead to significant reactivation of defects previously passivated by hydrogen as well as higher rate of thermal release of additional hydrogen atoms into the dielectric layer. Such high temperatures are also likely to quickly degrade the quality of the electric field generated by static charge on the surface of the dielectric.

G.1.3 Use of a Barrier Layer to Reduce Diffusion of Hydrogen into the Silicon A barrier layer can be inserted between the hydrogen source dielectric and the silicon surface and can in principle be any material that retards the flow of hydrogen from the dielectric into the silicon. However it is important when such a barrier layer is on the light-receiving surface that it does not interfere optically with the anti-reflection properties of the surface layers or the operation of the underlying solar cell, such as through absorbing photons that would otherwise generate electron-hole pairs within the solar cell and if the barrier layer is immediately adjacent to the silicon surface, then it needs to adequately passivate the surface. For example, a thermally grown silicon dioxide layer may be grown in accordance with all these criteria. The trade-off though is that if too thick, such an oxide layer will interfere with the anti-reflection properties of the surface dielectric layers while if too thin, will be a less effective barrier in regarding the flow of hydrogen into the silicon.

G.1.4 Use of Hydrogen Sinks to Drain Buckets B1

Sinks or crystallographic defects acting as sinks (discussed in sections D. and E. respectively) can be used to help drain hydrogen from parts of silicon devices and the dielectric (B1). Such sinks greatly lower the atomic hydrogen concentration in the vicinity of the sinks and allow monatomic hydrogen from further distances away in bucket B1 to diffuse towards these sinks due to the concentration gradients created.

Due to the greater difficulty of diffusing atomic hydrogen out of the dielectrics (B1), this approach is less effective at draining B1 than B2 and B3. In fact wafer temperatures above 400° C. appear necessary to enable B1 to be cleared reasonably well with this approach and even then the process tends to take more than 20 minutes. Wafer temperatures above 500° C. enable this process to be shortened to less than 10 minutes, although at least 600° C. is necessary to reduce this to be 20 seconds. The problem with such high temperatures is that the ongoing thermal generation of new atomic hydrogen within the dielectric is so high that bucket B1 cannot be properly emptied, leaving significant concentrations that may cause LID later on.

G.2. Type 2 Buckets (e.g. Bucket B2 in FIG. 12)

Type 2 buckets are those where hydrogen can accumulate to potentially high concentrations without contributing to the HIR but with the potential to contribute to the HIR in the future under the right conditions. Examples of the forms that hydrogen can take in Type 2 buckets include molecular hydrogen, weakly bonded hydrogen such as to dopant atoms and atomic hydrogen residing in heavily doped regions of silicon where atomic hydrogen can accumulate to high concentrations without appearing to have any significant effect on the electrical properties of the device such as through producing HIR. This is because as long as the localised hydrogen concentration remains an order of magnitude or more below the concentration of the intentional dopants in the region, the atomic hydrogen is unable to have significant impact on the effective doping and there are too few minority carriers in the vicinity to facilitate HIR. Nevertheless, in such regions the atomic hydrogen can accumulate to high concentrations because hydrogen atoms diffusing into such regions as $H^0$ change charge state to being the same as the polarity of heavily doped silicon which then has at least several orders of magnitude lower diffusivity than $H^0$ and therefore tends to cause the hydrogen to be stuck in the type 2 Bucket (B2). The Applicants have found that one of the problems with accumulating significant levels of atomic hydrogen within type 2 buckets is that although they appear to not be causing any harm, if subsequent conditions that the solar cell is exposed to lead to molecular and weakly bonded hydrogen dissociating or causing the charge state of the hydrogen atoms to change, $H^0$ is produced that then allows the hydrogen to potentially diffuse relatively easily, even at operating temperatures in the field, into type 3 buckets which represent lightly doped regions where HIR can readily occur if there is sufficient atomic hydrogen present. Both type 1 and type 2 buckets can effectively store quite large amounts of hydrogen for long periods of time exceeding years in the field, and therefore potentially contribute to LID in the form of HIR over a period of many years and even decades.

When draining bucket 2 of atomic hydrogen, the residual atomic hydrogen concentration within B2 is considered suitably low if during 1,500 hours of subsequent standard light-soaking at 70° C. and 0.7 suns illumination, the transfer of atomic hydrogen from B2 through to B3 (where HIR results), is sufficiently low so as not to degrade the cell efficiency by more than 1% at any point during the 1,500 hours of light-soaking. Some of the methods described above, independently or in combination, can be used to reducing the concentration of atomic hydrogen in B2. Some examples follow.

G.2.1 Thermal Generation of $H^0$ to Diffuse Atomic Hydrogen Out of B2

Thermal generation of $H^0$ can be used to facilitate the dispersal of interstitial hydrogen from regions of high concentration such as in buckets 2 and 3. It therefore does not require the use of sub-bandgap photons, increased injection levels, or the very high concentrations of interstitial hydrogen needed for the auto-generation of $H^0$. At higher temperatures, the doped silicon naturally behaves more like intrinsic silicon with much higher fractions of the interstitial hydrogen atoms in the neutral charge state $H^0$ with corresponding higher diffusivities.

The disadvantage again though is that at such higher temperatures, additional atoms of hydrogen continue to be released within the hydrogen containing surface dielectric layers and then diffuse into the silicon while molecular hydrogen within the region will dissociate due to the higher temperature but also as atomic hydrogen diffuses from the type 2 bucket into the type 3 bucket, potentially increasing the concentrations of hydrogen atoms in buckets 2 and 3, which then also need to be dispersed. For these reasons, it is beneficial to use this approach in combination with different hydrogen sources for the hydrogen passivation process whereby the hydrogen source can be independently turned off such as with a plasma generated source of atomic hydrogen atoms. For the $H^-$ dispersal process in this example, the thermal generation of $H^0$ needs to be done at elevated temperatures above 300° C. for n-type silicon or even above 400° C. if the n-type silicon is very heavily doped (and preferably above 400° C. or even 500° C. for p-type) so as to increase the concentrations of $H^0$ atoms so that they can move away out of type 2 buckets (such as B2) at a reasonable rate.

Higher temperatures above 600° C. or even 650° C. will further speed up the process by further increasing the thermal generation of $H^0$ but may start to cause some defects already passivated by hydrogen to be reactivated as the hydrogen is released from its bond, so preferably, temperatures below 600° C. and ideally below 500° C. should be used. From a manufacturing perspective, even higher temperatures above 700° C. or even 750° C. may be beneficial to increase throughput although with the disadvantage that at such high temperatures, the amount of additional interstitial hydrogen atoms diffusing into the silicon surfaces and into type 2 buckets (such as B2 at the front surface of a PERC solar cell or the lightly p-type doped silicon at the rear surface of the typical PERC solar cell) from external hydrogen sources (B1) may be higher, therefore potentially adding additional hydrogen that may also need to be dispersed or removed. For these reasons, temperatures in excess of 1000° C. should not be used in this process and preferably below 900° C. or even 800° C.

If such high temperatures approaching 700° C. or above are considered important for speeding up the process, a subsequently reducing temperature can be beneficially used so that the majority of the $H^-$ can be dispersed quickly during the higher temperature part of the process while during the lower or gradually reducing temperature part of the process, the amount of additional hydrogen entering the silicon is greatly reduced and the remaining reduced amount of $H^-$ dispersed or got rid of in a relatively short time frame. For example, during this part of the thermal-generation of $H^0$ and dispersal process, the temperature of 900° C. can be used for 5 seconds followed 5 seconds at 800° C. and then 10 seconds at 700° C. and then 20 seconds at 600° C. and finally 60 seconds or longer at 500° C. before further cooling is implemented with less importance on rate.

An important benefit of this approach is that the $H^+$ atoms residing in p-type regions such as in the vicinity of the rear surface in FIG. 12 where they are acting as donor atoms that counter-dope the localise p-type dopants, can be thermally converted to $H^0$ and dissipated or dispersed away from such regions in a way not easily achieved by other approaches.

G.2.2 Use of Sub-Bandgap Photons to Generate $H^0$ to Diffuse Atomic Hydrogen Out of B2, FIG. 12

A silicon wafer, device or partly fabricated device with a heavily doped n-type region as in FIG. 1, that has accumulated atomic hydrogen in bucket 2 (as per FIG. 12), will have most of the atomic hydrogen in the negative charge state $H^-$. Such a structure can be exposed to a source of sub-bandgap photons for the silicon to convert $H^-$ into $H^0$. This is done by the photons exciting an electron from each interstitial $H^-$ atom into the conduction band, therefore converting the $H^-$ atom into $H^0$. This greatly increases its diffusivity and therefore its ability to be dispersed away from such regions of high $H^-$ concentration. This makes it possible at elevated temperature to clear most of the hydrogen out of bucket B2.

This process however needs to be done at elevated temperature above 50° C. and preferably above 100° C. This is to increase the diffusivity of the resulting $H^0$ atom so that it can move away at reasonable speed from its existing location. Even higher temperatures above 150° C. or even 200° C. will further speed up the process by further increasing the diffusivity of the $H^0$.

From a manufacturing perspective, even higher temperatures above 250° C. or even above 300° C. may be beneficial to increase throughput. However these increased temperatures, if too high, have the disadvantage that they shift the equilibrium values between atomic and molecular hydrogen throughout the device in favour of more atomic hydrogen, leading to additional dissociation of the molecular hydrogen in B2. The increased temperatures may also provide sufficient thermal energy to release additional bonded hydrogen within the dielectrics (bucket 1) with such additional hydrogen atoms then able to subsequently diffuse into the silicon surface from the external hydrogen sources, therefore potentially adding additional hydrogen that may cause recombination and therefore may also need to be dispersed or got rid of. For these reasons, temperatures in excess of 650° C. should not be used in this process and preferably below 500° C. or even 450° C.

If such high temperatures are considered important for speeding up the process in manufacturing, a subsequently reducing temperature while continuing the sub-bandgap electromagnetic radiation exposure can be beneficially used so that the majority of the $H^-$ can be dispersed quickly during the higher temperature part of the process while during the lower or gradually reducing temperature part of the process, the amount of additional hydrogen entering the silicon is greatly reduced and the remaining reduced amount of $H^-$ dispersed or removed in a relatively short time frame. For example, during this part of the process with sub-bandgap photon exposure, the temperature of 600° C. can be used for 10 seconds followed by 20 seconds at 500° C. then 30 seconds at 400° C. and then 30 seconds at 300° C. and then 30 seconds at 200° C. and finally 30 seconds at 100° C. From a practical perspective, this is more easily implemented as a gradually reducing temperature over a period of typically 2 minutes to 3 minutes as the temperature is reduced from 600° C. down to below 100° C. while the wafers are exposed to the sub-bandgap photons.

Although sub-bandgap photons in the energy range 0.6 to 1.1 eV are useful for this process, photons in the broader range of 0.4 to 2 eV can still be beneficially used, particularly if higher temperatures are used that lead to significant reductions in the silicon bandgap energy. The disadvantage of using photons with energy above the bandgap of the semiconductor material (which is 1.12 eV for silicon at room temperature) is that such photons can be absorbed by the silicon, leaving less photons able to be absorbed by the $H^-$ atoms so as to convert them to $H^0$, particularly for $H^-$ atoms located towards the rear surface where no photons are entering the silicon. This can be a particular problem where the dielectric passivated p-type surface is at the rear of the device such as in a PERC cell of FIG. 1 and yet the photons are being fed into the front surface due to metal across the rear preventing such photons from being fed into the rear surface. In such cases, sub-bandgap photons are even more important so they can penetrate through the thickness of the wafer to where $H^-$ atoms are located. Ideally, photons in the range 0.85 eV to 1.12 eV can be used to improve the responsiveness further.

The rate at which the $H^-$ atoms are converted to $H^0$ for dispersing is obviously a function of the intensity of the sub-bandgap photons. The higher the intensity (power density) of the photons, the more rapidly the $H^-$ can be dispersed although excessively high intensities have the negative effect that the rate of converting the $H^-$ to $H^0$ tends to saturate while the additional interstitial hydrogen atoms released within the dielectric layer are then available to subsequently diffuse into the silicon and cause more problems. The preferred range of intensities for the sub-bandgap photons with energy in the range of 0.6 eV to 1.1 eV and preferably 0.85 to 1.1 eV, is 1 mW/cm$^2$ to 1,000 mW/cm$^2$. However intensities for such photons in the range of 0.1 mW/cm$^2$ and 10,000 mW/cm$^2$ can also beneficially be used.

G.2.3 Use of Increased Injection Levels Through Illumination or Forward Biasing with an External Power Supply to Generate Increased $H^0$ to Diffuse Atomic Hydrogen Out of B2

Another approach for converting $H^-$ into $H^0$ in a heavily n-type doped region such as in FIG. 12 is by increasing the injection levels for the device such as through illumination or forward biasing the device with an external power supply. As previously described, increasing the $H^0$ fraction, particularly at elevated temperatures of at least 100° C. and preferably above 150° C. and ideally above at least 200° C. can enable the atomic hydrogen within B2 to be transferred out and into B3 where it can cause HIR and allow further molecular hydrogen within B2 to dissociate into atomic hydrogen reasonably quickly. If for manufacturability this needs to be done in less than 1 minute, temperatures of at least 250° C. can be used or even above 300° C. However temperatures much above 400° C. may have negative consequences in terms of reactivating defects that have already been passivated by the hydrogen or else additional hydrogen being thermally released from within the dielectric layers, therefore adding to the content of B1 that can then subsequently flow through to B2 and even B3.

G.2.4 Use of Electric Fields to Drive Hydrogen Out of B2

Another example of how the $H^-$ can be dispersed from B2 is to apply an electric field to the silicon and hence a force on the $H^-$ atoms causing them to move. Although their mobility (or diffusivity) is much lower than that of atoms with the neutral hydrogen charge state $H^0$, the $H^0$ atoms do not have any force exerted on them by an applied electric field while the $H^-$ does. Therefore, although a slow process due to the poor diffusivity of the $H^-$ atoms, the $H^-$ atoms do slowly move in response to the applied electrostatic force and eventually move out of B2. Any bonded or non-charged hydrogen does not respond to such an applied electric field in terms of moving to another location. Some techniques for using electric fields to shift hydrogen are discussed in section C.

An example of how to apply such an electric field to implement the hydrogen dispersal process from B2 as part of this invention is where an external power supply is used in conjunction with a typical finished solar cell with both front (negative) and rear (positive) contacts contacted so as to forward bias the solar cell so as to apply an electric field that causes current to flow across the forward biased p-n junction. This process can be accelerated by increasing the applied electric field to increase the current flow and corresponding force on the charged interstitial charged atomic hydrogen atoms. This, however, also has a negative consequence of increasing the injection level in the active regions of the device whereby the increased carrier concentrations, particularly the increased minority carrier concentrations, cause EF to shift towards the mid-gap (halfway between the Conduction and Valence bands) for the silicon. In n-type silicon this causes some of the H⁻ to convert to H⁺, and therefore in the process acting as double donors to try and again shift EF back away from the mid-gap and back towards where it was located in equilibrium (at low injection level). The problem with this is that although it temporarily gets rid of the H⁻ from such regions, the resulting H⁺ will move in the opposite direction and move far more slowly than H⁻ based on the published values for its diffusivity. It should still eventually solve the problem by dispersing the atomic hydrogen out of B2 but the process may take much longer and could lead to some of the H⁺ converting back to H⁻ when the power supply is removed (or its current reduced) and the device is returned to its lower injection level.

A potentially more effective variation used in embodiments involves pulsing the electric field, initially using a higher applied electric field (and therefore higher current) as described in the forward biased direction to quickly slightly shift most of the H⁻ interstitial hydrogen atoms in B2 in the desired direction, but for a short enough period of time that prevents much of the H⁻ from responding to the increased injection level to convert to the minority charge states. This is then followed by the use of a reduced electric field with lower currents and therefore lower injection levels for the active parts of the device to allow the hydrogen atoms to retain the H⁻ charge state or the opportunity to return to the H⁻ charge state for the small number that have transitioned to other charge states. This cycle is then repeated many times to increase the rate at which the H⁻ is shifted out of B2 compared to if the lower value of electric fields is used continuously. For cycle times, H⁻ is relatively stable with typical lifetimes as high as 1 second, making it possible to use the higher applied electric field (and therefore higher current) as described in the forward biased direction for up to about 0.5 seconds before reverting to the lower electric field that should then be maintained for at least 1% and preferably 10% of the time that the higher electric field was used. For example, using the higher electric field for 0.1 seconds and then the lower electric field for 0.01 seconds before switching back to the higher electric field for another 0.1 seconds etc., gives a periodicity of 0.11 seconds.

G.2.5 Use of Hydrogen Sinks to Drain Buckets B2, FIG. 12

This approach was described above briefly with reference to bucket B1 in example G.1.4, and in more detail in sections D. and E. earlier, and can be applied effectively for clearing B2 from atomic hydrogen at any given temperature, primarily due to the possibility of generating the neutral charge state for the hydrogen atoms in n-type silicon (through thermal processes or illumination including sub-band gap) that have much higher diffusivities than the other charge states and can therefore diffuse more readily to the sinks.

Heating the silicon to enable thermal generation of H⁰ (discussed previously) can be used effectively in conjunction with deliberately created sinks for the hydrogen within the device. These sinks greatly lower the atomic hydrogen concentration in the vicinity of the sinks and allow monatomic hydrogen from much further distances away in all buckets (B1, B2 and B3) at the front and/or rear of the device to diffuse towards these sinks due to the concentration gradients created.

For example, the use of an element that forms a molten eutectic with silicon at the desired temperature can be used in local regions to create such sinks by forming localised molten regions at or above the eutectic temperature. Aluminium for example forms a eutectic with silicon at 577° C. Therefore, enabling aluminium to make contact with the rear p-type surface of the silicon in localised regions where such sinks are considered most beneficial and then heating for several seconds to a temperature above the eutectic temperature, allows both the thermal generation of H⁰ and the creation of strategically located molten sinks simultaneously, allowing much of the excess monatomic hydrogen to be drawn away (or diffuse away) from the various buckets where they would otherwise contribute in the future to HIR and/or LID.

Another example of creating a sink is to use a localised heat source such as a laser to melt the silicon surface in one or more localised regions where the sink is to be formed. With such a localised heat source, the average temperature for the wafer can be separately set to the preferred value within the range 300° C. to 900° C. for the desired period while the localised heat source can be independently but simultaneously applied to create the localised sink for hydrogen by locally heating the silicon to at least 1400° C. at which temperature it melts. Advantageously, such a hydrogen sink created through melting the silicon can be created intermittently using a pulsed or Q-switched laser so that the silicon only remains molten for a small percentage of time. This remains effective since the local atomic hydrogen concentration is reduced to virtually zero each time the silicon becomes molten and then increases gradually while the silicon is solid and hydrogen diffuses into the region from surrounding areas where the atomic hydrogen concentration is too high. Each laser pulse then repeats this cycle, allowing the atomic hydrogen to be continually diffusing into this sink, even though it may be molten for less than 1% of the time. For example, a frequency doubled Nd-YAG laser operating at 532 nm and with Q-switching frequency of 100 kHz, can keep the silicon molten for 10-100 ns with each pulse, meaning that the silicon is only molten for 0.1-1% of the time, yet still creating a continuous sink for the hydrogen.

G.2.6 Use of Transient Responses to Disperse Atomic Hydrogen from Regions of High Concentration in Type 2 Buckets Such as B2 Buckets (n-Type)

Embodiments provide a powerful approach for emptying B2 that use several of the above mentioned techniques. This includes using transient responses where the conditions such as the injection level for the device that can determine the hydrogen charge state, is rapidly changed and then changed back again to bring about the desired transitions in the hydrogen charge state.

For example, in heavily doped n-type silicon that forms B2, the interstitial atomic hydrogen is naturally residing as H⁻ and can be illuminated by short pulses of sub-bandgap photons to convert some of the H⁻ into H⁰ and even H⁺ by exciting the electrons into the CB. At the end of each pulse, when the sub-bandgap illumination ceases, the interstitial hydrogen that was originally H⁻, is able to relax or decay back to the preferred H⁻ charge state for the prevailing conditions. Any transitions in charge state for the interstitial hydrogen atoms always involve the neutral high diffusivity charge state H⁰ which makes the frequent use of transitions valuable for allowing the hydrogen to move (diffuse) throughout the device. For example, even the most extreme transitions from H⁻ to H⁺ or the reverse, naturally involves transitioning through the preferred H⁰ state with the highest diffusivity. Such pulses can vary in duration from 1 ns to many seconds depending on the intensity of photons used and the number of hydrogen atoms needed to transition in charge state. Similarly, the off period between pulses can vary enormously in duration from 1 ns to many seconds although ideally, maximising the number of transitions in the hydrogen charge state is in general beneficial for speeding up the dispersal processes. Frequencies for the pulses approaching 1 GHz can therefore be used although frequencies below 100 kHz are often used to ensure sufficient hydrogen during the off period for the photon illumination exists to facilitate most transitioning back to its original $H^-$ state. Frequencies below 1 Hz can also be used but tend to increase the overall time required for the process. It should be noted that these transient effects can also be used to enhance the hydrogen passivation of defects and contaminants as well as for dispersing the hydrogen to reduce recombination. This is due to the $H^0$ charge state that has both the highest diffusivity as well as the highest reactivity and since it is by far the most difficult to produce and least stable charge state, it is also the most desirable and effective one to keep generating. Despite this, it has been shown that some types of defects (recombination), particularly ones that are charged with a specific polarity, need a particular charge state for the hydrogen atom to allow bonding and hence passivation to take place. This can therefore mean that in some devices and material types, all three charge states can be beneficial for most effective passivation, therefore further adding importance to the use of transient effects that can be used to naturally and readily produce the various charge states.

In addition to transient effects introduced through the pulsing of the sub-bandgap photons, any of the approaches used in previous examples for controlling the charge states for the interstitial hydrogen atoms can in principle be modified to capitalise on the benefits offered through transient responses. For example, a common approach for controlling the hydrogen charge state is by changing the injection level (carrier concentrations) so as to effectively shift EF that controls the charge state distribution. This can be done by illumination or through changing the terminal voltage such as by using an external power supply or both. These injection level changes can also be done by pulsing or by rapidly varying in either direction the terminal voltage or light intensity to produce transient effects, provided sufficient time is allowed following the rapid variations to facilitate the changes in carrier concentrations and corresponding changes in hydrogen charge state, for each such change in either illumination level or terminal voltage. Thermal variations can also in principle be used to produce beneficial transient effects although the time required for the changes are much longer and the variations much smaller in relative magnitude. Variations or transient effects in the use of electric fields can also be used for a range of benefits, again both in relation to shifting the hydrogen around to empty bucket 2 and/or bucket 3 to reduce recombination but also in enhancing the reactivity and ability of the hydrogen to passivate defects.

G.3. Type 3 Buckets (Bucket B3 in FIG. 13)

Figure 13:
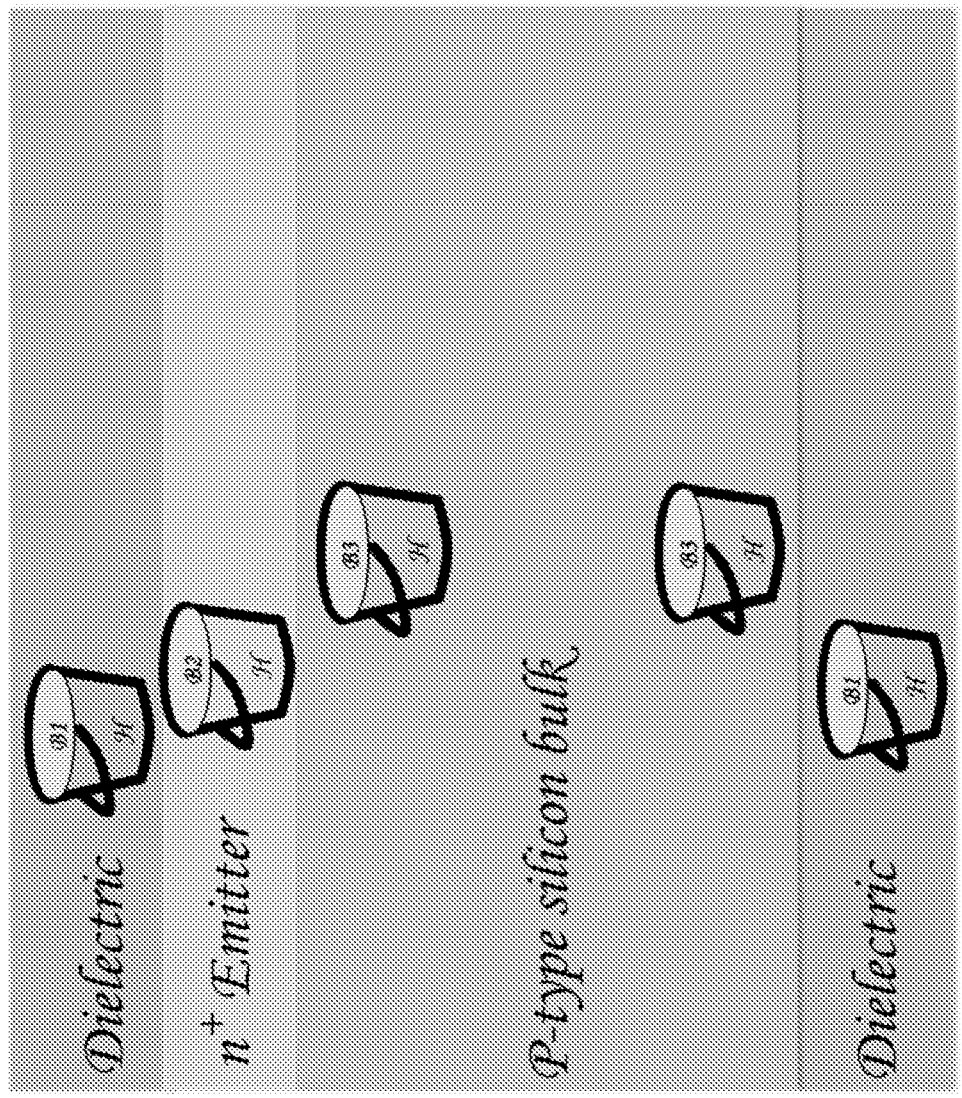
FIG. 13 is a schematic representation of a section of a p-type PERC silicon solar cell showing the approximate locations of the three regions where the molecular and atomic hydrogen can accumulate.

Type 3 buckets typically exist in more lightly doped regions such as is shown in FIG. 13 where relatively high concentrations of both electrons in the CB and holes in the VB co-exist. This facilitates hydrogen-induced recombination when there exists sufficiently high localised concentrations of atomic hydrogen (or hydrogen-containing complexes or compounds) capable of acting as catalysts for the recombination of electrons from the CB with holes from the VB. For example, bucket 3 in FIG. 13 is shown as being adjacent to the junction within the silicon material that was intentionally lightly doped p-type at about 1e16 atoms/cm³. As hydrogen initially diffuses from B2 to B3, it takes on the positive charge state in B3 as indicated in FIG. 1, therefore acting as donor atoms that counter-dope the p-type dopants. Such $H^+$ as previously discussed, does not contribute significantly to HIR or LID until the hydrogen concentration exceeds the intentional doping of 1e16 atoms/cm³. Above this value, the fraction of $H^-$ may begin to increase significantly, leading to the generation of HIR. If this flow of atomic hydrogen from B2 to B3 happens as a result of illumination during operation in the field, it can cause an increase in $H^0$ in the n-type layer such as in bucket 2 that then facilitates its diffusion into B3 where HIR can occur. This is observed as LID.

Some of the methods described previously can be used, independently or in combination, to prevent HIR in B3. Some examples follow.

G.3.1 Thermal Generation of $H^0$ to Diffuse Atomic Hydrogen Out of B3

This approach is equivalent to that used in example G.2.1 for clearing out bucket B2.

G.3.2 Use of Sub-Bandgap Photons to Eliminate HIR from B3

This approach is equivalent to that used in example G.2.2 for clearing out the $H^-$ from bucket B2. It should be noted though that as $H^-$ is converted to $H^0$ in B2 and diffuses into B3, some of the molecular atomic hydrogen will dissociate into more atomic hydrogen to bring the molecular and atomic hydrogen into equilibrium. This will provide an ongoing source of atomic hydrogen in B2 that can be progressively converted to $H^0$ with quite a bit of the $H^0$ diffusing into B3. It should also be noted that once the $H^-$ has been significantly eliminated from a given B3 location, it will not be effective in removing the residual $H^+$ that counter-dopes the intentional p-type dopants. The latter will need increased injection level such as through illumination to break B—H bonds and release the hydrogen atoms which if in the form of $H^0$ or $H^-$ can then diffuse away.

G.3.3 Use of Increased Injection Levels Through Illumination or Forward Biasing with an External Power Supply to Generate Increased $H^0$ to Diffuse Atomic Hydrogen Out of B3

This approach is along the same lines as that used in example G.2.3 for clearing out bucket B2. It is likely though that as atomic hydrogen diffuses into B3 it will deviate away from the equilibrium between molecular and atomic hydrogen leading to more molecular hydrogen forming to restore equilibrium. In reality, this can be viewed as returning the hydrogen to a type 2 bucket although as atomic hydrogen is diffused out of B3, this hydrogen will again dissociate into atomic hydrogen in B3 allowing the increased injection level (or other approach) to diffuse the atomic hydrogen out of B3.

G.3.4 Use of Electric Fields to Drive Hydrogen Out of B3

This approach is equivalent to that used in example G.2.4 for clearing out bucket B2, with further techniques discussed in section C.

G.3.5 Use of Hydrogen Sinks to Drain Buckets B3

This approach was described above in G.2.5 for clearing B2, and also in G.1.4 for clearing B1 but works more effectively for clearing B3 at any given temperature, primarily due to the greater ease of generating the neutral charge state for the hydrogen atoms that have much higher diffusivities than the other charge states.

G.3.6 Use of the Concept of Auto-Generation of $H^0$ to Clear Out Bucket B3

In this disclosure, the Fermi energy level (EF) $H^{(+/-)}$ refers to the EF in FIG. 1 where the $H^+$ and $H^-$ concentrations are roughly equal and the $H^0$ concentration close to its maximum. This example applies to any silicon wafer, device or partly fabricated device with a bucket B3 (similar to B3 in FIG. 12) corresponding to the lightly doped regions that have the hydrogen concentration in one or more such regions that can exceed the localized intentional doping concentration for the silicon such as through the hydrogen passivation process (such as in the presence of a hydrogen source provided by a hydrogen containing surface dielectric layer or layers deposited by PECVD). Such B3 regions will naturally have their EF determined by the interstitial hydrogen atoms acting as dopants, such that once EF is in the vicinity of $H^{(+/-)}$ (that is compatible with the donor and acceptor energy levels determined by the bonding arrangements and energy levels of the respective electrons), any additional interstitial hydrogen atoms will have roughly equal probability of being $H^+$ or $H^-$ so as not to affect EF. It should be noted that in this scenario, the $H^+$ atoms are acting as 'donor' dopants contributing their electron(s) to the conduction band while the $H^-$ atoms are acting as 'acceptor' atoms, removing electrons from the conduction band or equivalently adding holes to the valence band. Therefore, even though it is of significant benefit for the hydrogen passivation to have localized regions where the hydrogen concentration exceeds the background doping concentration, there are several important consequences for the electronic properties of the device, both positive and negative.

Firstly, even in silicon wafers or silicon material with intentional p-type dopants, when the interstitial hydrogen concentration exceeds the localized p-type dopant concentration, sufficient hydrogen atoms will go into the $H^+$ state and act as donors or directly passivate boron acceptors or a combination of both, to eliminate the effective p-type doping and can even potentially make the material n-type doped along the lines as explained by Herring et alia with the Fermi Level in equilibrium shifting to $H^{(+/-)}$, a little above mid-gap in response to the doping by the hydrogen atoms. Any excess hydrogen atoms over and above those necessary to achieve this EF $H^{(+/-)}$, will in combination not affect EF, being roughly equally divided between the $H^+$ and $H^-$ charge states so that the corresponding additional donors and acceptors contributed by such hydrogen atoms, nullify each other from a doping perspective.

Secondly, in this situation, the light (or low) net n-type doping created by the hydrogen, results in relatively high concentrations of holes (compared to conventional n-type doped regions) in the valence band in this region which then increases the interaction and recombination with the $H^-$ atoms that were formed from the excess interstitial hydrogen atoms in such regions. This leads to one of the forms of the HIR that forms the basis for most of the LID experienced in multi-crystalline silicon solar cells. Therefore, a certain amount of atomic hydrogen can be tolerated within B3 without contributing significantly to HIR or LID and it is only when the atomic concentration exceeds the intentional net doping concentration that problems with recombination appear to occur for this form of HIR. When clearing out B3 to solve HAR or HIR and LID, it is preferable to empty B3 as much as possible, although in reality to eliminate virtually all HIR of this type associated with B3 the atomic hydrogen concentration only needs to be taken down to below the intentional doping level in this region. The benefit of further reducing the content in B3 below this is that then if some residual hydrogen remains in B2 and/or B3, a certain amount can then be tolerated to flow into B3 (such as during light-soaking or during operation of the PV modules in the field) without causing HIR and/or LID.

Thirdly, these conditions are conducive to increased generation of $H^0$, whenever there are excess interstitial hydrogen atoms that simultaneously generate significant quantities of $H^+$ and $H^-$. $H^0$ is the 'high-mobility' or 'high-diffusivity' charge state for interstitial hydrogen atoms with diffusivities many orders of magnitude higher than for the other charge states. Nevertheless, this diffusivity is still very temperature dependent, necessitating temperatures of at least 100° C. and preferably above 150° C. for the $H^0$ to be able to move a reasonable distance before being returned to one of the other low mobility charge states. The aim in this example therefore is to use sufficiently high temperatures so that this generation' of $H^0$ can lead to its dispersal in a reasonable time period and has been described above.

It should be noted that this concept of generation of $H^0$ is defined here to correspond to the conditions where there is sufficient interstitial hydrogen atom concentrations relative to the background doping to shift the localized EF close enough to $H^{(+/-)}$ that naturally then leads to greatly increased generation of $H^0$ and additional atomic hydrogen beyond that required to cause EF to be $H^{(+/-)}$ is split roughly equally between $H^-$ and $H^+$ so as not to affect the Fermi Energy level, and readily able to change state between states always transitioning through $H^0$.

G.3.7 Use of Transient Effects to Drain Mobile Hydrogen Out of B3

In the same way as transients are used to drain bucket 2 in example G.2.6, similar approaches can be used for draining B3. In some ways, such transient effects can be even more effective for type 3 buckets since the latter tend to have atomic hydrogen of different charge states with quite high concentrations of each. Therefore, when various conditions are imposed that can drive atomic hydrogen from one charge state to another, the transient use of such conditions such as through pulsing, can be effective in ensuring decent concentrations of $H^0$ are generated, making it easier to disperse the hydrogen out of bucket 3.

G.4. Draining all Three Bucket Types of Atomic Hydrogen in PERC Cells

FIG. 13 is a schematic representation of a section of a p-type PERC silicon solar cell showing the approximate locations of three regions where of atomic hydrogen can accumulate. Type 3 buckets (such as B3), which are lightly doped regions of silicon in close proximity to a hydrogen source, are located near the rear surface and near the junction including the p-type base as shown. Type 2 buckets are located wherever hydrogen accumulates within the silicon whereby it does not cause recombination (HIR) such as when molecular hydrogen or weakly bonded to dopant atoms or else residing in B2 as atomic or molecular hydrogen in the heavily doped n-type emitter. Buckets of B1 are located in the hydrogen-containing surface dielectric layers.

Embodiments of the invention allow draining these three bucket types of excess hydrogen that could otherwise potentially contribute to HIR and therefore LID in the future when in atomic form in the lightly doped regions of type 3 buckets. Only if all three buckets have their respective concentrations of atomic hydrogen (and hydrogen that can easily convert to atomic hydrogen) reduced to suitably low values, do the corresponding cells have their HIR eliminated or at least greatly reduced both in the present and in the future where it can manifest itself as LID.

For the rear of the PERC, the tendency is for the atomic hydrogen to be transferred directly from B1 in the rear dielectric into B3 in the p-type material near the rear surface where it is well known that some of the hydrogen will remain in atomic form (primarily $H^+$ due to the p-type doping) while the remainder is in molecular form. The latter however could still be considered to be in bucket 3 (B3) since it is well known that the molecular and atomic hydrogen are in equilibrium such that as the described techniques for clearing B3 shift the atomic hydrogen to other locations, more molecular hydrogen will dissociate to atomic hydrogen to retain the ratio between them. Strictly speaking though, such molecular hydrogen, although already in the location of B3 where HIR forms, should be considered to be in a type 2 bucket based on the definition being used in this disclosure as it only contributes to HIR following dissociation to atomic form. Most of the examples above however for clearing the atomic hydrogen out of buckets B1, B2 and B3, apply similarly when these are located at the rear as when located near the front surface as shown in FIG. 13.

G.5. Combinations of Processes for Emptying Buckets of Hydrogen

The above examples list many processes that can be used for emptying or at least partially draining the various bucket types of mobile hydrogen, particularly atomic hydrogen that has the highest diffusivity. To be effective at eliminating LID that is caused by either HIR or other ways that hydrogen can increase recombination such as through counter-doping the silicon, all three bucket types, both at the front and rear of the device need to be drained to sufficiently low levels. Ultimately, the indicator as to whether the buckets are sufficiency well drained can be tested through light-soaking and the extent of LID measured in terms of degraded cell efficiency. Ideally, appropriate combinations of the processes described are capable of reducing such LID to below 1% although for improved manufacturability, throughput and lowering of corresponding costs, 2% or even 3% LID may be tolerated.

A crude short-term way of solving LID caused by hydrogen is where attention is only paid to emptying type 2 and type 3 buckets. For example, a silicon solar cell that has received hydrogen passivation by diffusing, implanting or driving hydrogen into the silicon prior to, during or following device fabrication, can be treated so as to subsequently reduce the localised atomic hydrogen concentration in all lightly doped n-type and p-type regions (draining of type 3 buckets) throughout the device as well as in all heavily doped n-type regions (draining of type 2 buckets) to greatly reduce or even eliminate light-induced degradation during light-soaking or subsequent operation in the field depending on how much hydrogen subsequently flows from dielectrics through to the silicon. More specifically, because commercial wafers are in general intentionally doped within the range of 1e15 to 1e16 dopants/$cm^3$, the localised atomic hydrogen concentration needs to be reduced to below 1e16 atoms/$cm^3$ in all lightly doped n-type and p-type regions (type 3 buckets) throughout the device as well as preferably also in all heavily doped n-type regions (type 2 buckets), to remove the possibility of hydrogen from such regions flowing or diffusing into type 3 buckets where the concentration could approach 1e16 and therefore cause HIR and/or LID.

To also ensure LID does not occur in the future during operation in the field (or during light-soaking) due to hydrogen flowing from the dielectric(s) into the silicon and therefore into buckets B2 and/or B3, it is important as part of this invention/treatment to also ensure the concentration of all mobile hydrogen within the hydrogen containing dielectric layers is reduced so as to eliminate or minimise subsequent light-induced degradation during light-soaking or subsequent operation in the field. The gauge as to when the hydrogen concentration in each of the dielectrics is reduced sufficiently is when subsequent heating of the device to 250° C. for 10 minutes in the dark can be followed by light-soaking that leads to a maximum degradation of less than 2% in open circuit voltage under standard test conditions or less than 3% maximum degradation in efficiency under standard test conditions. In fact the same test can be used to test whether excessive hydrogen also remains in molecular form anywhere within the silicon as the increased temperature will increase the dissociation of the molecular hydrogen into atomic hydrogen. Ideally though, the hydrogen concentration in each of the dielectrics will be reduced sufficiently so that when the device is subsequently heated to 250° C. for 10 minutes in the dark and then followed by light-soaking, the maximum LID of the cell efficiency will be less than 1.5% or the open circuit voltage (under standard test conditions) will reduce by less than 1%. It should be noted though, that these tests for the dielectrics and the suitability of their mobile hydrogen concentration can only be effectively applied if buckets 2 and 3 have already been drained using one or more of the described techniques so as not to confuse the measurements.

If for some reason in the above tests for bucket types B1 (dielectrics) and stores of molecular hydrogen throughout the silicon it is not possible or considered undesirable to heat the devices to 250° C., an alternative test can be applied to test whether the hydrogen concentration in the dielectrics and in the silicon is reduced sufficiently. This involves heating the device to 150° C. for 5-10 hours in the dark followed by light-soaking. Again, it can be concluded that the mobile hydrogen concentration in the dielectrics is suitably low if the maximum degradation in open circuit voltage during the light-soaking is less than 2% and ideally less than 1% under standard test conditions.

The techniques described herein allow to maximise performance gain when the mobile hydrogen (atomic hydrogen etc.) concentration in all three bucket types is reduced to suitably low values that the maximum LID experienced during operation in the field (or during light-soaking at 0.7 suns and 70° C. for 3,000 hours) attributable to hydrogen is reduced from typically being above 5% (and usually 8% to 16%) to less than 3% and preferably less than 2% and ideally less than 1%. Numerous examples of approaches, processes or treatments have been provided above that can either individually or collectively contribute to emptying one or more of the buckets in accordance with embodiments. In general, combinations of processes will provide best results, preferably commencing with ones that drain bucket 1, then bucket 2 and then finally or simultaneously, bucket 3.

G.6. Novel Tool Designs for the Solving of LID in Multicrystalline Silicon Solar Cells An aspect of this disclosure aims to cover an apparatus for implementing one or more of the methods described above, in particular with reference to section G. For example, FIG. 14 shows an in-line belt-transport anti-LID tool. During transport on this belt through this tool, a wafer or device can be exposed to different combinations of the various processes given above as examples in this disclosure for emptying bucket types B1, B2 and B3. Such an anti-LID tool can include standard screen-printed firing capabilities, with all the anti-LID processes for emptying the various buckets following as shown by example in FIGS. 14 to 20. Such an anti-LID tool can also be constructed independently of the screen-printed firing capabilities such as shown in FIGS. 21 to 30. On the various figures, 'CD' represents Corona discharge or the use of high voltage electrodes to apply an electric field across the dielectric layer(s) for emptying bucket types B1 when the temperature is elevated. When CD is used simultaneously with illumination, bucket types B2 and B3 can also be simultaneously emptied or at least reduced in its atomic hydrogen concentration.

Although not specifically shown, sections with elevated temperatures when necessary can include or be followed by cooling zones which can optionally include CD and/or illumination. Whenever illumination is referred to in any of the following figures, the corresponding photons could be sub-bandgap for the silicon and/or photons with energy greater than the bandgap of silicon and therefore able to increase the injection level within the silicon by generating electron-hole pairs.

FIG. 14 shows an in-line belt-transport anti-LID tool with (a) showing entry where wafers are placed onto the belt and (b) showing side profile. During transport through this tool, a wafer or device can be exposed to different combinations of the various processes for emptying bucket types 1, 2 and 3.

Figure 15:
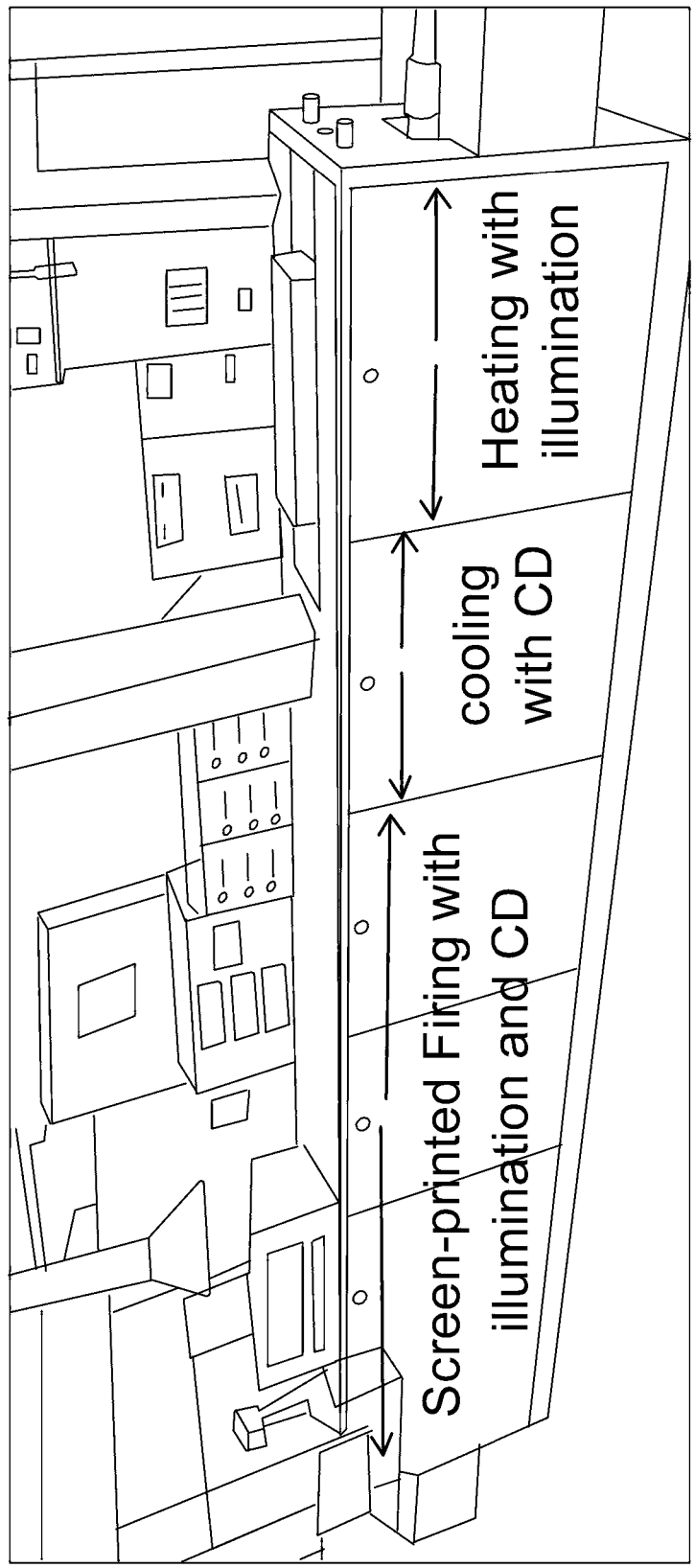

FIG. 15 shows an example of an in-line belt-transport screen-printed contact firing tool with anti-LID tool where wafers are placed onto the belt and during transport through this tool, a wafer or device can be exposed to different combinations of processes for emptying bucket types 1, 2 and 3.

Figure 16:
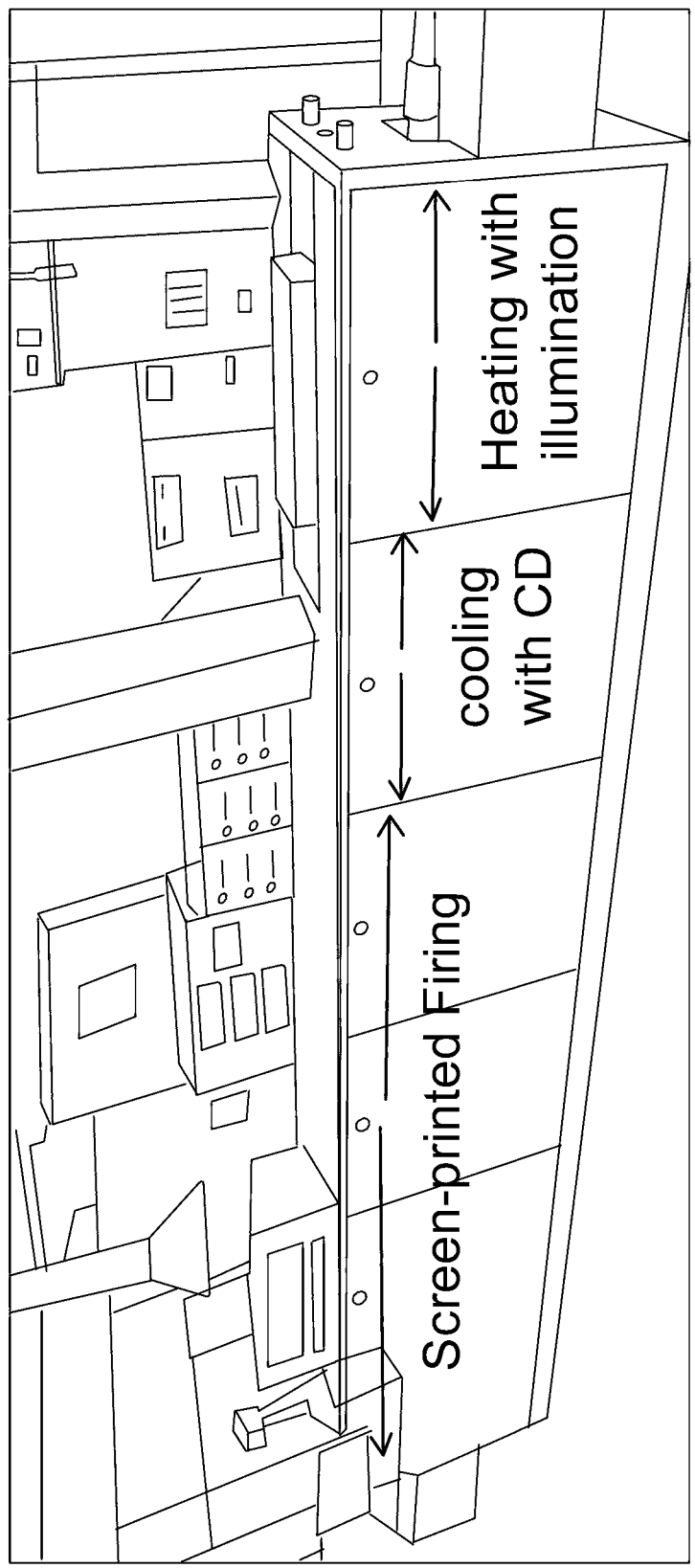

FIG. 16 shows an example of an in-line belt-transport screen-printed contact firing tool incorporating anti-LID tool where wafers are placed onto the belt and during transport through this tool, a wafer or device can be exposed to different combinations of processes for emptying bucket types 1, 2 and 3.

Figure 17:
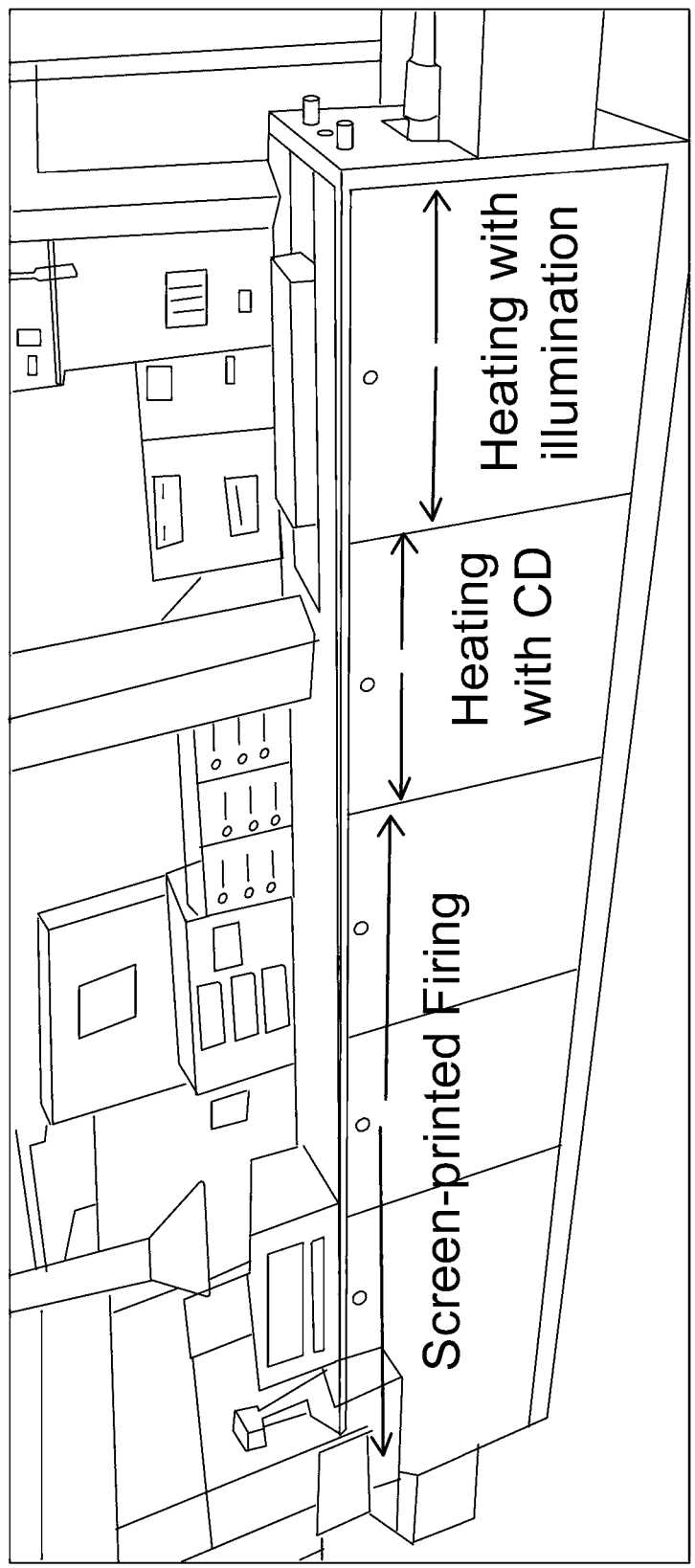

FIG. 17 shows an example of an in-line belt-transport screen-printed contact firing tool incorporating anti-LID tool where wafers are placed onto the belt and during transport through this tool, a wafer or device can be exposed to different combinations of processes for emptying bucket types 1, 2 and 3.

Figure 18:
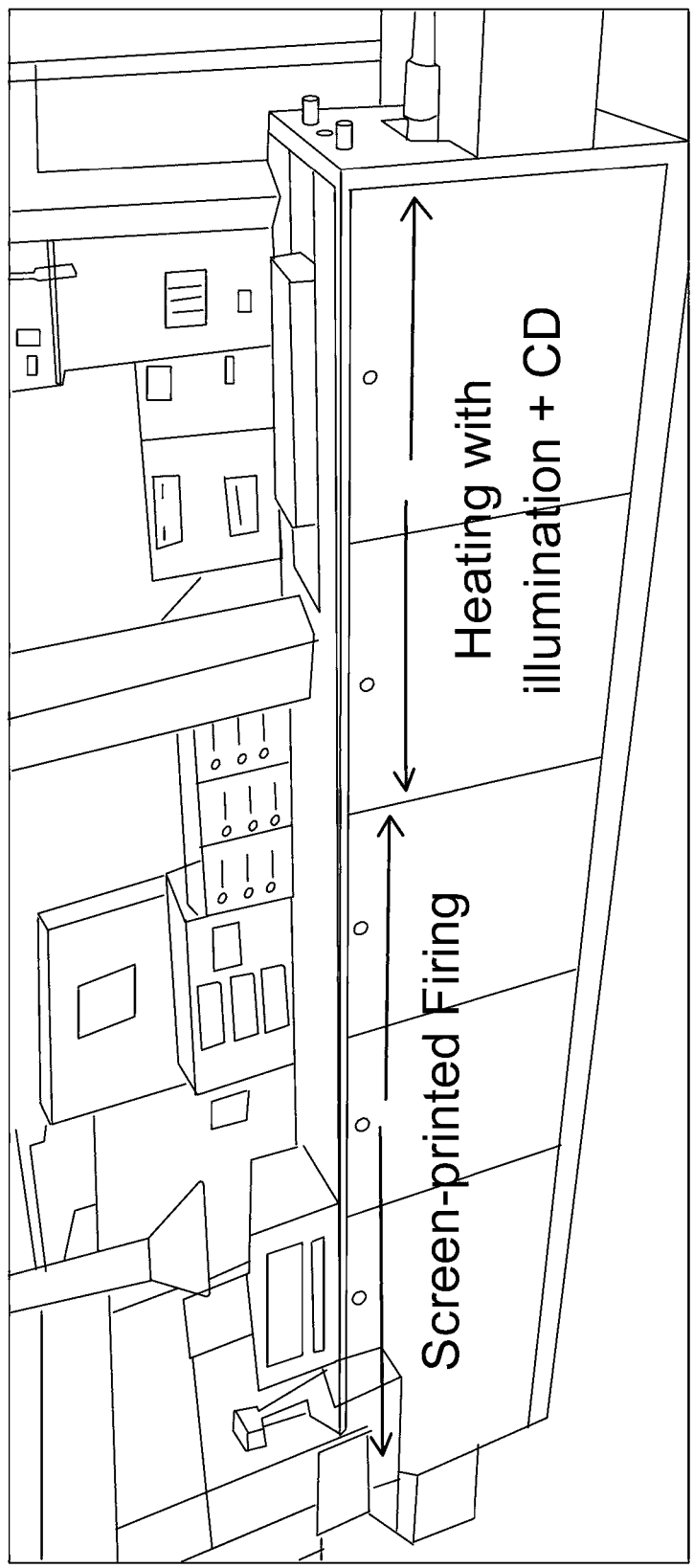

FIG. 18 shows an example of an in-line belt-transport screen-printed contact firing tool incorporating anti-LID tool where wafers are placed onto the belt and during transport through this tool, a wafer or device can be exposed to different combinations of processes for emptying bucket types 1, 2 and 3.

Figure 19:
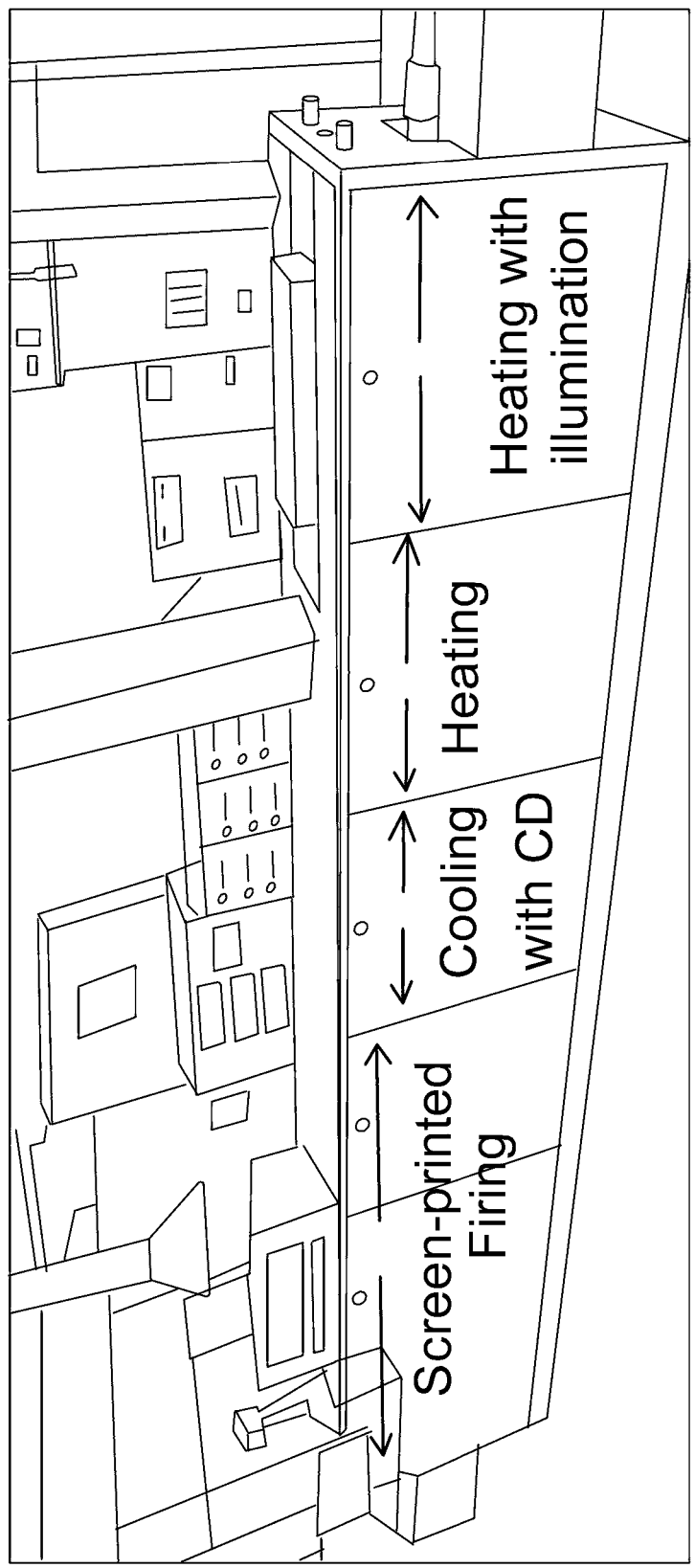

FIG. 19 shows an example of an in-line belt-transport screen-printed contact firing tool incorporating anti-LID tool where wafers are placed onto the belt and during transport through this tool, a wafer or device can be exposed to different combinations of processes for emptying bucket types 1, 2 and 3.

Figure 20:
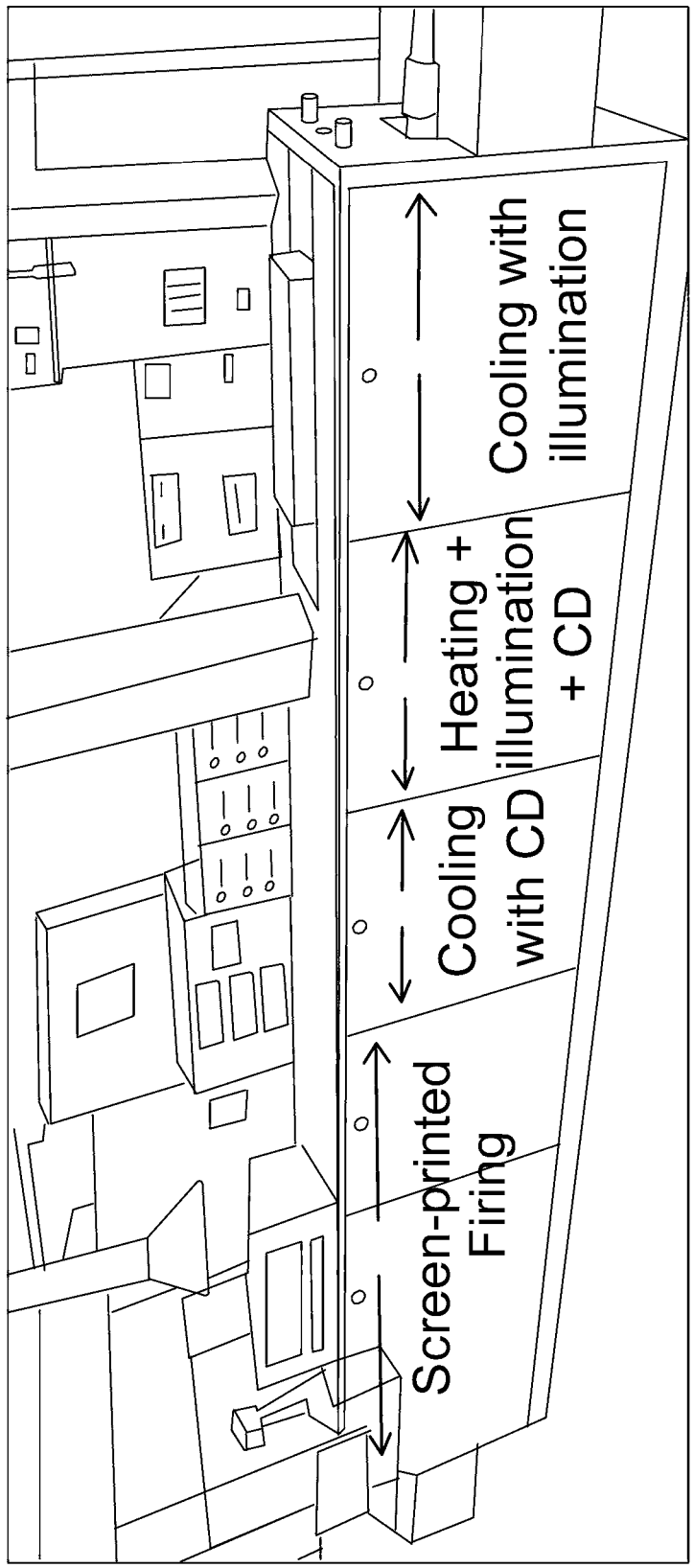

FIG. 20 shows an example of an in-line belt-transport screen-printed contact firing tool incorporating anti-LID tool where wafers are placed onto the belt and during transport through this tool, a wafer or device can be exposed to different combinations of processes for emptying bucket types 1, 2 and 3.

Figure 21:
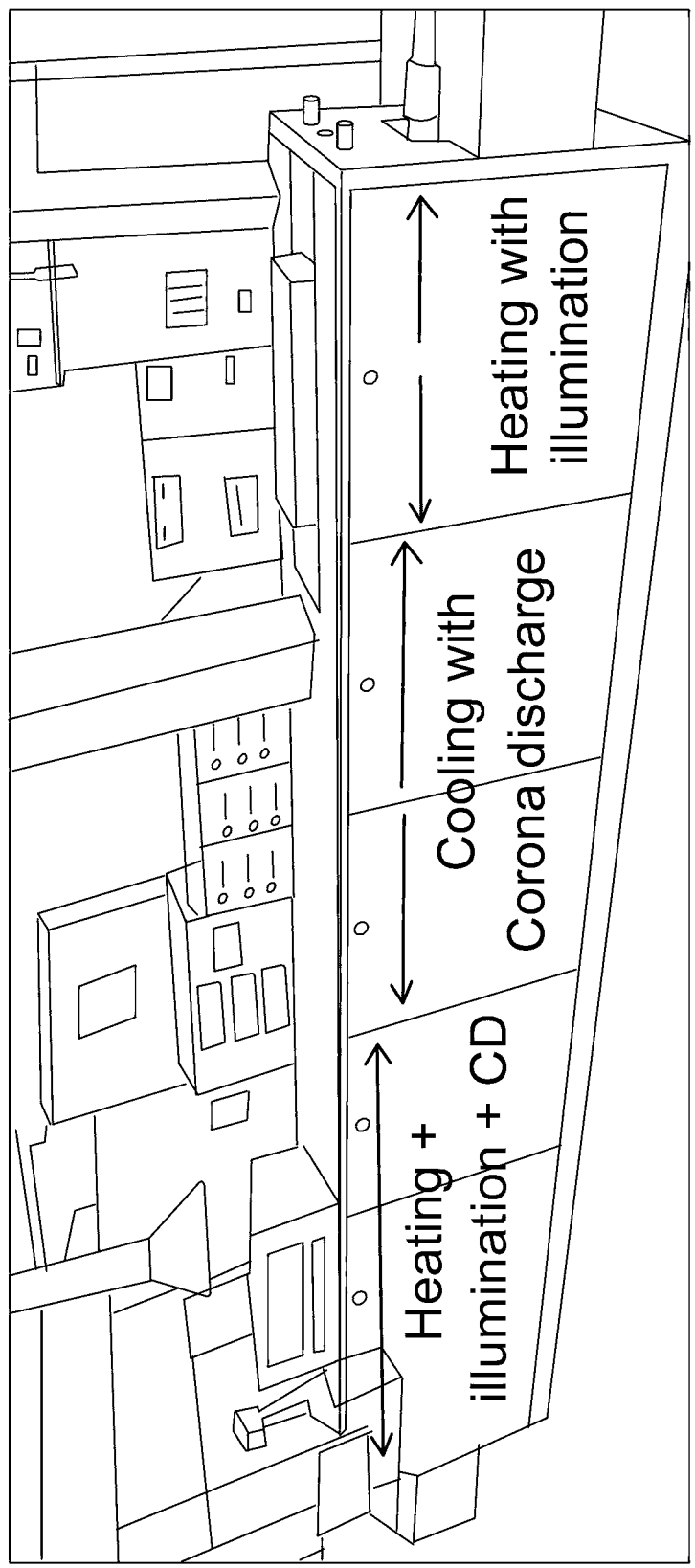

FIG. 21 shows an example of an in-line belt-transport anti-LID tool where wafers are placed onto the belt and during transport through this tool, a wafer or device can be exposed to different combinations of processes for emptying bucket types 1, 2 and 3.

Figure 22:
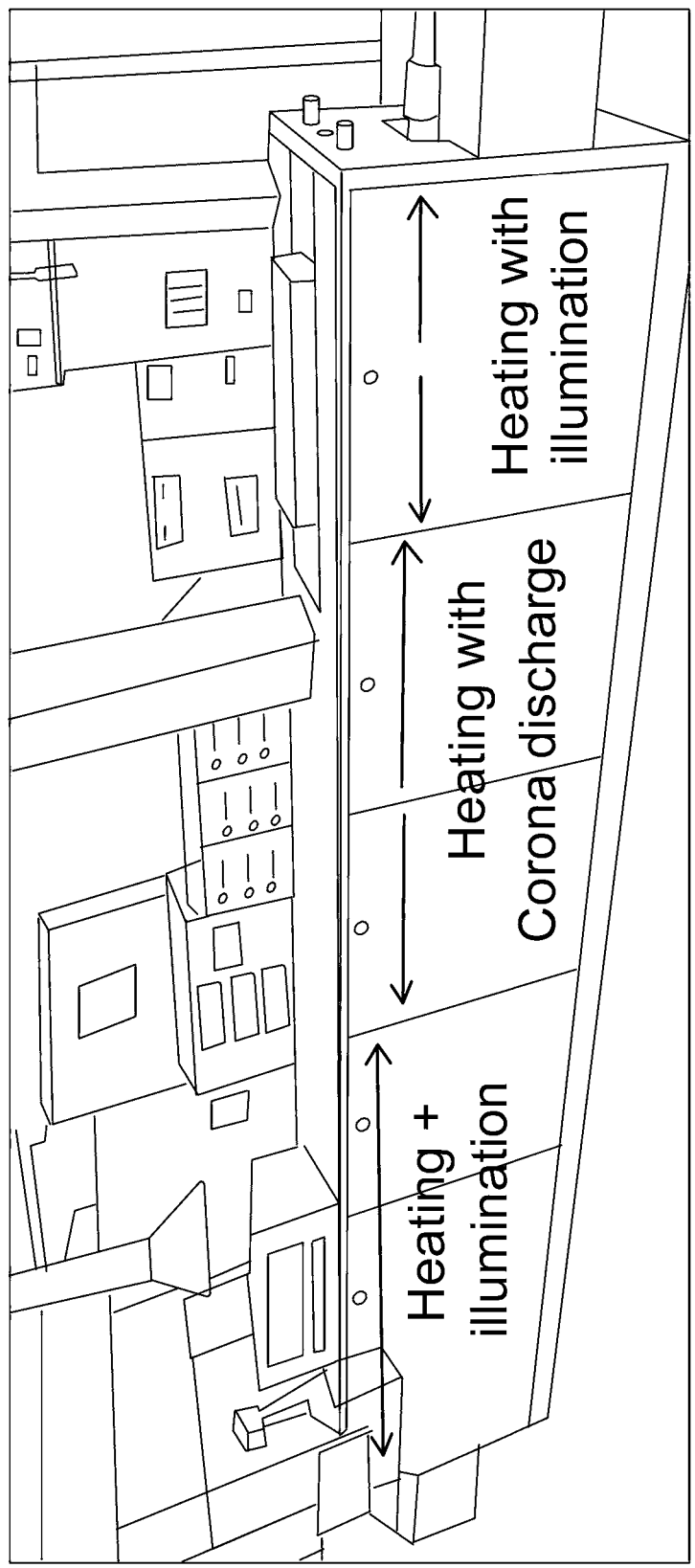

FIG. 22 shows an example of an in-line belt-transport anti-LID tool where wafers are placed onto the belt and during transport through this tool, a wafer or device can be exposed to different combinations of processes for emptying bucket types 1, 2 and 3.

Figure 23:
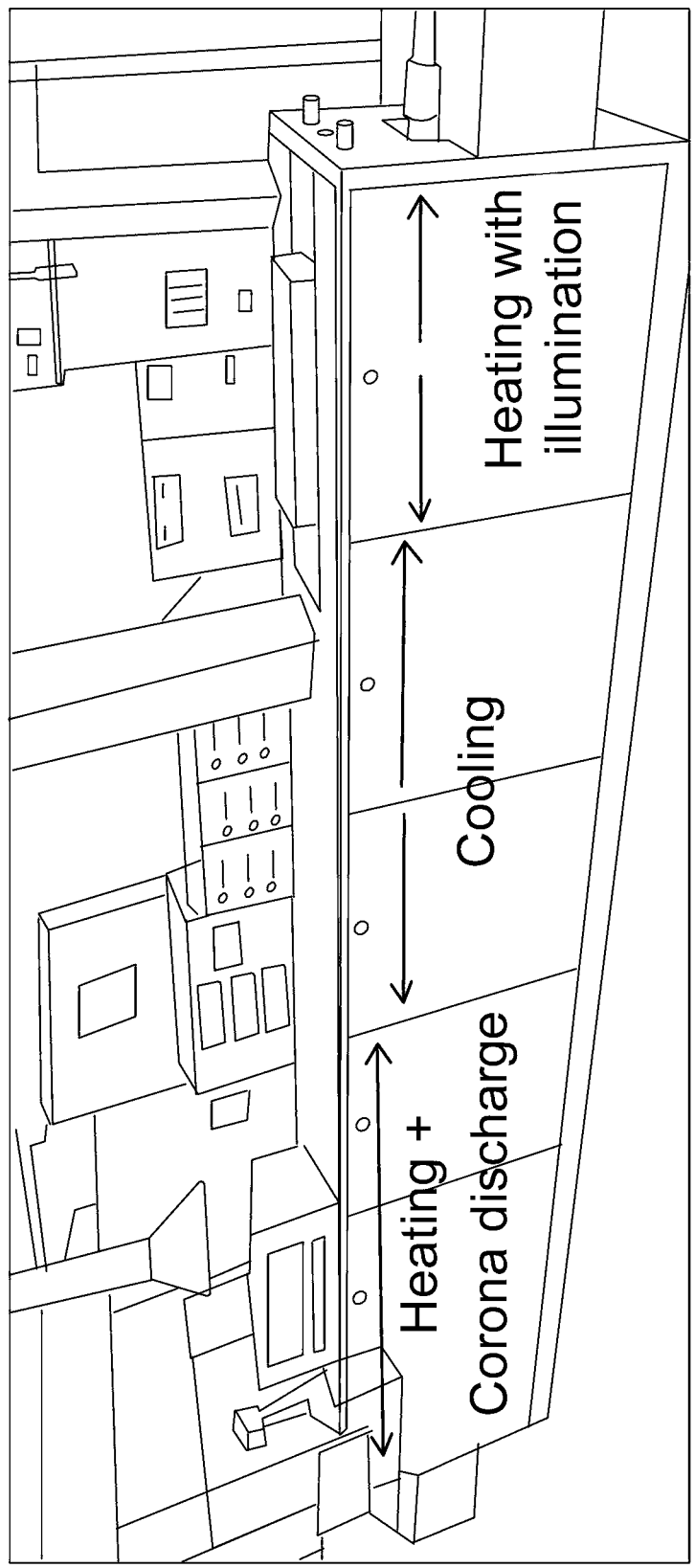

FIG. 23 shows an example of an in-line belt-transport anti-LID tool where wafers are placed onto the belt and during transport through this tool, a wafer or device can be exposed to different combinations of processes for emptying bucket types 1, 2 and 3.

Figure 24:
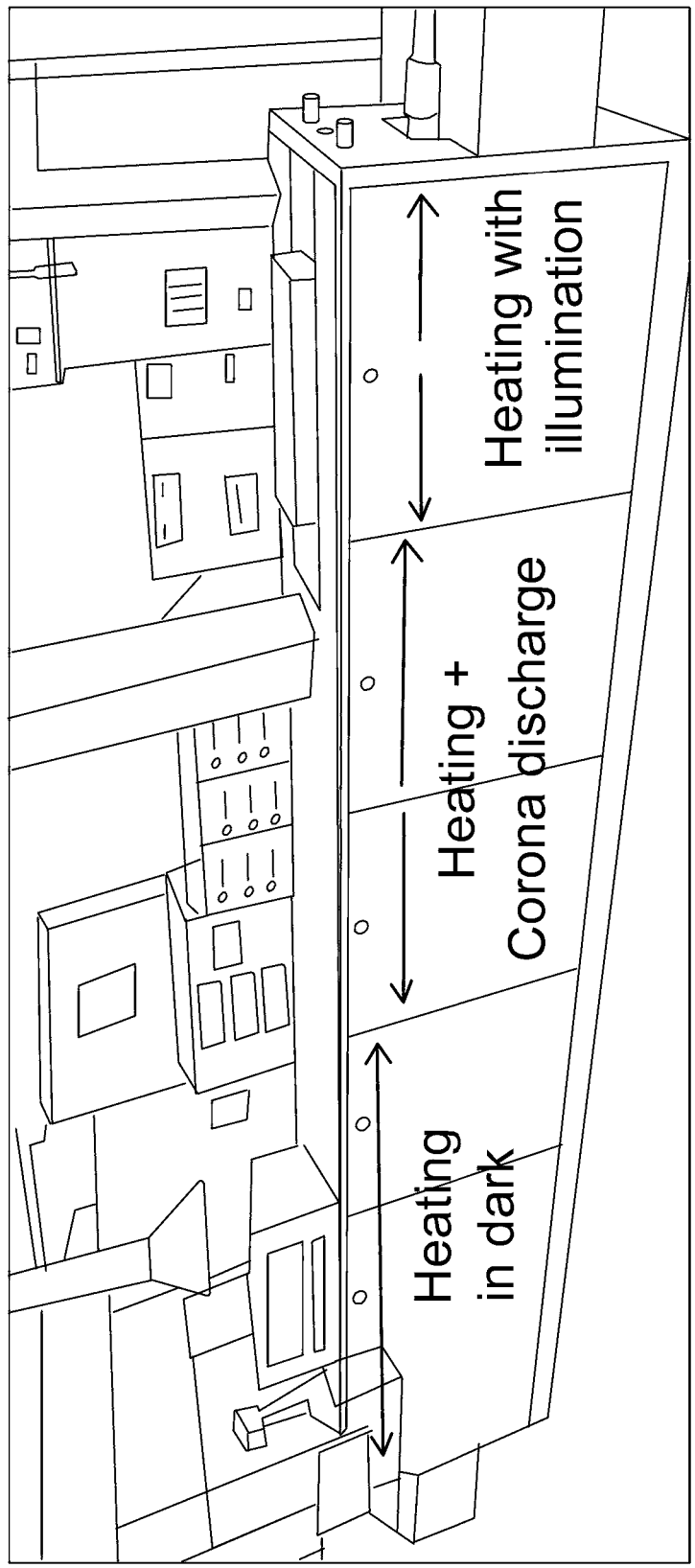

FIG. 24 shows an example of an in-line belt-transport anti-LID tool where wafers are placed onto the belt and during transport through this tool, a wafer or device can be exposed to different combinations of processes for emptying bucket types 1, 2 and 3.

Figure 25:
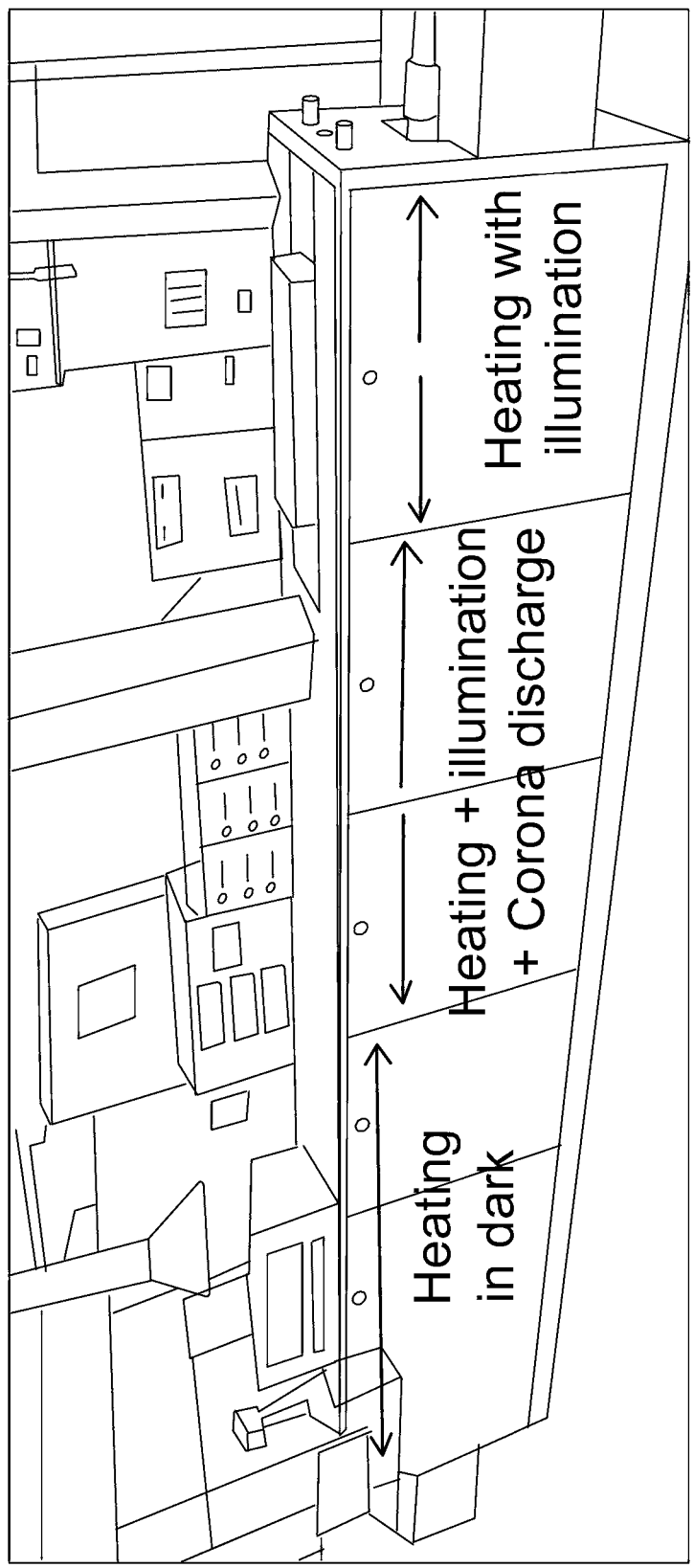

FIG. 25 shows an example of an in-line belt-transport anti-LID tool where wafers are placed onto the belt and during transport through this tool, a wafer or device can be exposed to different combinations of processes for emptying bucket types 1, 2 and 3.

Figure 26:
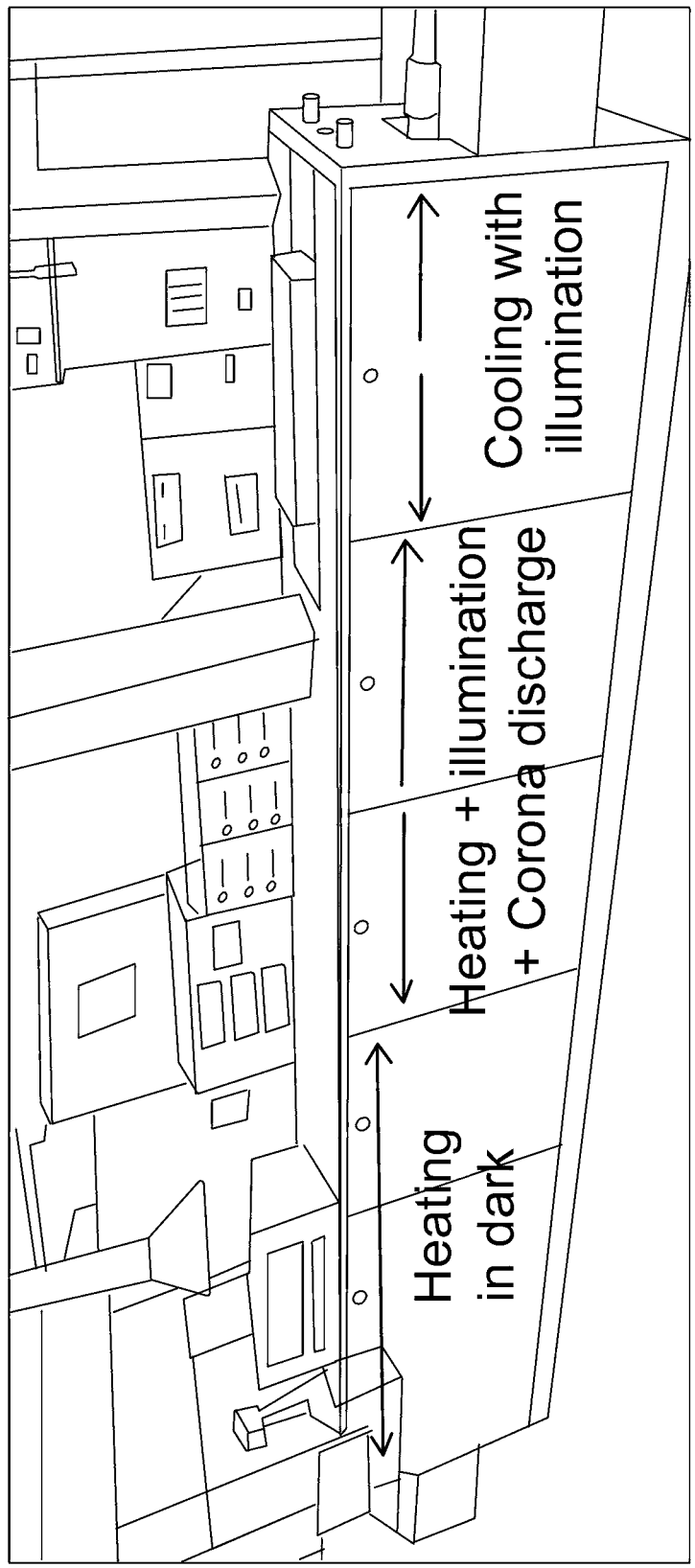

FIG. 26 shows an example of an in-line belt-transport anti-LID tool where wafers are placed onto the belt and during transport through this tool, a wafer or device can be exposed to different combinations of processes for emptying bucket types 1, 2 and 3.

Figure 27:

FIG. 27 shows an example of an in-line belt-transport anti-LID tool where wafers are placed onto the belt and during transport through this tool, a wafer or device can be exposed to different combinations of processes for emptying bucket types 1, 2 and 3.

Figure 28:
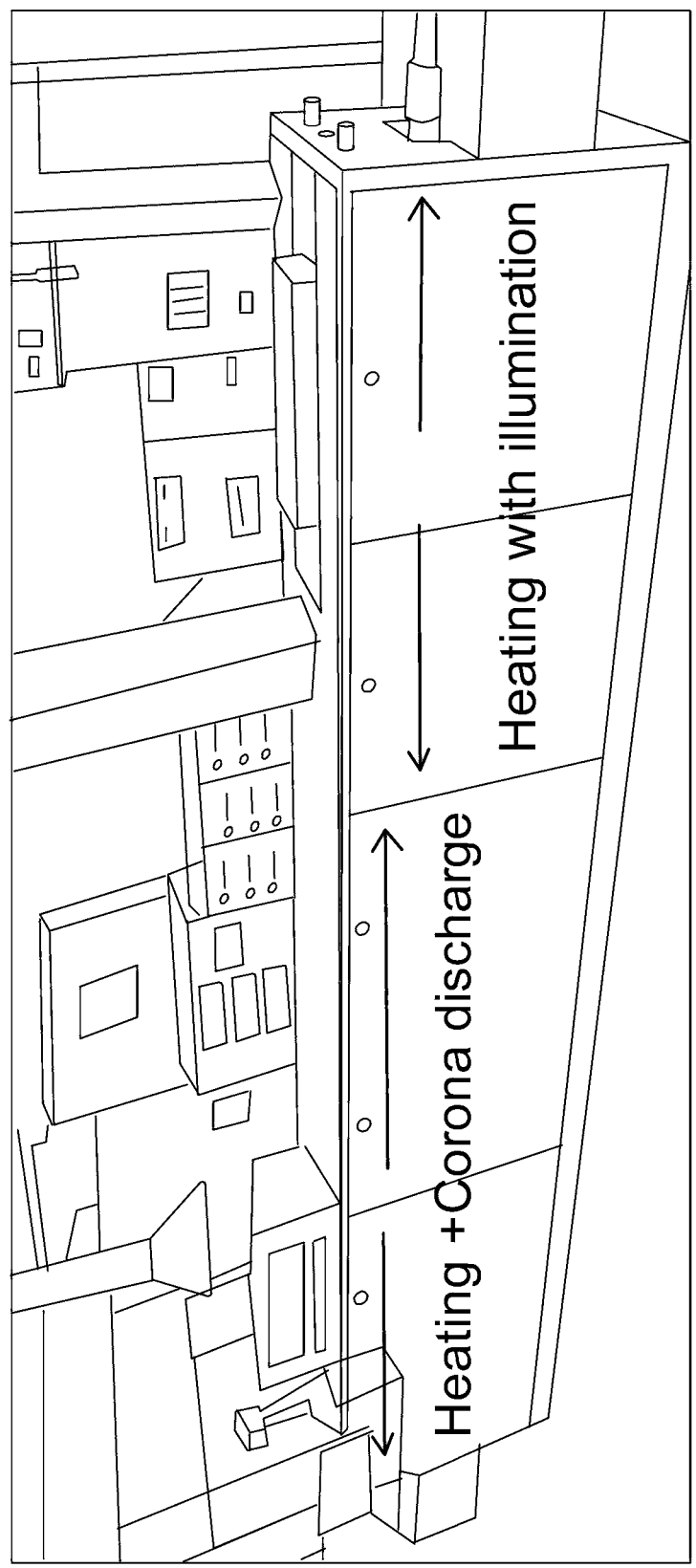

FIG. 28 shows an example of an in-line belt-transport anti-LID tool where wafers are placed onto the belt and during transport through this tool, a wafer or device can be exposed to different combinations of processes for emptying bucket types 1, 2 and 3.

Figure 29:
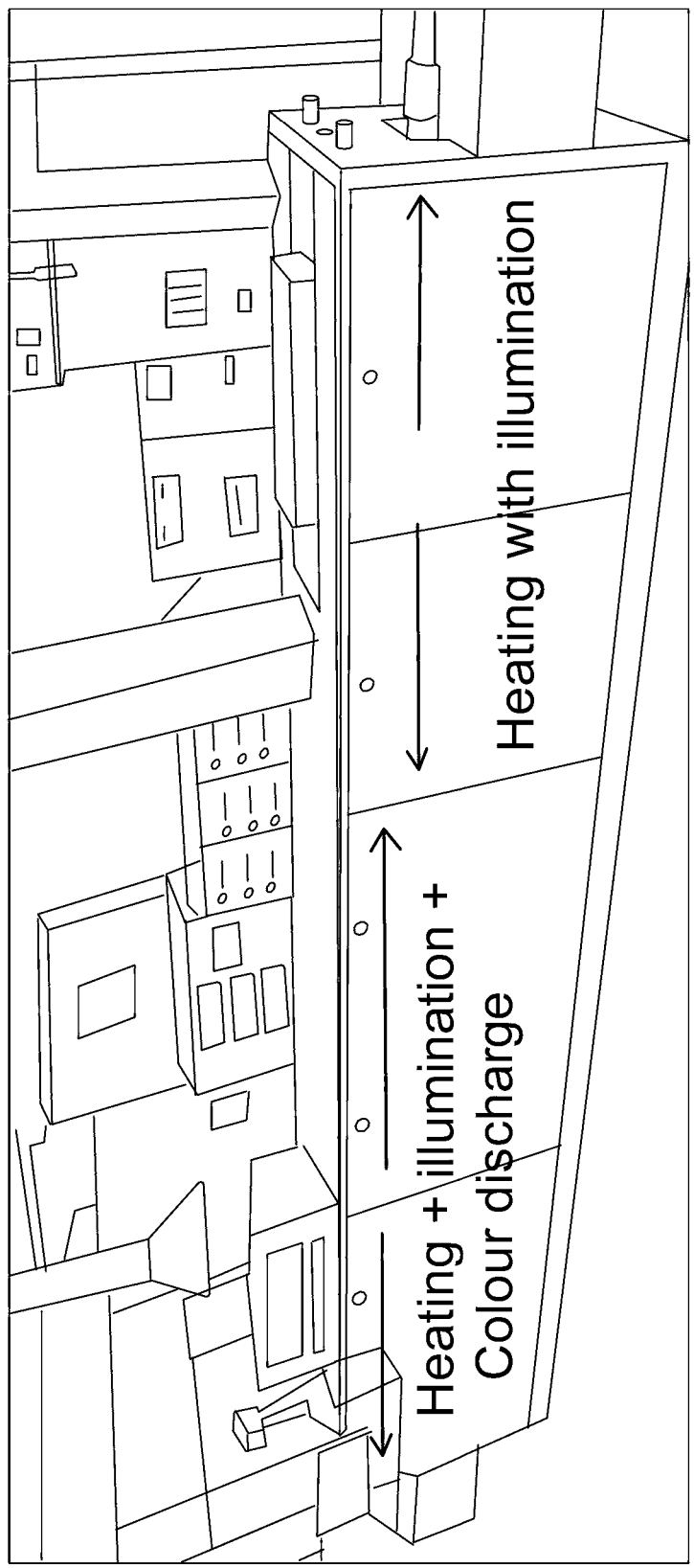

FIG. 29 shows an example of an in-line belt-transport anti-LID tool where wafers are placed onto the belt and during transport through this tool, a wafer or device can be exposed to different combinations of processes for emptying bucket types 1, 2 and 3.

Figure 30:
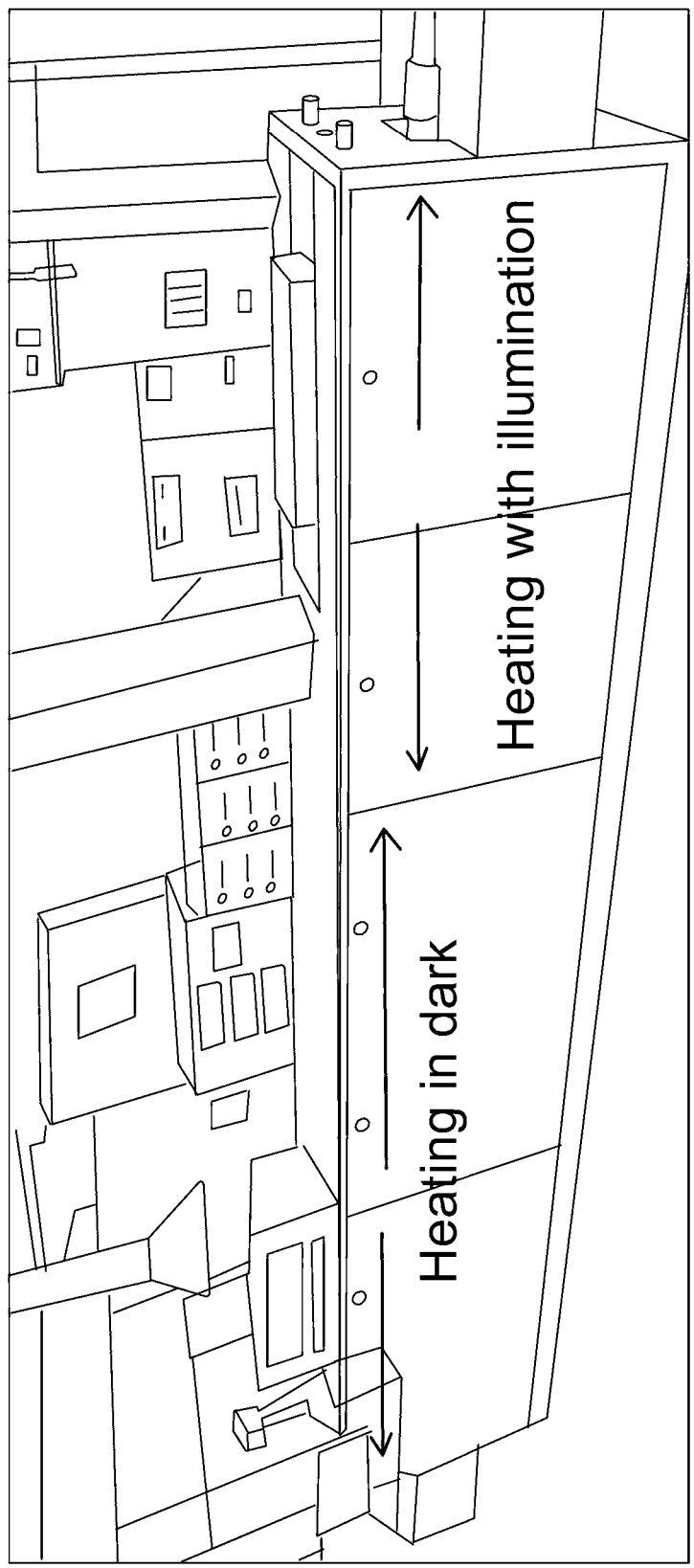

FIG. 30 shows an example of an in-line belt-transport anti-LID tool where wafers are placed onto the belt and during transport through this tool, a wafer or device can be exposed to different combinations of processes for emptying bucket types 1, 2 and 3.

It will be appreciated by one skilled in the art that although the above disclosure primarily relates to hydrogen passivation of crystalline silicon solar cells, the same principles and approaches can be used for any other semiconductors being used for the fabrication of solar cells such as GaAs, CIGS, CdTe, InP, CZTS and CuS.

The processing methods disclosed herein can be applied to a PV device during different stage of fabrication. For example, embodiments of the invention can be used right after a p-n junction is formed or after the fabrication is completed and metallic contacts are already formed on the PV device, or even during module lamination or on completed modules. The term 'PV device' as used in the present disclosure aims to cover a partially manufactured device that has doped silicon regions and a p-n junction.

It will also be appreciated by persons skilled in the art that numerous variations and/or modifications may be made to the invention as shown in the specific embodiments without departing from the spirit or scope of the invention as broadly described. The present embodiments are, therefore, to be considered in all respects as illustrative and not restrictive.

The term "comprising" (and its grammatical variations) as used herein are used in the inclusive sense of "having" or "including" and not in the sense of "consisting only of".

The claims as defined in the invention are as follows:

1. A method for processing a silicon-based photovoltaic device having doped silicon regions that are doped with a hydrogen concentration of at least 1e16 atoms/cm$^3$, the method comprising the steps of:
   (a) providing the photovoltaic device, wherein the photovoltaic device includes hydrogen;
   (b) thermally treating at least a portion of the photovoltaic device by heating the photovoltaic device in an environment with a temperature above 600° C., such that hydrogen migrates towards at least one of the doped regions so that a concentration of hydrogen within the at least one of the doped regions increases to above a minimum concentration of hydrogen at which hydrogen causes degradation to the electrical characteristics of that region;
   (c) applying an electric field across at least a portion of the photovoltaic device in a manner such that, charged hydrogen atoms are driven away, by the electric field, from the at least one of the doped silicon regions;
   wherein:
      step (b) is conducted such that hydrogen atoms distribute within the at least one of the doped silicon regions;
      step (c) comprises applying a forward biasing electric field across the photovoltaic device to promote drifting of charged hydrogen atoms away from regions with high atomic hydrogen concentration; and
      step (c) is conducted such that hydrogen migrates out of the at least one of the doped silicon regions.

2. The method of claim 1 wherein step (c) is performed in a manner such that negatively charged hydrogen atoms are drifted away from a p-type regions of the photovoltaic device and positively charged hydrogen atoms are drifted away from an n-type regions of the photovoltaic device.

3. A method for processing a silicon-based photovoltaic device having doped silicon regions that are doped with a hydrogen concentration of at least 1e16 atoms/cm$^3$, the photovoltaic device comprising:
   a first silicon doped region with a doping concentration below a doping threshold;
   a second silicon doped region with a doping concentration above the doping threshold; and
   a dielectric region;
   wherein the first silicon doped region, the second silicon doped region and the dielectric region contain atomic hydrogen that has been introduced during a hydrogenation step; with respective hydrogen concentrations being at least 1e16 atoms/cm$^3$;
   wherein the method comprising the steps of treating the photovoltaic device by heating the photovoltaic device in an environment with a temperature above 150° C., such that atomic hydrogen redistributes throughout the photovoltaic device and the concentration of atomic hydrogen at the first silicon doped region and the second silicon doped region drops below 1e16 atoms/cm$^3$.

4. The method of claim 3 wherein, the step of treating the device is such that light-induced degradation during light-soaking or subsequent operation in an electric field is reduced or eliminated.

5. The method of claim 3 wherein, the step of treating the device is such that the concentration of atomic hydrogen drops below 1e16 atoms/cm$^3$ through the entire device.

6. The method of claim 3 wherein, the step of treating the device is such that the concentration of atomic hydrogen within the first and second silicon doped regions becomes such that Hydrogen Induced Recombination at the regions no longer affects a performance of the device.

7. The method of claim 1, wherein a first intensity of the electric field is applied for a first period of time and a second intensity of the electric field is applied for a second period of time.

8. The method of claim 1, wherein the electric field is a pulsed field.

9. The method of claim 3, wherein the step of treating the photovoltaic device is such that the concentration of atomic hydrogen within the first and second silicon doped regions becomes lower than 1e15 atoms/cm3.

* * * * *